(12) United States Patent
Gillaspie et al.

(10) Patent No.: US 12,209,048 B2
(45) Date of Patent: Jan. 28, 2025

(54) COUNTER ELECTRODE FOR ELECTROCHROMIC DEVICES

(71) Applicant: View, Inc., Milpitas, CA (US)

(72) Inventors: Dane Thomas Gillaspie, Fremont, CA (US); Sridhar Karthik Kailasam, Fremont, CA (US); Robert T. Rozbicki, Saratoga, CA (US)

(73) Assignee: View, Inc., San Jose, CA (US)

( * ) Notice: Subject to any disclaimer, the term of this patent is extended or adjusted under 35 U.S.C. 154(b) by 41 days.

(21) Appl. No.: 17/804,515

(22) Filed: May 27, 2022

(65) Prior Publication Data

US 2023/0008603 A1 Jan. 12, 2023

Related U.S. Application Data

(63) Continuation of application No. 16/721,655, filed on Dec. 19, 2019, now Pat. No. 11,370,699, which is a
(Continued)

(51) Int. Cl.
*C03C 17/34* (2006.01)
*B23K 20/10* (2006.01)
(Continued)

(52) U.S. Cl.
CPC .......... *C03C 17/3417* (2013.01); *B23K 20/10* (2013.01); *C23C 10/28* (2013.01);
(Continued)

(58) Field of Classification Search
CPC ................... G02F 1/155; G02F 1/1524; G02F 2001/1555; G02F 1/1525; G02F 1/153;
(Continued)

(56) References Cited

U.S. PATENT DOCUMENTS 3,840,286 A   10/1974 Kiss
3,971,624 A   7/1976 Bruesch et al.
(Continued)

FOREIGN PATENT DOCUMENTS

AU   2014210572 B2   1/2017
AU   2019229399 B2   12/2020
(Continued)

OTHER PUBLICATIONS

Arvizu, M.A. et al., "Electrochromic W1-x-yTixMoyO3 thin films made by sputter deposition: Large optical modulation, good cycling durability, and approximate color neutrality," Chemistry of Materials [online, just accepted manuscript], Feb. 23, 2017, [retrieved on Feb. 24, 2017]. Retrieved from the internet: http://pubs.acs.org DOI: 10.1021/acs.chemmater.6b05198.
(Continued)

*Primary Examiner* — Brandi N Thomas
(74) *Attorney, Agent, or Firm* — Weaver Austin Villeneuve & Sampson LLP; Brian D. Griedel

(57) ABSTRACT

The embodiments herein relate to electrochromic stacks, electrochromic devices, and methods and apparatus for making such stacks and devices. In various embodiments, an anodically coloring layer in an electrochromic stack or device is fabricated to include a heterogeneous structure, for example a heterogeneous composition and/or morphology. Such heterogeneous anodically coloring layers can be used to better tune the properties of a device.

37 Claims, 12 Drawing Sheets

Related U.S. Application Data continuation of application No. 15/204,868, filed on Jul. 7, 2016, now Pat. No. 10,591,795, which is a continuation-in-part of application No. PCT/US2015/061995, filed on Nov. 20, 2015, and a continuation-in-part of application No. 14/885,734, filed on Oct. 16, 2015, now Pat. No. 10,162,240, and a continuation-in-part of application No. 14/683,541, filed on Apr. 10, 2015, now Pat. No. 9,671,664, said application No. 14/885,734 is a continuation of application No. 14/601,141, filed on Jan. 20, 2015, now Pat. No. 9,229,291, which is a continuation of application No. 13/763,505, filed on Feb. 8, 2013, now Pat. No. 9,007,674, which is a continuation-in-part of application No. PCT/US2012/057606, filed on Sep. 27, 2012, said application No. 14/683,541 is a continuation of application No. 13/462,725, filed on May 2, 2012, now Pat. No. 9,261,751, which is a continuation-in-part of application No. 12/814,277, filed on Jun. 11, 2010, now Pat. No. 8,764,950, and a continuation-in-part of application No. 12/814,279, filed on Jun. 11, 2010, now Pat. No. 8,764,951, and a continuation-in-part of application No. 12/772,055, filed on Apr. 30, 2010, now Pat. No. 8,300,298, said application No. 15/204,868 is a continuation-in-part of application No. 12/645,111, filed on Dec. 22, 2009, now Pat. No. 9,664,974.

(60) Provisional application No. 62/192,443, filed on Jul. 14, 2015, provisional application No. 62/085,096, filed on Nov. 26, 2014, provisional application No. 61/541,999, filed on Sep. 30, 2011, provisional application No. 61/165,484, filed on Mar. 31, 2009.

(51) Int. Cl.

| | |
|---|---|
| *C23C 10/28* | (2006.01) |
| *C23C 14/08* | (2006.01) |
| *C23C 14/18* | (2006.01) |
| *C23C 14/34* | (2006.01) |
| *C23C 14/56* | (2006.01) |
| *C23C 14/58* | (2006.01) |
| *G02F 1/1524* | (2019.01) |

(52) U.S. Cl.
CPC .......... *C23C 14/083* (2013.01); *C23C 14/085* (2013.01); *C23C 14/185* (2013.01); *C23C 14/3407* (2013.01); *C23C 14/568* (2013.01); *C23C 14/5806* (2013.01); *C23C 14/5853* (2013.01); *G02F 1/1524* (2019.01); *C03C 2217/94* (2013.01)

(58) Field of Classification Search
CPC ...... G02F 1/1523; G02F 1/1533; G02F 1/163; G02F 2001/15145; G02F 1/13439; G02F 1/1508; G02F 2001/1536; G02F 1/15; G02F 2201/122; G02F 1/15245; G02F 1/157; G02F 1/1506; G02F 1/161; G02F 2001/1502; G02F 2201/50; G02F 2202/16; G02F 2201/501; G02F 1/133382; G02F 1/1309; G02F 1/133345; G02F 2201/44; G02F 2201/508; G02F 1/13471; G02F 1/133502; G02F 2001/164; G02F 1/13324; G02F 1/13718; G02F 1/1503; G02F 1/15165; G02F 2001/1557; G02F 2202/28; G02F 2202/36
See application file for complete search history.

(56) References Cited

U.S. PATENT DOCUMENTS

| | | |
|---|---|---|
| 4,009,935 A | 3/1977 | Faughnan et al. |
| 4,193,670 A | 3/1980 | Giglia et al. |
| 4,264,150 A | 4/1981 | Yano et al. |
| 4,293,194 A | 10/1981 | Takahashi |
| 4,297,006 A | 10/1981 | Bissar |
| 4,365,870 A | 12/1982 | Morita et al. |
| 4,396,253 A | 8/1983 | Kuwagaki et al. |
| 4,482,216 A | 11/1984 | Hashimoto et al. |
| 4,561,729 A | 12/1985 | Heinz et al. |
| 4,832,463 A | 5/1989 | Goldner et al. |
| 4,851,095 A | 7/1989 | Scobey et al. |
| 4,923,289 A | 5/1990 | Demiryont |
| 4,938,571 A | 7/1990 | Cogan et al. |
| 5,019,420 A | 5/1991 | Rauh |
| 5,124,832 A | 6/1992 | Greenberg et al. |
| 5,130,841 A | 7/1992 | Demiryont |
| 5,138,481 A * | 8/1992 | Demiryont .............. C23C 10/18 359/275 |
| 5,142,406 A | 8/1992 | Lampert et al. |
| 5,168,003 A | 12/1992 | Proscia |
| 5,209,980 A | 5/1993 | Spindler |
| 5,216,536 A | 6/1993 | Agrawal et al. |
| 5,358,811 A | 10/1994 | Yamazaki et al. |
| 5,657,150 A | 8/1997 | Kallman et al. |
| 5,659,417 A | 8/1997 | Van Dine et al. |
| 5,666,771 A | 9/1997 | Macquart et al. |
| 5,668,663 A | 9/1997 | Varaprasad et al. |
| 5,699,192 A | 12/1997 | Van Dine et al. |
| 5,724,175 A | 3/1998 | Hichwa et al. |
| 5,724,177 A | 3/1998 | Ellis, Jr. et al. |
| 5,754,329 A | 5/1998 | Coleman |
| 5,757,537 A | 5/1998 | Ellis, Jr. et al. |
| 5,814,195 A | 9/1998 | Lehan et al. |
| 5,831,760 A | 11/1998 | Hashimoto et al. |
| 5,847,858 A | 12/1998 | Krings et al. |
| 5,859,723 A | 1/1999 | Jodicke et al. |
| 5,910,854 A | 6/1999 | Varaprasad et al. |
| 6,020,987 A | 2/2000 | Baumann et al. |
| 6,178,034 B1 | 1/2001 | Allemand et al. |
| 6,185,034 B1 | 2/2001 | Nakamura et al. |
| 6,211,995 B1 | 4/2001 | Azens et al. |
| 6,266,177 B1 | 7/2001 | Allemand et al. |
| 6,277,523 B1 | 8/2001 | Giron |
| 6,337,758 B1 | 1/2002 | Beteille et al. |
| 6,515,787 B1 | 2/2003 | Westfall et al. |
| 6,529,308 B2 | 3/2003 | Beteille et al. |
| 6,559,411 B2 | 5/2003 | Borgeson et al. |
| 6,791,737 B2 | 9/2004 | Giron |
| 6,791,738 B2 | 9/2004 | Reynolds et al. |
| 6,822,778 B2 | 11/2004 | Westfall et al. |
| 6,856,444 B2 | 2/2005 | Ingalls et al. |
| 6,859,297 B2 | 2/2005 | Lee et al. |
| 6,919,530 B2 | 7/2005 | Borgeson et al. |
| 6,940,628 B2 | 9/2005 | Giron |
| 7,099,062 B2 | 8/2006 | Azens et al. |
| 7,193,763 B2 * | 3/2007 | Beteille ............... G02F 1/13439 359/265 |
| 7,230,748 B2 | 6/2007 | Giron et al. |
| 7,265,891 B1 | 9/2007 | Demiryont |
| 7,277,215 B2 | 10/2007 | Greer |
| 7,372,610 B2 | 5/2008 | Burdis et al. |
| 7,531,101 B2 | 5/2009 | Beteille |
| 7,564,611 B2 | 7/2009 | Jang et al. |
| 7,593,154 B2 | 9/2009 | Burdis et al. |
| 7,604,717 B2 | 10/2009 | Beteille et al. |
| 7,646,526 B1 | 1/2010 | Wang et al. |
| 7,679,810 B2 | 3/2010 | Fuss et al. |
| 7,704,555 B2 | 4/2010 | Demiryont |
| 7,830,585 B2 | 11/2010 | Widjaja et al. |
| 7,869,114 B2 | 1/2011 | Valentin et al. |
| 7,894,120 B2 | 2/2011 | Valentin et al. |
| 7,961,375 B2 | 6/2011 | Phillips |
| 8,004,744 B2 | 8/2011 | Burdis et al. |
| 8,031,389 B2 | 10/2011 | Wang et al. |
| 8,168,265 B2 | 5/2012 | Kwak et al. |

(56) References Cited

U.S. PATENT DOCUMENTS

| | | |
|---|---|---|
| 8,228,592 B2 | 7/2012 | Wang et al. |
| 8,300,298 B2 | 10/2012 | Wang et al. |
| 8,432,603 B2 | 4/2013 | Wang et al. |
| 8,582,193 B2 | 11/2013 | Wang et al. |
| 8,638,487 B2 | 1/2014 | Veerasamy |
| 8,687,261 B2 | 4/2014 | Gillaspie et al. |
| 8,749,868 B2 | 6/2014 | Wang et al. |
| 8,758,575 B2 | 6/2014 | Wang et al. |
| 8,764,950 B2 | 7/2014 | Wang et al. |
| 8,764,951 B2 | 7/2014 | Wang et al. |
| 8,773,747 B2 | 7/2014 | Ferreira et al. |
| 8,995,041 B2 | 3/2015 | Weir et al. |
| 9,007,674 B2 | 4/2015 | Kailasam et al. |
| 9,116,409 B1 | 8/2015 | Sun et al. |
| 9,140,951 B2 | 9/2015 | Wang et al. |
| 9,164,346 B2 | 10/2015 | Wang et al. |
| 9,170,466 B2 | 10/2015 | Marcel et al. |
| 9,261,751 B2 | 2/2016 | Pradhan et al. |
| 9,334,557 B2 | 5/2016 | Neudecker et al. |
| 9,429,809 B2 | 8/2016 | Kailasam et al. |
| 9,454,053 B2 | 9/2016 | Strong et al. |
| 9,477,129 B2 | 10/2016 | Kozlowski et al. |
| 9,581,875 B2 | 2/2017 | Burdis et al. |
| 9,664,974 B2 | 5/2017 | Kozlowski et al. |
| 9,671,664 B2 | 6/2017 | Pradhan et al. |
| 9,720,298 B2 | 8/2017 | Wang et al. |
| 9,759,975 B2 | 9/2017 | Wang et al. |
| 9,904,138 B2 | 2/2018 | Kailasam et al. |
| 10,054,833 B2 | 8/2018 | Kailasam et al. |
| 10,088,729 B2 | 10/2018 | Wang et al. |
| 10,152,762 B2 | 12/2018 | Wu et al. |
| 10,156,762 B2 | 12/2018 | Gillaspie et al. |
| 10,162,240 B2 | 12/2018 | Rozbicki |
| 10,185,197 B2 | 1/2019 | Pradhan et al. |
| 10,228,601 B2 | 3/2019 | Gillaspie et al. |
| 10,254,615 B2 | 4/2019 | Kailasam et al. |
| 10,261,381 B2 | 4/2019 | Pradhan et al. |
| 10,288,969 B2 | 5/2019 | Kailasam et al. |
| 10,345,671 B2 | 7/2019 | Gillaspie et al. |
| 10,585,321 B2 | 3/2020 | Gillaspie et al. |
| 10,591,765 B2 | 3/2020 | Nakano et al. |
| 10,591,795 B2 | 3/2020 | Gillaspie et al. |
| 10,591,797 B2 | 3/2020 | Wang et al. |
| 10,599,001 B2 | 3/2020 | Wang et al. |
| 10,663,830 B2 | 5/2020 | Pradhan et al. |
| 10,684,523 B2 | 6/2020 | Gillaspie et al. |
| 10,690,987 B2 | 6/2020 | Gillaspie et al. |
| 10,852,613 B2 | 12/2020 | Pradhan et al. |
| 10,877,348 B2 | 12/2020 | Kang et al. |
| 10,996,533 B2 | 5/2021 | Pradhan et al. |
| 11,187,954 B2 | 11/2021 | Rozbicki et al. |
| 11,189,954 B2 | 11/2021 | Kwon et al. |
| 11,327,382 B2 | 5/2022 | Gillaspie et al. |
| 11,370,699 B2 | 6/2022 | Gillaspie et al. |
| 11,409,177 B2 | 8/2022 | Gillaspie et al. |
| 11,422,426 B2 | 8/2022 | Gillaspie et al. |
| 11,440,838 B2 | 9/2022 | Pradhan et al. |
| 11,525,181 B2 | 12/2022 | Wang et al. |
| 11,592,722 B2 | 2/2023 | Wang et al. |
| 11,635,665 B2 | 4/2023 | Pradhan et al. |
| 2002/0015214 A1 | 2/2002 | Nishikitani et al. |
| 2002/0041443 A1 | 4/2002 | Varaprasad et al. |
| 2003/0010957 A1 | 1/2003 | Haering et al. |
| 2003/0031928 A1 | 2/2003 | Beteille et al. |
| 2003/0156313 A1 | 8/2003 | Serra et al. |
| 2003/0218941 A1 | 11/2003 | Terao et al. |
| 2004/0021921 A1 | 2/2004 | Richardson |
| 2004/0051083 A1 | 3/2004 | McDonald et al. |
| 2004/0150867 A1 | 8/2004 | Lee et al. |
| 2005/0002081 A1 | 1/2005 | Beteille et al. |
| 2005/0007645 A1* | 1/2005 | Tonar .................. B60Q 1/2665 359/265 |
| 2005/0147825 A1 | 7/2005 | Arnaud et al. |
| 2005/0259310 A1 | 11/2005 | Giri et al. |
| 2006/0105103 A1 | 5/2006 | Hartig |
| 2006/0209383 A1 | 9/2006 | Burdis et al. |
| 2007/0008603 A1 | 1/2007 | Sotzing et al. |
| 2007/0008605 A1 | 1/2007 | Garg et al. |
| 2007/0097481 A1 | 5/2007 | Burdis et al. |
| 2007/0097483 A1 | 5/2007 | Park |
| 2007/0292606 A1 | 12/2007 | Demiryont |
| 2008/0213477 A1 | 9/2008 | Zindel et al. |
| 2008/0304130 A1 | 12/2008 | Nguyen |
| 2008/0304131 A1 | 12/2008 | Nguyen |
| 2009/0057137 A1 | 3/2009 | Pitts et al. |
| 2009/0285978 A1 | 11/2009 | Burdis et al. |
| 2009/0304912 A1 | 12/2009 | Kwak et al. |
| 2009/0323156 A1 | 12/2009 | Shin et al. |
| 2009/0323158 A1 | 12/2009 | Wang et al. |
| 2010/0007937 A1 | 1/2010 | Widjaja et al. |
| 2010/0079844 A1 | 4/2010 | Kurman et al. |
| 2010/0103496 A1 | 4/2010 | Schwendeman et al. |
| 2010/0165440 A1 | 7/2010 | Nguyen et al. |
| 2010/0243427 A1 | 9/2010 | Kozlowski et al. |
| 2010/0245973 A1 | 9/2010 | Wang et al. |
| 2011/0013254 A1 | 1/2011 | Widjaja et al. |
| 2011/0043885 A1 | 2/2011 | Lamine et al. |
| 2011/0043886 A1 | 2/2011 | Jeon et al. |
| 2011/0051220 A1 | 3/2011 | Lee |
| 2011/0051221 A1 | 3/2011 | Veerasamy |
| 2011/0136019 A1 | 6/2011 | Amiruddin et al. |
| 2011/0151283 A1 | 6/2011 | Gillaspie et al. |
| 2011/0211247 A1 | 9/2011 | Kozlowski et al. |
| 2011/0249314 A1 | 10/2011 | Wang et al. |
| 2011/0266137 A1 | 11/2011 | Wang et al. |
| 2011/0266138 A1 | 11/2011 | Wang et al. |
| 2011/0267674 A1 | 11/2011 | Wang et al. |
| 2011/0267675 A1 | 11/2011 | Wang et al. |
| 2011/0297535 A1 | 12/2011 | Higdon et al. |
| 2011/0299149 A1 | 12/2011 | Park et al. |
| 2012/0181167 A1 | 7/2012 | Jiang et al. |
| 2012/0200908 A1 | 8/2012 | Bergh et al. |
| 2012/0218621 A1 | 8/2012 | Kwak et al. |
| 2012/0266945 A1 | 10/2012 | Letocart et al. |
| 2012/0275008 A1 | 11/2012 | Pradhan et al. |
| 2012/0276734 A1 | 11/2012 | Van Mol et al. |
| 2013/0003157 A1 | 1/2013 | Wang et al. |
| 2013/0016417 A1 | 1/2013 | Veerasamy |
| 2013/0101751 A1 | 4/2013 | Berland et al. |
| 2013/0182307 A1 | 7/2013 | Gillaspie et al. |
| 2013/0201545 A1 | 8/2013 | Frey et al. |
| 2013/0270105 A1 | 10/2013 | Wang et al. |
| 2013/0286459 A1 | 10/2013 | Burdis et al. |
| 2014/0022621 A1 | 1/2014 | Kailasam et al. |
| 2014/0177027 A1 | 6/2014 | Wang et al. |
| 2014/0204444 A1 | 7/2014 | Choi et al. |
| 2014/0204445 A1 | 7/2014 | Choi et al. |
| 2014/0204446 A1 | 7/2014 | Choi et al. |
| 2014/0204447 A1 | 7/2014 | Choi et al. |
| 2014/0204448 A1 | 7/2014 | Bergh et al. |
| 2014/0205746 A1 | 7/2014 | Choi et al. |
| 2014/0205748 A1 | 7/2014 | Choi et al. |
| 2014/0313561 A1 | 10/2014 | Wang et al. |
| 2014/0329006 A1 | 11/2014 | Bhatnagar et al. |
| 2015/0131140 A1 | 5/2015 | Kailasam et al. |
| 2015/0362763 A1 | 12/2015 | Wheeler et al. |
| 2015/0370139 A1 | 12/2015 | Wang et al. |
| 2016/0011480 A1 | 1/2016 | Pradhan et al. |
| 2016/0026055 A1 | 1/2016 | Choi et al. |
| 2016/0209722 A1 | 7/2016 | Wang et al. |
| 2017/0003564 A1 | 1/2017 | Gillaspie et al. |
| 2017/0097552 A1 | 4/2017 | Pradhan et al. |
| 2017/0176832 A1 | 6/2017 | Pradhan et al. |
| 2017/0184937 A1 | 6/2017 | Wang et al. |
| 2017/0255076 A1 | 9/2017 | Gillaspie et al. |
| 2017/0299933 A1 | 10/2017 | Kailasam et al. |
| 2017/0329200 A1 | 11/2017 | Wang et al. |
| 2017/0357135 A1 | 12/2017 | Gillaspie et al. |
| 2017/0371221 A1 | 12/2017 | Gillaspie et al. |
| 2018/0052374 A1 | 2/2018 | Wang et al. |
| 2018/0173071 A1 | 6/2018 | Mathew et al. |
| 2018/0203320 A1 | 7/2018 | Kailasam et al. |
| 2018/0231858 A1 | 8/2018 | Kailasam et al. |
| 2019/0064623 A1 | 2/2019 | Gillaspie et al. |

(56) References Cited

U.S. PATENT DOCUMENTS

| | | |
|---|---|---|
| 2019/0107763 A1 | 4/2019 | Gillaspie et al. |
| 2019/0113819 A1 | 4/2019 | Pradhan et al. |
| 2019/0171078 A1 | 6/2019 | Pradhan et al. |
| 2019/0171079 A1 | 6/2019 | Gillaspie et al. |
| 2019/0187531 A1 | 6/2019 | Pradhan et al. |
| 2019/0302561 A1 | 10/2019 | Rozbicki et al. |
| 2020/0050072 A1 | 2/2020 | Kozlowski et al. |
| 2020/0096830 A1 | 3/2020 | Sarrach et al. |
| 2020/0124933 A1 | 4/2020 | Kozlowski et al. |
| 2020/0133088 A1 | 4/2020 | Gillaspie et al. |
| 2020/0166817 A1 | 5/2020 | Wang et al. |
| 2020/0174332 A1 | 6/2020 | Gillaspie et al. |
| 2020/0174335 A1 | 6/2020 | Wang et al. |
| 2020/0257178 A1 | 8/2020 | Pradhan et al. |
| 2020/0272014 A1 | 8/2020 | Gillaspie et al. |
| 2020/0278588 A1 | 9/2020 | Gillaspie et al. |
| 2021/0055618 A1 | 2/2021 | Pradhan et al. |
| 2021/0191215 A1 | 6/2021 | Pradhan et al. |
| 2021/0247654 A1 | 8/2021 | Mogensen et al. |
| 2021/0269706 A1 | 9/2021 | Meshcheryakov et al. |
| 2021/0373401 A1 | 12/2021 | Wang et al. |
| 2022/0055943 A1 | 2/2022 | Kozlowski et al. |
| 2022/0066274 A1 | 3/2022 | Rozbicki |
| 2022/0204398 A1 | 6/2022 | Gillaspie et al. |
| 2022/0260885 A1 | 8/2022 | Gillaspie et al. |
| 2022/0308416 A1 | 9/2022 | Rozbicki et al. |
| 2022/0334442 A1 | 10/2022 | Gillaspie et al. |
| 2022/0350217 A1 | 11/2022 | Gillaspie et al. |
| 2022/0388900 A1 | 12/2022 | Pradhan et al. |
| 2023/0074776 A1 | 3/2023 | Wang et al. |
| 2023/0099188 A1 | 3/2023 | Kozlowski et al. |
| 2023/0144179 A1 | 5/2023 | Wang et al. |
| 2023/0205032 A1 | 6/2023 | Pradhan et al. |
| 2023/0296953 A1 | 9/2023 | Rozbicki et al. |

FOREIGN PATENT DOCUMENTS

| | | | | |
|---|---|---|---|---|
| AU | 2015353823 B2 | 2/2021 | | |
| CN | 1207182 A | 2/1999 | | |
| CN | 1245540 A | 2/2000 | | |
| CN | 1350048 A | 5/2002 | | |
| CN | 1476548 A | 2/2004 | | |
| CN | 1492274 A | 4/2004 | | |
| CN | 1541420 A | 10/2004 | | |
| CN | 1688923 A | 10/2005 | | |
| CN | 1710481 A | 12/2005 | | |
| CN | 1738885 A | 2/2006 | | |
| CN | 1739057 A | 2/2006 | | |
| CN | 1928685 A | 3/2007 | | |
| CN | 101188886 A | 5/2008 | | |
| CN | 101310217 A | 11/2008 | | |
| CN | 101322069 A | 12/2008 | | |
| CN | 100462830 C | 2/2009 | | |
| CN | 101377599 A | 3/2009 | | |
| CN | 101419374 A | 4/2009 | | |
| CN | 101634790 A | 1/2010 | | |
| CN | 101833932 A | 9/2010 | | |
| CN | 101930142 A | 12/2010 | | |
| CN | 102099736 A | 6/2011 | | |
| CN | 102230172 A | 11/2011 | | |
| CN | 102376379 A | 3/2012 | | |
| CN | 102388340 A | 3/2012 | | |
| CN | 102388341 A | 3/2012 | | |
| CN | 102414610 A | 4/2012 | | |
| CN | 102455560 A | 5/2012 | | |
| CN | 102478739 A | 5/2012 | | |
| CN | 102540612 A | 7/2012 | | |
| CN | 102576818 A | 7/2012 | | |
| CN | 102666778 A | 9/2012 | | |
| CN | 102934009 A | 2/2013 | | |
| CN | 102998870 A | 3/2013 | | |
| CN | 103080825 A | 5/2013 | | |
| CN | 103135306 A | 6/2013 | | |
| CN | 103168269 A | 6/2013 | | |
| CN | 103339560 A | 10/2013 | | |
| CN | 103838050 A | 6/2014 | | |
| CN | 103930954 A | 7/2014 | | |
| CN | 104040417 A | 9/2014 | | |
| CN | 104321497 A | 1/2015 | | |
| CN | 104364707 A | 2/2015 | | |
| CN | 104730794 A | 6/2015 | | |
| CN | 104730796 A | 6/2015 | | |
| CN | 106773436 A | 5/2017 | | |
| CN | 107111197 A | 8/2017 | | |
| DE | 19816352 A1 | 12/1999 | | |
| EP | 0497616 A2 | 8/1992 | | |
| EP | 0497616 B1 | 7/1999 | | |
| EP | 1918412 A1 | 5/2008 | | |
| JP | S4834547 A | 5/1973 | | |
| JP | S5050892 A | 5/1975 | | |
| JP | S55124440 U | 9/1980 | | |
| JP | S5781242 A | 5/1982 | | |
| JP | S5833223 A | 2/1983 | | |
| JP | S58139128 A | 8/1983 | | |
| JP | S58163921 A | 9/1983 | | |
| JP | S5940625 A | 3/1984 | | |
| JP | S6066238 A | 4/1985 | | |
| JP | S6078423 A | 5/1985 | | |
| JP | S6078424 A | 5/1985 | | |
| JP | S60202429 A | 10/1985 | | |
| JP | H03500096 A | 1/1991 | | |
| JP | H04211227 A | 8/1992 | | |
| JP | H05182512 A | 7/1993 | | |
| JP | H09152634 A | 6/1997 | | |
| JP | H10501847 A | 2/1998 | | |
| JP | H1193827 A | 4/1999 | | |
| JP | 2004205628 A | 7/2004 | | |
| JP | 2004309926 A | 11/2004 | | |
| JP | 2005091788 A | 4/2005 | | |
| JP | 2006235632 A | 9/2006 | | |
| JP | 2007108750 A | 4/2007 | | |
| JP | 2008026605 A | 2/2008 | | |
| JP | 2008102273 A | 5/2008 | | |
| JP | 2008197679 A | 8/2008 | | |
| JP | 2008216744 A | 9/2008 | | |
| JP | 2009009145 A | 1/2009 | | |
| JP | 2010509720 A | 3/2010 | | |
| JP | 2012078774 A | 4/2012 | | |
| JP | 2012523018 A | 9/2012 | | |
| JP | 2012523019 A | 9/2012 | | |
| JP | 2013525860 A | 6/2013 | | |
| JP | 2014052510 A | 3/2014 | | |
| JP | 2015128055 A | 7/2015 | | |
| JP | 5868726 B2 | 2/2016 | | |
| JP | 2016062696 A | 4/2016 | | |
| JP | 5955414 B2 | 7/2016 | | |
| JP | 2017538965 A | 12/2017 | | |
| KR | 20060092362 A | 8/2006 | | |
| KR | 100824302 | * 2/2007 | ............ | D06M 11/45 |
| KR | 20080051280 A | 6/2008 | | |
| KR | 20110100457 A | 9/2011 | | |
| KR | 20130112693 A | 10/2013 | | |
| KR | 20140068026 A | 6/2014 | | |
| KR | 101535100 B1 | 7/2015 | | |
| KR | 20170112183 A | 10/2017 | | |
| KR | 102010733 B1 | 8/2019 | | |
| KR | 102010755 B1 | 8/2019 | | |
| RU | 2117972 C1 | 8/1998 | | |
| TW | 490391 B | 6/2002 | | |
| TW | 200417280 A | 9/2004 | | |
| TW | M338359 U | 8/2008 | | |
| TW | 200839402 A | 10/2008 | | |
| TW | 201003270 A | 1/2010 | | |
| TW | 201211664 A | 3/2012 | | |
| TW | 201222119 A | 6/2012 | | |
| TW | 201435464 A | 9/2014 | | |
| TW | 201439371 A | 10/2014 | | |
| WO | WO-9519588 A2 | 7/1995 | | |
| WO | WO-9847613 A1 | 10/1998 | | |
| WO | WO-0201287 A1 | 1/2002 | | |
| WO | WO-03017387 A1 | 2/2003 | | |
| WO | WO-2004087985 A2 | 10/2004 | | |
| WO | WO 200801777 | * 2/2008 | ......... | G02F 1/15245 |
| WO | WO-2008055824 A1 | 5/2008 | | |

(56) References Cited

FOREIGN PATENT DOCUMENTS

| WO | WO-2008154517 A2 | 12/2008 |
|---|---|---|
| WO | WO-2009000547 A2 | 12/2008 |
| WO | WO-2009029111 A1 | 3/2009 |
| WO | WO-2009108184 A1 | 9/2009 |
| WO | WO-2009115424 A1 | 9/2009 |
| WO | WO-2009148861 A2 | 12/2009 |
| WO | WO-2010120537 A2 | 10/2010 |
| WO | WO-2010147494 A1 | 12/2010 |
| WO | WO-2011137080 A1 | 11/2011 |
| WO | WO-2011137104 A1 | 11/2011 |
| WO | WO-2012138281 A1 | 10/2012 |
| WO | WO-2013054367 A1 | 4/2013 |
| WO | WO-2013074702 A1 | 5/2013 |
| WO | WO-2014025876 A2 | 2/2014 |
| WO | WO-2014025900 A1 | 2/2014 |
| WO | WO-2014113795 A1 | 7/2014 |
| WO | WO-2014113796 A1 | 7/2014 |
| WO | WO-2014113801 A1 | 7/2014 |
| WO | WO-2014201287 A1 | 12/2014 |
| WO | WO-2015168166 A1 | 11/2015 |
| WO | WO-2016039157 A1 | 3/2016 |
| WO | WO-2017011272 A1 | 1/2017 |
| WO | WO-2020247831 A1 | 12/2020 |

OTHER PUBLICATIONS

AU Examination report dated Aug. 17, 2022, in Application No. AU2020294239.
AU Examination report dated Feb. 21, 2022, in Application No. AU2020294239.
AU Examination report dated Jul. 5, 2022, in Application No. AU2020294239.
AU Office Action dated Jun. 23, 2022 in Application No. AU20210202495.
Australian Examination Report dated Apr. 19, 2016 in AU Application No. 2014210572.
Australian Examination Report dated Dec. 17, 2018 in AU Application No. 2017202249.
Australian Examination Report dated Jan. 6, 2014 in AU Application No. 2011245431.
Australian Examination Report dated Jun. 7, 2018 in AU Application No. 2017202249.
Australian Examination Report dated Mar. 18, 2019 in AU Application No. 2017202249.
Australian Examination Report dated May 15, 2020 in AU Application No. 2019229399.
Australian Examination Report dated Sep. 17, 2020 in AU Application No. 2019229399.
Australian Office Action dated Dec. 8, 2020 in AU Application No. 2016294343.
Australian Office Action dated Feb. 19, 2021 in AU Application No. 2016294343.
Australian Office Action dated Oct. 28, 2020 in AU Application No. 2015353823.
Avendano, E. et al., "Electrochromic Nickel-Oxide-Based Films with Minimized Bleached-State Absorptance," I 203rd Meeting of the Electrochemical Society, Electrochemical Society Proceedings vol. 2003-17, 2003, pp. 80-90.
Brazilian Office Action dated Sep. 24, 2019 in BR Application No. 1120120278916.
Burdis, et al., "Technology Advancements to Lower Costs of Electrochromic Window Glazings", SAGE Electronics, Inc., DE-PS26-06NT42764, Final Report, Apr. 2, 2010.
CA Office Action dated Jun. 9, 2022, in Application No. CA2992423.
CA Office Action dated Nov. 10, 2021, in Application No. CA2968832.
Chinese Allowance with Search Report dated May 8, 2021 in CN Application No. 201610832436.6—No Translation.
Chinese Decision of Rejection dated Jun. 2, 2021 in CN Application No. 201580072326.8.
Chinese Notice of Allowance with Search Report dated Mar. 17, 2021 in CN Application No. 201680047325.2.
Chinese Office Action dated Apr. 1, 2020 in CN Application No. CN201610832436.6.
Chinese Office Action dated Apr. 7, 2021 in CN Application No. 201810154035.9.
Chinese Office Action dated Aug. 24, 2020 in CN Application No. 201810154035.9.
Chinese Office Action dated Dec. 21, 2020 in CN Application No. 201680047325.2.
Chinese Office Action dated Dec. 26, 2018 in CN Application No. 201580032579.2.
Chinese Office Action dated Dec. 27, 2018 in CN Application No. 201580029451.0.
Chinese Office Action dated Dec. 3, 2020 in CN Application No. CN201610832436.6.
Chinese Office Action dated Feb. 10, 2021 in CN Application No. 201580072326.8.
Chinese Office Action dated Feb. 19, 2021 in CN Application No. 201580069923.5.
Chinese Office Action dated Jan. 2, 2020 in CN Application No. 201580069923.5.
Chinese Office Action dated Jan. 2, 2020 in CN Application No. 201580072326.8.
Chinese Office Action dated Jan. 22, 2020 in CN Application No. 201580053092.2.
Chinese Office Action dated Jul. 17, 2019 in CN Application No. 201580029451.0.
Chinese Office Action dated Jul. 2, 2019 in CN Application No. 201580032579.2.
Chinese Office Action dated Jun. 2, 2020 in CN Application No. 201680047325.2.
Chinese Office Action dated Mar. 17, 2021 in CN Application No. 201680047325.2.
Chinese Office Action dated Mar. 5, 2020 in CN Application No. 201580029451.0.
Chinese Office Action dated Mar. 5, 2020 in CN Application No. 201580032579.2.
Chinese Office Action dated Nov. 4, 2020 in CN Application No. 201580029451.0.
Chinese Office Action dated Sep. 27, 2020 in CN Application No. 201580069923.5.
Chinese Office Action dated Sep. 27, 2020 in CN Application No. 201580072326.8.
Chinese Office Action mailed Aug. 28, 2018 in CN Application No. CN201610412630.9.
Chinese Office Action mailed Aug. 31, 2015 in CN Application No. CN201180027892.9.
Chinese Office Action mailed Jan. 8, 2015 in CN Application No. CN201180027892.9.
Chinese Office Action mailed Jun. 15, 2017 in CN Application No. 201380031908.2.
Chinese Office Action mailed Mar. 22, 2019 in CN Application No. CN201610412630.9.
Chinese Office Action mailed Mar. 31, 2016 in CN Application No. CN201180027892.9.
Chinese Office Action mailed Sep. 28, 2016 in CN Application No. 201380031908.2.
Chinese Reexamination dated May 21, 2021 in CN Application No. 201580032579.2.
CN Office Action dated Aug. 3, 2021, in CN Application No. 201810154035.9.
CN Office Action dated Aug. 30, 2021, in CN Application No. 201580032579.2 with English translation.
EP Office Action dated Feb. 11, 2022, in Application No. EP15863517.7.
EP Office Action dated Mar. 16, 2022, in Application No. EP15862207.6.
EP Summons to Attend Oral Proceedings dated Apr. 28, 2020 in EP Application No. 13785049.1.
EP Summons to attend Oral Proceedings dated Oct. 18, 2021 in Application No. 15785891.1.

(56) References Cited

OTHER PUBLICATIONS

European Extended Search Report dated Aug. 2, 2021 in EP Application No. 3872563.
European Office Action dated Feb. 10, 2017 in EP Application No. 11775488.7.
European Office Action dated Mar. 12, 2020 in EP Application No. 15862207.6.
European Office Action dated Mar. 13, 2020 in EP Application No. 15863517.7.
European Office Action dated May 11, 2021 in EP Application No. 20153706.5.
European Office Action dated May 3, 2021 in EP Application No. 16824923.3.
European Office Action dated May 7, 2019 in EP Application No. 13785049.1.
European Office Action dated Oct. 10, 2019 in EP Application No. 15785891.1.
European Office Action dated Oct. 16, 2017 in EP Application No. 11775488.7.
European Office Action dated Oct. 23, 2018 in EP Application No. 15785437.3.
European Search Report dated May 13, 2014 in EP Application No. 11775488.7.
European Search Report (Extended) dated Apr. 17, 2020 in EP Application No. 20156430.9.
European Search Report (Extended) dated Apr. 6, 2016 in EP Application No. 13785049.1.
European Search Report (Extended) dated Dec. 1, 2017 in EP Application No. 15785891.1.
European Search Report (Extended) dated Dec. 14, 2018 in EP Application No. 16824923.3.
European Search Report (Extended) dated Jan. 29, 2018 in EP Application No. 15837472.8.
European Search Report (Extended) dated Mar. 30, 2020 in EP Application No. 20153706.5.
European Search Report (Extended) dated May 2, 2018 in EP Application No. 15862207.6.
European Search Report (Extended) dated May 24, 2018 in EP Application No. 15863517.7.
European Search Report (Extended) dated May 26, 2020 in EP Application No. 19206961.5.
European Search Report (Extended) dated Nov. 28, 2017 in EP Application No. 15785437.3.
European Search Report (Partial Supplementary) dated Jan. 8, 2016 in EP Application No. 13785049.1.
Extended European search report dated Oct. 31, 2022, in Application No. EP22190639.9.
Extended European Search Report dated Aug. 2, 2021 for EP Application No. 21169812.1.
Green, Sara, "Electrochromic nickel-tungsten oxides: optical, electrochemical and structural characterization of sputter-deposited thin films in the whole composition range," Dissertation, Digital Comprehensive Summaries of Uppsala Dissertations from the Faculty of Science and Technology 963, Uppsala University, Sweden, 2012.
Hersh, H.N., "Mechanism of Electrochromism in WO3," Applied Physics Letters, vol. 27, No. 12, Dec. 15, 1975, pp. 646-648.
Hutchins, M.G. et al., "The electrochromic behavior of tin-nickel oxide," Solar Energy Materials and Solar Cells, vol. 54, 1998, pp. 75-84.
IN Examination Report dated Oct. 12, 2021, in application No. IN201838043541.
IN First Examination report dated on Aug. 26, 2021, in application No. IN201717044876.
IN Office Action dated Aug. 26, 2022, in Application No. IN202037048424.
Indian Hearing Notice dated Oct. 20, 2020 in IN Application No. 3663/KOLNP/2012.
Indian Office Action dated Jun. 19, 2018 in IN Application No. 3663/KOLNP/2012.
Indian Office Action dated Jun. 30, 2021 in IN Application No. 201737018863.
International Preliminary Report on Patentability dated Dec. 16, 2021, in application No. PCT/US2020/036440.
International Preliminary Report on Patentability dated Jan. 25, 2018 in PCT/US16/41375.
International Preliminary Report on Patentability dated Jun. 8, 2017 in PCT/US15/61668.
International Preliminary Report on Patentability dated Jun. 8, 2017 in PCT/US15/61995.
International Preliminary Report on Patentability dated Mar. 16, 2017 in PCT/US15/47891.
International Preliminary Report on Patentability dated Nov. 13, 2014 in PCT/US2013/038481.
International Preliminary Report on Patentability, dated Nov. 15, 2012 in PCT/US2011/033822.
International Preliminary Report on Patentability dated Nov. 15, 2012 in PCT/US2011/033906.
International Preliminary Report on Patentability dated Nov. 17, 2016 in PCT/US15/028899.
International Preliminary Report on Patentability dated Nov. 17, 2016 in PCT/US15/28067.
International Preliminary Report on Patentability dated Nov. 5, 2020 in PCT/US19/027931.
International Preliminary Report on Patentability dated Oct. 4, 2018 in PCT/US17/24120.
International Search Report and Written Opinion, dated Aug. 14, 2013 in PCT/US2013/038481.
International Search Report and Written Opinion dated Aug. 26, 2015 in PCT/US15/28067.
International Search Report and Written Opinion dated Feb. 29, 2016 in PCT/US15/61668.
International Search Report and Written Opinion dated Jul. 16, 2015 in PCT/US15/028899.
International Search Report and Written Opinion, dated Jul. 7, 2011, issued in PCT/US2011/033822.
International Search Report and Written Opinion dated Jul. 9, 2019 in PCT/US19/027931.
International Search Report and Written Opinion dated Mar. 18, 2016 in PCT/US15/47891.
International Search Report and Written Opinion dated Mar. 7, 2016 in PCT/US15/61995.
International Search Report and Written Opinion dated Oct. 18, 2016 in PCT/US16/41375.
International Search Report and Written Opinion, dated Sep. 14, 2011, issued in PCT/US2011/033906.
International Search Report and Written Opinion dated Sep. 21, 2020 in PCT/US2020/036440.
International Search Report and Written Opinion (ISA/KR) dated Jul. 7, 2017 in PCT/US17/24120.
Japanese Decision to Grant dated Mar. 16, 2021 in JP Application No. 2020-067107.
Japanese Office Action dated Apr. 21, 2021 in JP Application No. 2017-527761.
Japanese Office Action dated Mar. 5, 2019 in JP Application No. JP2018-028971.
Japanese Office Action dated May 7, 2020 in JP Application No. 2017-564044.
Japanese Office Action dated Sep. 23, 2020 in JP Application No. 2017-527761.
Japanese Office Action dated Sep. 24, 2019 in JP Application No. 2017-527761.
Japanese Office Action mailed Mar. 8, 2016 in JP Application No. JP2015-118553.
Japanese Office Action mailed Nov. 21, 2017 in JP Application No. JP2016-215029.
JP Office Action dated Aug. 3, 2021, in Application No. JP2017527761.
JP Office Action dated Dec. 7, 2021, in Application No. JP20200207808.
JP Office Action dated Mar. 1, 2022, in Application No. JP2021-013861.
JP Office Action dated Sep. 13, 2022, in Application No. JP2021-013861.

(56) References Cited

OTHER PUBLICATIONS

Kondrachova, L. et al., "Cathodic Electrodeposition of Mixed Molybdenum Tungsten Oxides From Peroxo-polymolybdotungstate Solutions", Langmuir 2006, vol. 22, No. 25, Aug. 31, 2006, pp. 10490-10498.
Korean Notice of Allowance & Search Reported dated May 26, 2021 in KR Application No. 10-2021-7006423.
Korean Office Action dated Sep. 28, 2020 in KR Application No. 10-2019-7024032.
Korean Office Action mailed Feb. 28, 2017 in KR Application No. 10-2012-7031407.
Korean Office Action mailed Feb. 8, 2018 in KR Application No. 10-2018-7002491.
Korean Office Action mailed Mar. 24, 2021 in KR Application No. 10-2021-7006423.
Korean Office Action mailed Oct. 30, 2018 in KR Application No. 10-2018-7030647.
KR Office Action dated Jan. 14, 2022, in Application No. KR1020217042357 with English translation.
KR Office Action dated Nov. 25, 2021, in Application No. KR1020177017239 with English translation.
Mexican Office Action mailed Jun. 6, 2013 in MX Application No. MX/a/2012/012573.
Pennisi, A. et al., "Electrochromic Properties of Tungsten-molybdenum Oxide Electrodes", Solar Energy Materials and Solar Cells, vol. 28, No. 3, Dec. 1, 1992, pp. 233-247, XP000328508.
Preliminary Amendment filed Aug. 3, 2018 in U.S. Appl. No. 15/916,142.
Preliminary Amendment filed Feb. 27, 2020 for U.S. Appl. No. 16/785,547.
Preliminary Amendment filed Jul. 13, 2020 for U.S. Appl. No. 15/931,359.
Preliminary Amendment filed Jul. 29, 2020 for U.S. Appl. No. 16/879,255.
Preliminary Amendment filed Jul. 6, 2020 for U.S. Appl. No. 16/859,856.
Russian Office Action dated Apr. 11, 2019 in RU Application No. 2017120233.
Russian Office Action dated Feb. 25, 2015 in RU Application No. 2012151304.
Russian Office Action dated Mar. 12, 2019 in RU Application No. 2015148673.
Russian Search Report dated Nov. 1, 2019 in RU Application No. 2018105193.
Singapore Examination Report dated Nov. 5, 2013 in SG Application No. 201208018-0.
Taiwanese Allowance with Search Report dated Mar. 12, 2021 in TW Application No. 109123760—No Translation.
Taiwanese Decision of Rejection dated Jul. 7, 2020 in TW Application No. 104139219.
Taiwanese Decision of Rejection dated Nov. 29, 2016 in TW Application No. 104144317.
Taiwanese Decision of Rejection mailed Feb. 24, 2017 in TW Application No. 100115201.
Taiwanese Office Action dated Aug. 26, 2019 in TW Application No. 108106923.
Taiwanese Office Action dated Dec. 7, 2018 in TW Application No. 106128807.
Taiwanese Office Action dated Feb. 18, 2020 in TW Application No. 105122100.
Taiwanese Office Action dated Mar. 12, 2021 in TW Application No. 108135570.
Taiwanese Office Action dated Mar. 25, 2019 in TW Application No. 106128807.
Taiwanese Office Action dated Oct. 12, 2018 in TW Application No. 104144317.
Taiwanese Office Action dated Oct. 15, 2020 in TW Application No. 105122100.
Taiwanese Office Action dated Sep. 20, 2019 in TW Application No. 104139219, with summary translation.
Taiwanese Office Action mailed Jul. 22, 2015 in TW Application No. 100115190.
Taiwanese Office Action mailed Jun. 1, 2016 in TW Application No. 104144317.
Taiwanese Office Action mailed May 26, 2016 in TW Application No. 100115201.
Taiwanese Search Report dated Oct. 11, 2018 in TW Application No. 106118525.
TW Office Action dated Aug. 29, 2022, in Application No. TW110134875 with English translation.
TW Office Action dated Mar. 29, 2022, in Application No. TW110125561 with English translation.
TW Office Action dated Mar. 29, 2022, in Application No. TW110134875 with English translation.
TW Office Action dated Nov. 24, 2021, in Application No. TW105122100 with English translation.
TW Office Action dated Nov. 24, 2021 in Application No. TW110121767 with English translation.
U.S. Corrected Notice of Allowance dated Nov. 15, 2022 in U.S. Appl. No. 16/774,621.
U.S. Corrected Notice of Allowance dated Sep. 21, 2022 in U.S. Appl. No. 16/774,621.
U.S. Non-Final office Action dated Sep. 8, 2022 in U.S. Appl. No. 15/916,142.
U.S. Notice of Allowance dated Jul. 11, 2022 in U.S. Appl. No. 16/774,621.
U.S. Corrected Notice of Allowability dated Jan. 25, 2022, in U.S. Appl. No. 16/785,547.
U.S. Corrected Notice of Allowance dated May 11, 2022 in U.S. Appl. No. 16/879,255.
US Final Office Action dated Dec. 14, 2020 in U.S. Appl. No. 15/916,142.
US Final Office Action dated Jan. 31, 2020 in U.S. Appl. No. 15/916,142.
US Final Office Action dated Jan. 6, 2020 in U.S. Appl. No. 16/088,024.
US Final Office Action dated Jul. 23, 2015 in U.S. Appl. No. 13/462,725.
US Final Office Action dated Jun. 27, 2013 in U.S. Appl. No. 12/814,277.
US Final Office Action dated Jun. 27, 2013 in U.S. Appl. No. 12/814,279.
U.S. Final Office Action dated Mar. 7, 2022, in U.S. Appl. No. 15/916,142.
U.S. Non Final Office Action dated Jan. 13, 2022 in U.S. Appl. No. 16/879,255.
U.S. Non-Final office Action dated Jul. 22, 2022 in U.S. Appl. No. 16/782,543.
U.S Non-Final Office Action dated Jul. 28, 2022, in U.S. Appl. No. 16/949,463.
U.S Non-Final Office Action dated Jun. 10, 2022, in U.S. Appl. No. 16/660,660.
US Non-Final Office action dated Oct. 4, 2021, in U.S. Appl. No. 16/721,655.
US Non-Final Office action dated Oct. 4, 2021, in U.S. Appl. No. 16/859,856.
U.S. Non-Final Office Action dated Oct. 15, 2021 in U.S. Appl. No. 15/931,359.
U.S. Non-Final Office Action dated Oct. 20, 2022, in U.S. Appl. No. 17/452,387.
U.S. Notice of Allowance dated Sep. 6, 2022 in U.S. Appl. No. 16/774,621.
US Notice of Allowability (corrected) dated Jan. 8, 2020 in U.S. Appl. No. 16/250,738.
US Notice of Allowance (corrected) dated Feb. 27, 2017 in U.S. Appl. No. 14/683,541.
US Notice of Allowance (Corrected) dated Nov. 28, 2018 for U.S. Appl. No. 15/526,969.
U.S. Notice of Allowance dated Apr. 11, 2022 in U.S. Appl. No. 16/785,547.
US Notice of Allowance dated Apr. 12, 2017 in U.S. Appl. No. 15/004,794.

(56) References Cited

OTHER PUBLICATIONS

U.S. Notice of Allowance dated Apr. 15, 2022 in U.S. Appl. No. 16/879,255.
U.S. Notice of Allowance dated Apr. 5, 2022, in U.S. Appl. No. 15/931,359.
US Notice of Allowance dated Aug. 19, 2020 U.S. Appl. No. 16/088,024.
US Notice of Allowance dated Aug. 4, 2015 in U.S. Appl. No. 14/209,993.
US Notice of Allowance dated Aug. 9, 2017 in U.S. Appl. No. 15/004,794.
U.S. Notice of Allowance dated Dec. 2, 2022 in U.S. Appl. No. 16/782,543.
U.S. Notice of Allowance dated Dec. 5, 2022 in U.S. Appl. No. 16/949,463.
US Notice of Allowance dated Dec. 10, 2020 in U.S. Appl. No. 16/205,084.
US Notice of Allowance dated Dec. 19, 2019 in U.S. Appl. No. 15/612,928.
U.S Notice of Allowance dated Dec. 24, 2021 in U.S. Appl. No. 16/785,547.
US Notice of Allowance dated Dec. 3, 2019 in U.S. Appl. No. 15/795,843.
US Notice of Allowance dated Dec. 4, 2017 for U.S. Appl. No. 15/587,114.
US Notice of Allowance dated Feb. 12, 2020 in U.S. Appl. No. 16/168,587.
US Notice of Allowance dated Feb. 14, 2014 for U.S. Appl. No. 13/627,798.
U.S. Notice of Allowance dated Feb. 23, 2022, in U.S. Appl. No. 16/721,655.
US Notice of Allowance dated Feb. 5, 2020 in U.S. Appl. No. 16/204,540.
US Notice of Allowance dated Jan. 11, 2017 in U.S. Appl. No. 14/841,511.
US Notice of Allowance dated Jan. 21, 2014 in U.S. Appl. No. 13/610,684.
US Notice of Allowance dated Jan. 22, 2015 in U.S. Appl. No. 14/052,455.
US Notice of Allowance dated Jan. 23, 2020 for U.S. Appl. No. 16/284,876.
U.S. Notice of Allowance dated Jan. 26, 2022, in U.S. Appl. No. 16/859,856.
US Notice of Allowance dated Jan. 27, 2017 in U.S. Appl. No. 14/683,541.
US Notice of Allowance dated Jan. 3, 2019 for U.S. Appl. No. 15/340,853.
US Notice of Allowance dated Jul. 10, 2013 in U.S. Appl. No. 12/772,075.
US Notice of Allowance dated Jul. 17, 2019 in U.S. Appl. No. 15/795,843.
US Notice of Allowance dated Jul. 22, 2021 in U.S. Appl. No. 16/384,822.
US Notice of Allowance dated Jul. 26, 2019 in U.S. Appl. No. 15/612,928.
US Notice of Allowance dated Mar. 11, 2019 for U.S. Appl. No. 15/507,734.
US Notice of Allowance dated Mar. 12, 2014 in U.S. Appl. No. 12/814,277.
US Notice of Allowance dated Mar. 17, 2014 in U.S. Appl. No. 12/814,279.
US Notice of Allowance dated Mar. 26, 2018 for U.S. Appl. No. 15/587,114.
US Notice of Allowance dated May 11, 2015 in U.S. Appl. No. 14/052,455.
U.S. Notice of Allowance dated May 13, 2022 in U.S. Appl. No. 16/859,856.
US Notice of Allowance dated May 22, 2018 in U.S. Appl. No. 15/457,609.
US Notice of Allowance dated May 28, 2015 in U.S. Appl. No. 14/209,993.
US Notice of Allowance dated May 31, 2012 issued in U.S. Appl. No. 13/166,537.
US Notice of Allowance dated Nov. 21, 2019 for U.S. Appl. No. 15/204,868.
US Notice of Allowance dated Nov. 25, 2015 in U.S. Appl. No. 13/462,725.
US Notice of Allowance dated Nov. 28, 2018 for U.S. Appl. No. 15/953,327.
US Notice of Allowance dated Nov. 6, 2019 in U.S. Appl. No. 16/250,738.
US Notice of Allowance dated Oct. 18, 2018 for U.S. Appl. No. 15/526,969.
US Notice of Allowance dated Oct. 31, 2018 in U.S. Appl. No. 15/441,130.
US Notice of Allowance, dated Sep. 18, 2012, issued in U.S. Appl. No. 12/772,055.
US Notice of Allowance dated Sep. 24, 2018 for U.S. Appl. No. 15/527,194.
US Notice of Allowance dated Sep. 25, 2018 for U.S. Appl. No. 15/507,734.
US Office Action, dated Apr. 26, 2012, issued in U.S. Appl. No. 12/772,055.
US Office Action dated Apr. 5, 2018 in U.S. Appl. No. 15/441,130.
US Office Action dated Aug. 12, 2016 in U.S. Appl. No. 14/683,541.
US Office Action dated Aug. 12, 2019 in U.S. Appl. No. 15/916,142.
US Office Action dated Aug. 16, 2012 issued in U.S. Appl. No. 12/772,075.
US Office Action dated Aug. 2, 2021 in U.S. Appl. No. 16/785,547.
US Office Action dated Aug. 6, 2014 in U.S. Appl. No. 14/052,455.
US Office Action dated Dec. 26, 2012 in U.S. Appl. No. 12/772,075.
US Office Action dated Dec. 30, 2016 in U.S. Appl. No. 15/004,794.
US Office Action dated Dec. 31, 2018 in U.S. Appl. No. 15/795,843.
US Office Action dated Feb. 16, 2012 issued in U.S. Appl. No. 13/166,537.
US Office Action dated Feb. 25, 2019 for U.S. Appl. No. 15/204,868.
US Office Action dated Jan. 14, 2015 in U.S. Appl. No. 13/462,725.
US Office Action dated Jan. 20, 2012 issued in U.S. Appl. No. 12/772,075.
US Office Action dated Jan. 23, 2019 in U.S. Appl. No. 15/612,928.
US Office Action dated Jul. 10, 2018 for U.S. Appl. No. 15/953,327.
US Office Action dated Jul. 10, 2019 in U.S. Appl. No. 16/250,738.
US Office Action dated Jul. 23, 2021 in U.S. Appl. No. 15/916,142.
US Office Action dated Jul. 25, 2019 for U.S. Appl. No. 16/168,587.
US Office Action dated Jul. 25, 2019 in U.S. Appl. No. 16/088,024.
US Office Action dated Jul. 25, 2019 in U.S. Appl. No. 16/204,540.
US Office Action dated Jul. 25, 2019 in U.S. Appl. No. 16/284,876.
US Office Action dated Jul. 28, 2016 in U.S. Appl. No. 14/841,511.
US Office Action dated Jun. 16, 2020 in U.S. Appl. No. 15/916,142.
US Office Action dated Jun. 25, 2013 in U.S. Appl. No. 13/610,684.
US Office Action dated Jun. 27, 2018 in U.S. Appl. No. 15/612,928.
U.S. Office Action dated Mar. 16, 2022, in U.S. Appl. No. 16/719,700.
US Office Action dated May 15, 2018 for U.S. Appl. No. 15/507,734.
US Office Action dated May 15, 2018 for U.S. Appl. No. 15/527,194.
US Office Action dated May 25, 2018 for U.S. Appl. No. 15/526,969.
US Office Action dated Nov. 20, 2012 in U.S. Appl. No. 12/814,277.
US Office Action dated Nov. 20, 2012 in U.S. Appl. No. 12/814,279.
US Office Action dated Oct. 25, 2011 issued in U.S. Appl. No. 13/166,537.
US Office Action dated Sep. 11, 2017 for U.S. Appl. No. 15/587,114.
US Office Action dated Sep. 20, 2018 for U.S. Appl. No. 15/340,853.
U.S. Appl. No. 17/816,364, inventors Pradhan et al., filed Jul. 29, 2022.
U.S. Appl. No. 18/050,918, inventors Wang et al., filed Oct. 28, 2022.
U.S. Appl. No. 18/055,825, inventors Kozlowski et al., filed Nov. 15, 2022.
U.S. Restriction Requirement dated Apr. 27, 2022 in U.S. Appl. No. 16/782,543.
U.S. Restriction Requirement dated Feb. 17, 2022 in U.S. Appl. No. 16/774,621.
Velux SageGlass Flyer, 2007, 4 pages.

(56) References Cited

OTHER PUBLICATIONS

Vink, et al., "Lithium Trapping at Excess Oxygen in Sputter-Deposited a-WO3 Films", Japanese Journal of Applied Physics, vol. 8, No. 3, Feb. 1, 1999, pp. 1540-1544.
Wikipedia webpage "Doping (semiconductors)" (Year: 2008).
Wikipedia webpage "Non-stoichiometric compound" (Year: 2008).
Yoshimura, et al., "Electrochromism in a Thin-Film Device Using Li2WO4 as an Li-Electrolyte", Japanese Journal of Applied Physics, vol. 22, No. 1, Jan. 1983, pp. 152-156.
AU Office Action dated Oct. 19, 2022, in application No. AU2021236496.
CA Office Action dated Jul. 14, 2023, in Application No. CA2968832.
Chinese Allowance with Search Report dated May 8, 2021 in CN Application No. 201610832436.6 with English translation.
Chinese Notice of Allowance with Search Report dated Jul. 15, 2021 in CN Application No. 201680047325.2 with English translation.
CN Office Action dated Apr. 3, 2023, in application No. 20158069923.5 with English translation.
CN Office Action dated Aug. 23, 2023, in application No. CN202080050069.9 with English translation.
CN Office Action dated Dec. 1, 2022 in Application No. CN201580069923.5 with English translation.
CN Office Action dated Jul. 31, 2023, in application No. CN202210140306.1 with English translation.
CN Office Action dated Jun. 9, 2023, in CN Application No. 201810154035.9 with English Translation.
CN Office Action dated Sep. 1, 2023, in Application No. CN202110652522.X with English translation.
CN Office Action dated Sep. 20, 2023, in Application No. CN202111168365.1 with English translation.
CN Office Action dated Sep. 25, 2023, in Application No. CN202011285041.1 with English translation.
CN Office Action dated Sep. 27, 2023, in application No. CN201980038535.9 with English translation.
CN Office Action dated Sep. 27, 2023, in application No. CN202111411891.6 with English translation.
EP Extended European Search Report dated Aug. 31, 2023, in Application No. EP23158636.3.
EP Extended European Search Report dated Dec. 19, 2022 in Application No. EP22187492.8.
EP Extended European Search report dated Feb. 3, 2023 in Application No. EP22204822.5.
EP Extended European Search report dated Oct. 20, 2023 in EP Application No. 23193972.9.
EP Search report dated Mar. 15, 2022, in Application No. EP21206721.9.
IN Office Action dated Aug. 4, 2022, in Application No. IN202238017115.
JP Office Action dated Apr. 4, 2023 in Application No. JP2021-013861 with English translation.
JP Office Action dated Aug. 22, 2023, in Application No. JP2022-112947 with English translation.
JP Office Action dated Dec. 7, 2021, in Application No. JP20200207808 with English translation.
JP Office Action dated Feb. 7, 2023 in Application No. JP2022-112947 with English translation.
JP Office Action dated Jan. 4, 2023, in Application No. JP2020-559396 with English translation.
JP Office Action dated Jun. 27, 2023, in Application No. JP2020-559396 with English translation.
JP Office Action dated Mar. 1, 2022, in Application No. JP2021-013861 with English translation.
JP Office Action dated Sep. 13, 2022, in Application No. JP2021-013861 with English translation.
KR Office Action dated Dec. 15, 2022, in Application No. KR10-2018-7002665 with English translation.
KR Office Action dated Jul. 31, 2023, in Application No. KR10-2018-7002665 with English translation.
Lee, S. et al., Electrochromic coloration efficiency of a-WO$_3$-y thin films as a function of oxygen deficiency, Applied Physics Letters, Sep. 13, 1999, vol. 75, No. 11, pp. 1541-1543.
Lee, S. et al., "Electrochromic mechanism in a-WO$_3$-y thin films", Applied Physics Letters, Jan. 11, 1999, vol. 74, No. 2, pp. 242-244.
Ozin, G.A. et al., "Smart Zeolites: New Forms of Tungsten and Molybdenum Oxides" Accounts of Chemical Research, 1992, vol. 25, No. 12, pp. 553-560.
TW Office Action dated Aug. 2, 2023, in application No. TW20220119773 with English translation.
TW Office Action dated Aug. 4, 2023, in application No. TW111145963 with English translation.
TW Office Action dated Aug. 7, 2023 in Application No. TW108114133 with English translation.
TW Office Action dated Mar. 21, 2023, in Application No. TW108114133 with English translation.
U.S. Corrected Notice of Allowance dated Jan. 5, 2023 in U.S. Appl. No. 16/782,543.
U.S Advisory Action dated Apr. 5, 2023 in U.S. Appl. No. 16/719,700.
U.S Advisory Action dated Mar. 3, 2023 in U.S. Appl. No. 16/660,660.
U.S. Corrected Notice of Allowance dated Dec. 23, 2022 in U.S. Appl. No. 16/949,463.
U.S. Corrected Notice of Allowance dated Oct. 12, 2023, in U.S. Appl. No. 17/445,245.
U.S. Corrected Notice of Allowance dated Sep. 7, 2023, in U.S. Appl. No. 15/916,142.
U.S. Final Office Action dated Dec. 23, 2022 in U.S. Appl. No. 16/660,660.
U.S. Final Office Action dated Dec. 27, 2022 in U.S. Appl. No. 16/719,700.
U.S. Final Office Action dated Jul. 17, 2023, in U.S. Appl. No. 16/660,660.
U.S. Final Office Action dated Mar. 10, 2023 in U.S. Appl. No. 15/916,142.
U.S. Final Office Action dated Nov. 13, 2023 in U.S. Appl. No. 16/719,700.
U.S. Final Office Action dated Oct. 2, 2023 in U.S. Appl. No. 17/517,510.
U.S. Non-Final Office Action dated Apr. 4, 2023 in U.S. Appl. No. 16/660,660.
U.S. Non-Final Office Action dated Dec. 1, 2023 in U.S. Appl. No. 16/660,660.
U.S. Non-Final Office Action dated Jul. 25, 2023 in U.S. Appl. No. 17/656,367.
U.S. Non-Final Office Action dated Jul. 25, 2023 in U.S. Appl. No. 17/812,734.
U.S. Non-Final Office Action dated Jul. 31, 2023 in U.S. Appl. No. 17/810,656.
U.S. Non-Final Office Action dated May 2, 2023 in U.S. Appl. No. 17/517,510.
U.S. Non-Final Office Action dated May 19, 2023 in U.S. Appl. No. 16/719,700.
U.S. Non-Final Office Action dated May 25, 2023 in U.S. Appl. No. 17/445,245.
U.S. Non-Final Office Action dated Sep. 6, 2023, in U.S. Appl. No. 17/249,641.
U.S. Non-Final Office Action dated Sep. 19, 2023, in U.S. Appl. No. 17/452,387.
U.S. Notice of Allowance dated Aug. 23, 2023 in U.S. Appl. No. 15/916,142.
U.S. Notice of Allowance dated Dec. 14, 2023 in U.S. Appl. No. 17/816,364.
U.S. Notice of Allowance dated Dec. 20, 2023 in U.S. Appl. No. 17/656,367.
U.S. Notice of Allowance dated Dec. 20, 2023 in U.S. Appl. No. 17/810,656.
U.S. Notice of Allowance dated Feb. 24, 2023 in U.S. Appl. No. 17/452,387.
U.S. Notice of Allowance dated Jan. 30, 2023 in U.S. Appl. No. 16/782,543.
U.S. Notice of Allowance dated Mar. 16, 2023 in U.S. Appl. No. 17/452,387.

(56) References Cited

OTHER PUBLICATIONS

U.S. Notice of Allowance dated Sep. 20, 2023, in U.S. Appl. No. 17/816,364.
U.S. Notice of Allowance dated Sep. 27, 2023, in U.S. Appl. No. 17/445,245.
U.S. Appl. No. 18/153,090, Wang et al., filed Jan. 11, 2023.
U.S. Appl. No. 18/323,307, inventors Robert Tad Rozbicki et al., filed May 24, 2023.
U.S. Restriction Requirement dated Feb. 17, 2023 in U.S. Appl. No. 17/517,510.
U.S Restriction requirement dated Nov. 6, 2023 in U.S. Appl. No. 18/050,918.
Avendano E., et al., "Electrochromism in Nickel Oxide Films Containing Mg, Al, Si, V, Zr, Nb, Ag, or Ta," Solar Energy Materials & Solar Cells, 2004, vol. 84, pp. 337-350.
CA Office Action dated Feb. 14, 2024 in CA Application No. 3098324.
CA Office Action dated Feb. 22, 2024 in CA Application No. 3145184.
CA Office Action dated Jan. 26, 2024 in CA Application No. 2992423.
CN Office Action dated Feb. 27, 2024 in CN Application No. 202210140306.1, with English Translation.
CN Office Action dated Jan. 30, 2024 in CN Application No. 202080050069.9, with English Translation.
CN Office Action dated Mar. 28, 2024 in CN Application No. 202111168365.1.
CN Office Action dated Mar. 31, 2024 in CN Application No. 201980038535.9.
JP Office Action dated Mar. 12, 2024, in Application No. JP2022-112947 with English Translation.
KR Office Action dated Feb. 28, 2024 in KR Application No. 10-2022-7044037, with English Translation.
Makimura Y., et al., "Cobalt and Tantalum Additions for Enhanced Electrochromic Performances of Nickel-based Oxide Thin Films Grown by Pulsed Laser Deposition," Applied Surface Science, 2006, vol. 252, pp. 4593-4598.
TW Office Action dated Dec. 22, 2023 in TW Application No. 108114133, with English Translation.
U.S. Advisory Action dated Jan. 26, 2024 in U.S. Appl. No. 16/719,700.
U.S. Corrected Notice of Allowance dated Jan. 10, 2024 in U.S. Appl. No. 17/445,245.
U.S. Final Office Action dated Apr. 5, 2024 in U.S. Appl. No. 17/452,387.
U.S. Non-Final Office Action dated Feb. 27, 2024 in U.S. Appl. No. 16/719,700.
U.S. Non-Final Office Action dated Jan. 8, 2024 in U.S. Appl. No. 17/517,510.
U.S. Non-Final Office Action dated Jan. 10, 2024 in U.S. Appl. No. 18/179,320.
U.S. Non-Final Office Action dated Jan. 29, 2024 in U.S. Appl. No. 18/323,307.
U.S. Notice of Allowance dated Jan. 26, 2024 in U.S. Appl. No. 15/916,142.
U.S. Notice of Allowance dated Mar. 8, 2024 in U.S. Appl. No. 18/050,918.
U.S. Notice of Allowance dated Mar. 28, 2024 in U.S. Appl. No. 18/050,918.
U.S. Appl. No. 18/611,458, inventors Gillaspie D, et al., filed Mar. 20, 2024.
U.S. Appl. No. 18/611,467, inventors Gillaspie D, et al., filed Mar. 20, 2024.
U.S. Restriction Requirement dated Feb. 13, 2024 in U.S. Appl. No. 17/696,783.
U.S. Restriction Requirement dated Mar. 28, 2024 in U.S. Appl. No. 18/153,090.
Wikipedia: "Dopant," Wikipedia Webpage, 2008, 2 pages, [Retrieved on Feb. 21, 2024], Retrieved from [https://en.wikipedia.org/w/index.php?title=Dopant&oldid=260133883].

* cited by examiner

Direction of substrate travel

Oxygen Concentration in Sputtering Atmosphere (%)

800a

| ENTRY LOAD LOCK | EC LAYER STATION | IC LAYER STATION | CE LAYER STATION | EXIT LOAD LOCK |
|---|---|---|---|---|
| 802 | 806a | 806b | 806c | 804 |

| ENTRY LOAD LOCK | EC LAYER STATION 1 | EC LAYER STATION 2 | CE LAYER STATION 1 | CE LAYER STATION 2 | EXIT LOAD LOCK |
|---|---|---|---|---|---|
| 802 | 850 | 851 | 852 | 853 | 804 |

| ENTRY LOAD LOCK | EC LAYER STATION 1 | EC LAYER STATION 2 | CE LAYER STATION 1 | CE LAYER STATION 2 | LITIATION STATION | CAPPING LAYER STATION | TCO STATION | EXIT LOAD LOCK |
|---|---|---|---|---|---|---|---|---|
| 802 | 850 | 851 | 852 | 853 | 854 | 855 | 856 | 804 |

FIGURE 9E

COUNTER ELECTRODE FOR ELECTROCHROMIC DEVICES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. One well known electrochromic material, for example, is tungsten oxide ($WO_3$). Tungsten oxide is a cathodic electrochromic material in which a coloration transition, transparent to blue, occurs by electrochemical reduction.

Electrochromic materials may be incorporated into, for example, windows and mirrors. The color, transmittance, absorbance, and/or reflectance of such windows and mirrors may be changed by inducing a change in the electrochromic material. One well known application of electrochromic materials, for example, is the rear view mirror in some cars. In these electrochromic rear view mirrors, the reflectivity of the mirror changes at night so that the headlights of other vehicles are not distracting to the driver.

While electrochromism was discovered in the 1960's, electrochromic devices have historically suffered from various problems that have prevented the technology from realizing its full commercial potential.

SUMMARY

The embodiments herein relate to electrochromic materials, electrochromic stacks, electrochromic devices, as well as methods and apparatus for making such materials, stacks, and devices. In various embodiments, a counter electrode material may have a heterogeneous composition. In some cases, the counter electrode may be deposited to include multiple sublayers that may have different compositions and/or morphologies. In these or other cases, the counter electrode may be deposited to include a gradient in composition. The gradient (if present) is typically in a direction that is normal to the plane of the counter electrode. In various embodiments, the composition is heterogeneous with respect to the concentration of one or more metals in the counter electrode material. The gradient in composition may extend over the entire thickness of the counter electrode or over only a portion (e.g., sublayer) of the counter electrode.

In one aspect of the disclosed embodiments, an electrochromic device is provided, the electrochromic device including: a substrate; an electrochromic layer disposed on or over the substrate, said electrochromic layer including a cathodically tinting electrochromic material; and a counter electrode layer also disposed on or over the substrate, said counter electrode layer including (a) a first sublayer including a first anodically tinting material, and (b) a second sublayer including a second anodically tinting material, where the first and second anodically tinting materials have different compositions but each include an oxide of at least one transition metal, and where the first sublayer is disposed between the electrochromic layer and the second sublayer.

In certain implementations, each of the first and second anodically tinting materials may include the at least one transition metal and another non-alkali metal. In some such implementations, the first and second anodically tinting materials may each include nickel and tungsten. The second anodically tinting material may further include tantalum. The second anodically tinting material may further include niobium. The second anodically tinting material may further include tin. In some embodiments, the second anodically tinting material may include the at least one transition metal, the other non-alkali metal, and a second non-alkali metal, where the first anodically tinting material contains the at least one transition metal and the other non-alkali metal as its only metals. In certain cases, the first and second anodically tinting materials may each include the at least one transition metal, the other non-alkali metal, and a second non-alkali metal, where the second anodically tinting material has a higher atomic concentration of the second non-alkali metal in comparison to the first anodically tinting material.

The at least one transition metal may be selected from the group consisting of tungsten (W), tantalum (Ta), chromium (Cr), manganese (Mn), iron (Fe), cobalt (Co), nickel (Ni), rhodium (Rh), ruthenium (Ru), vanadium (V), iridium (Ir), and combinations thereof. The other non-alkali metal may be selected from the group consisting of silver (Ag), aluminum (Al), arsenic (As), gold (Ag), boron (B), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), zirconium (Zr), and combinations thereof. In certain embodiments, the other non-alkali metal may be selected from the group consisting of silver (Ag), arsenic (As), gold (Au), boron (B), cadmium (Cd), copper (Cu), europium (Eu), gallium (Ga), gadolinium (Gd), germanium (Ge), mercury (Hg), osmium (Os), lead (Pb), palladium (Pd), promethium (Pm), polonium (Po), platinum (Pt), radium (Ra), terbium (Tb), technetium (Tc), thorium (Th), thallium (Tl), and combinations thereof. In some cases, the other non-alkali metal may be selected from the group consisting of tantalum (Ta), tin (Sn), and niobium (Nb). In a particular example, the other non-alkali metal is tantalum (Ta). In another example, the other non-alkali metal is tin (Sn). In another example, the other non-alkali metal is niobium (Nb).

In some embodiments, the first and second anodically tinting materials may each include a first transition metal, a second transition metal, and oxygen, where the ratio of the first transition metal to the second transition metal is different in the first and second anodically tinting materials. In these or other embodiments, the counter electrode layer may further include a third sublayer including a third anodically tinting electrochromic material, where the first, second, and third anodically tinting materials have different compositions but each include the at least one transition metal, and where the second sublayer is disposed between the first sublayer and the third sublayer. The first anodically tinting material may include the at least one transition metal, a second transition metal, but no other transition metals, and oxygen; the second anodically tinting material may include the at least one transition metal, the second transition metal, a third transition metal, and oxygen; and the third anodically tinting material may include the at least one transition metal, the second metal, the third transition metal, and oxygen, and the second and third anodically tinting materials may have different concentrations of the third transition metal. In certain implementations, the first and second sublayers of the counter electrode layer may be in physical contact with one another. The first and second sublayers of the counter electrode layer may be separated from one another by a defect-mitigating-insulating layer in some cases, the defect-mitigating-insulating layer having an electronic resistivity of between about 1 and $5\times10^{10}$ Ohm-cm. In various embodiments, the first anodically coloring material has a first affinity for lithium and the second anodically coloring material has a second affinity for lithium, where the first affinity for lithium and the second affinity for lithium may be different.

The electrochromic device may have particular visual properties. In some embodiments, a transmitted b* value of the electrochromic device may be about 14 or lower when the electrochromic device is in its clearest state. For instance, a transmitted b* value of the electrochromic device may be about 10 or lower when the electrochromic device is in its clearest state. The visible transmittance of the electrochromic device may be at least about 55% when the electrochromic device is in its clearest state.

The counter electrode layer may have a particular overall thickness. In some embodiments, the counter electrode layer may have an overall thickness between about 50 nm and about 650 nm, for example between about 100 nm and about 400 nm, or between about 150 nm and about 300 nm. The first and second sublayers of the counter electrode layer may each have a morphology that is a mixture of amorphous and nanocrystalline phases with nanocrystallites having a diameter of less than about 50 nm. In certain cases, the second sublayer may be a defect-mitigating insulating layer having an electronic resistivity between about 1 and $5\times10^{10}$ Ohm-cm. The electrochromic device may further include a transparent conductive layer disposed on or over the electrochromic layer and the counter electrode layer. The transparent conductive layer may include a doped indium oxide.

In some embodiments, at least one of the first and second anodically tinting materials may include nickel, aluminum, and oxygen. In one example, the first anodically tinting material includes nickel, tungsten, and oxygen, and the second anodically tinting material includes nickel, aluminum, and oxygen. In certain embodiments, at least one of the first and second anodically tinting materials includes nickel, silicon, and oxygen. For example, the first anodically tinting material may include nickel, tungsten, and oxygen, and the second anodically tinting material may include nickel, silicon, and oxygen.

In another aspect of the disclosed embodiments, an electrochromic device is provided, the electrochromic device including: a substrate; an electrochromic layer disposed on or over the substrate, said electrochromic layer including a cathodically tinting electrochromic material; and an anodically tinting counter electrode layer also disposed on or over the substrate, said counter electrode layer including (a) a first sublayer including a first nickel tungsten oxide composition, and (b) a second sublayer including a second nickel tungsten oxide composition, where the first and second nickel tungsten oxide compositions have different relative amounts of nickel and/or tungsten, and where the first sublayer is disposed between the electrochromic layer and the second sublayer.

In certain implementations, the second nickel tungsten oxide composition may further include tantalum, niobium, tin, or a combination thereof. In one example, the second nickel tungsten oxide composition includes tantalum. In another example, the second nickel tungsten oxide composition includes niobium. In another example, the second nickel tungsten oxide composition includes tin. In a number of embodiments, the first nickel tungsten oxide composition may further include tantalum, where the second nickel tungsten oxide composition includes a greater concentration of tantalum than does the first nickel tungsten oxide composition. The first nickel tungsten oxide composition may further include niobium, and the second nickel tungsten oxide composition may include a greater concentration of niobium than does the first nickel tungsten oxide composition. In some cases, the first nickel tungsten oxide composition may further includes tin, and the second nickel tungsten oxide composition may include a greater concentration of tin than does the first nickel tungsten oxide composition.

The counter electrode layer may include a third sublayer. The third sublayer may include a third nickel tungsten oxide composition. The first, second, and third nickel tungsten oxide compositions may have different relative amounts of nickel and/or tungsten. The second sublayer may be disposed between the first sublayer and the third sublayer. In some embodiments, the third nickel tungsten oxide composition may further include tantalum, niobium, tin, or a combination thereof. In one example, the third nickel tungsten oxide composition includes tantalum. In another example, the third nickel tungsten oxide composition includes niobium. In another example, the third nickel tungsten oxide composition includes tin. In certain embodiments, the second and third nickel tungsten oxide compositions may each include tantalum, and the third nickel tungsten oxide composition may include a greater concentration of tantalum than does the second nickel tungsten oxide composition. In these or other embodiments, the second and third nickel tungsten oxide compositions may each include niobium, and the third nickel tungsten oxide composition may include a greater concentration of niobium than does the second nickel tungsten oxide composition. In some cases, the second and third nickel tungsten oxide compositions may each include tin, and the third nickel tungsten oxide composition may include a greater concentration of tin than does the second nickel tungsten oxide composition. In some embodiments, the counter electrode layer may include a third sublayer including a third nickel tungsten oxide composition, where the second nickel tungsten oxide composition further includes metal M1, the third nickel tungsten oxide composition further includes metal M2, and where metals M1 and M2 may be different from one another. In some such cases, the second nickel tungsten oxide composition may be substantially free of metal M2, and the third nickel tungsten oxide composition may be substantially free of metal M1.

The first sublayer of the counter electrode layer may be a flash layer having a thickness of between about 10 nm and about 80 nm. In some cases, the thickness of the flash layer may be more limited, for example between about 10 nm and about 50 nm, or between about 10 nm and about 30 nm. The first sublayer may have a particular electronic resistivity, for example between about 1 and $5\times10^{10}$ Ohm-cm. In certain embodiments, each of the first and second sublayers of the counter electrode layer may have a thickness between about 20 nm and about 200 nm. In some such cases, the thickness of the first sublayer may differ from the thickness of the second sublayer by between about 50 nm and about 200 nm.

In certain implementations, the second nickel tungsten oxide composition may include between about 2-10% atomic tantalum, and the third nickel tungsten oxide composition may include between about 5-20% atomic tantalum. In certain embodiments, the first sublayer may substantially consist of nickel tungsten oxide, the second sublayer may substantially consist of nickel tungsten tantalum oxide that is between about 2-10% atomic tantalum, and the third sublayer may substantially consist of nickel tungsten tantalum oxide that is between about 5-20% atomic tantalum. For instance, the nickel tungsten tantalum oxide in the second sublayer may be about 4% atomic tantalum, and the nickel tungsten tantalum oxide in the third sublayer may be about 8% atomic tantalum. In another example, the second nickel tungsten oxide composition may include between about 2-10% atomic niobium, and the third nickel tungsten oxide composition may include between about 5-20% atomic niobium. The first sublayer may substantially consist of nickel tungsten oxide, the second sublayer may substantially consist of nickel tungsten niobium oxide that is between about 2-10% atomic niobium, and the third sublayer may substantially consist of nickel tungsten niobium oxide that is between about 5-20% atomic niobium. For example, the nickel tungsten niobium oxide in the second sublayer may be about 4% atomic niobium, and the nickel tungsten niobium oxide in the third sublayer may be about 8% atomic niobium. In another embodiment, the second nickel tungsten oxide composition may include between about 2-10% atomic tin, and the third nickel tungsten oxide composition may include between about 5-20% atomic tin. The first sublayer may substantially consist of nickel tungsten oxide, the second sublayer may substantially consist of nickel tungsten tin oxide that is between about 2-10% atomic tin, and the third sublayer may substantially consist of nickel tungsten tin oxide that is between about 5-20% atomic tin. For example, the nickel tungsten tin oxide in the second sublayer may be about 4% atomic tin, and the nickel tungsten tin oxide in the third sublayer may be about 8% atomic tin.

In various embodiments, the second nickel tungsten oxide composition may further include a metal that is not present in the first nickel tungsten oxide composition. In certain implementations, at least one of the first and second sublayers of the counter electrode layer may include a graded composition. In a number of embodiments, the first and second sublayers of the counter electrode layer may each have a morphology that is a mixture of amorphous and nanocrystalline phases with nanocrystallites having a diameter of less than about 50 nm.

In a further aspect of the disclosed embodiments, a method of fabricating an electrochromic device is provided, the method including: depositing an electrochromic layer including a cathodically coloring electrochromic material; depositing a counter electrode layer by: depositing a first anodically tinting sublayer, and depositing a second anodically tinting sublayer, where the first anodically tinting sublayer is positioned between the electrochromic layer and the second anodically tinting sublayer, and where the first and second anodically tinting sublayers have different compositions and each include an oxide of at least one transition metal.

In certain implementations, the second anodically tinting sublayer may include one or more metals that are not present in the first sublayer. For instance, the second anodically tinting sublayer may include tantalum and the first anodically tinting sublayer may not include tantalum. In various embodiments the first anodically tinting sublayer may be substantially free of tantalum. In some examples, the second anodically tinting sublayer may include niobium and the first anodically tinting sublayer may not include niobium. In various embodiments the first anodically tinting sublayer may be substantially free of niobium. In certain implementations, the second anodically tinting sublayer may include tin and the first anodically tinting sublayer may not include tin. In various embodiments the first anodically tinting sublayer may be substantially free of tin. In some implementations, the second anodically tinting sublayer may include aluminum and the first anodically tinting sublayer may not include aluminum. The first anodically tinting sublayer may be substantially free of aluminum. In these or other cases, the second anodically tinting sublayer may include silicon and the first anodically tinting sublayer may not include silicon. The first anodically tinting sublayer may be substantially free of silicon.

In certain embodiments, depositing the counter electrode layer may further include depositing a third anodically tinting sublayer including an oxide of at least one transition metal, where the second anodically tinting sublayer is positioned between the first and third anodically tinting sublayers. In some such embodiments, the second and third anodically tinting sublayers may each include a metal that is not present in the first anodically tinting sublayer, and an atomic concentration of the metal not present in the first anodically tinting sublayer may be higher in the third anodically tinting sublayer compared to the second anodically tinting sublayer. For instance, the first anodically tinting sublayer may substantially consist of nickel tungsten oxide, the second and third anodically tinting sublayers may substantially consist of nickel tungsten tantalum oxide, and the concentration of tantalum may be higher in the third anodically tinting sublayer than in the second anodically tinting sublayer.

In some embodiments, different conditions may be used to deposit different sublayers. For instance, the first anodically tinting sublayer may be deposited at a higher rate of deposition than the second anodically tinting sublayer. In these or other cases, the first anodically tinting sublayer may be deposited at a lower sputter power than is used to deposit the second anodically tinting sublayer. In some embodiments, the first anodically tinting sublayer may be deposited at a sputter power between about 5-20 kW/m$^2$, and the second sublayer may be deposited at a sputter power between about 20-45 kW/m$^2$. In these or other implementations, a temperature of the partially fabricated electrochromic device may be lower during deposition of the first anodically tinting sublayer than during deposition of the second anodically tinting sublayer.

The method may also include lithiating one or more layers and/or sublayers. For instance, the method may further include lithiating the first anodically tinting sublayer before depositing the second anodically tinting sublayer. In one embodiment, the method further includes depositing lithium on the second anodically tinting sublayer, and then optionally depositing a third anodically tinting sublayer on the second anodically tinting sublayer. In another embodiment, the method further includes depositing a third anodically tinting sublayer on the second anodically tinting sublayer, and then depositing lithium on the third anodically tinting sublayer.

In another aspect of the disclosed embodiments, a method of fabricating an electrochromic device is provided, the method including: depositing an electrochromic layer including a cathodically coloring electrochromic material; depositing a counter electrode layer by: depositing a first anodically tinting sublayer, lithiating the first anodically tinting sublayer, and after lithiating the first anodically tinting sublayer, depositing a second anodically tinting sublayer, where the first anodically tinting sublayer is positioned between the electrochromic layer and the second anodically tinting sublayer, and where the first and second anodically tinting sublayers have different compositions and each include an oxide of at least one transition metal.

In a further aspect of the disclosed embodiments, an apparatus for fabricating an electrochromic device is provided, the apparatus including: (a) an integrated deposition system including: (i) a first deposition station including one or more first targets for depositing a layer of an electrochromic material on a substrate when the substrate is positioned in the first deposition station, (ii) a second deposition station containing one or more second targets for depositing a first sublayer of a first counter electrode material on the substrate when the substrate is positioned in the second deposition station; (iii) a third deposition station containing one or more third targets for depositing a second sublayer of a second counter electrode material on the substrate when the substrate is positioned in the third deposition station, the second counter electrode material having a different composition than the first counter electrode material; and (b) a controller including executable program instructions for passing the substrate through the first, second, and third deposition stations in a manner that sequentially deposits a stack on the substrate, the stack including the layer of electrochromic material, the first sublayer of the first counter electrode material, and the second sublayer of the second counter electrode material In certain embodiments, the one or more second targets and the one or more third targets may each include at least one pair of rotatable cylindrical targets. The controller may include executable instructions to deposit the first counter electrode material at a lower sputter power than that used to deposit the second counter electrode material. In some embodiments, the controller may include executable instructions to deposit the first counter electrode material at a sputter power between about 10-20 kW/m$^2$, and to deposit the second counter electrode material at a sputter power between about 20-45 kW/m$^2$.

These and other features and advantages of the disclosed embodiments will be described in further detail below, with reference to the associated drawings.

BRIEF DESCRIPTION OF THE DRAWINGS

The following detailed description can be more fully understood when considered in conjunction with the drawings in which:

FIGS. 9A-9E illustrate various embodiments of an integrated deposition system.

DETAILED DESCRIPTION

Electrochromic Devices

Figure 1:
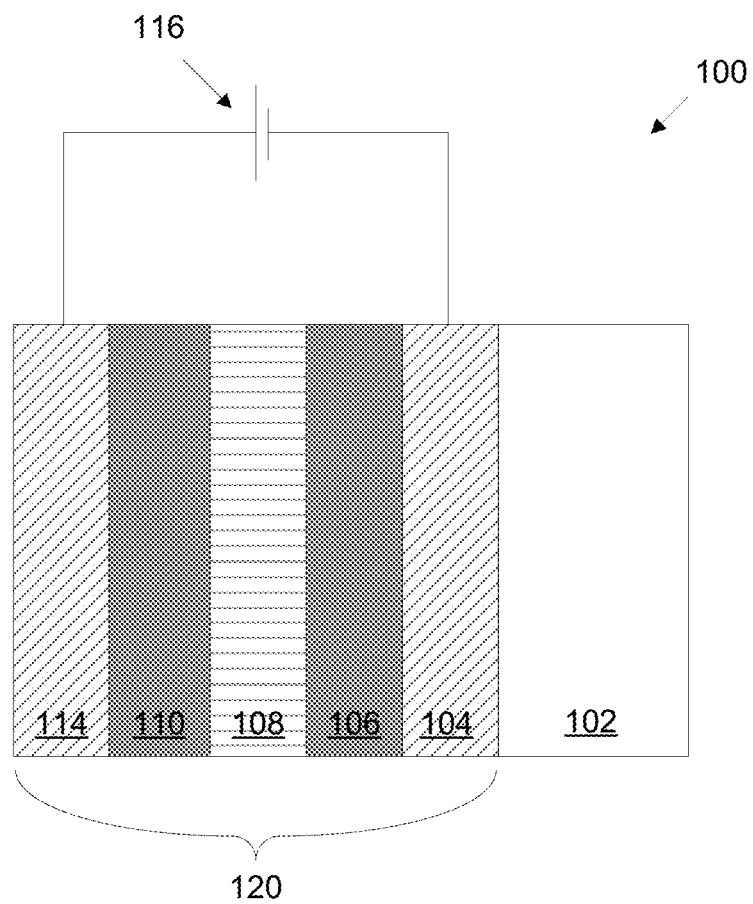
FIG. 1 is a schematic cross-section of an electrochromic device in accordance with certain embodiments.

A schematic cross-section of an electrochromic device 100 in accordance with some embodiments is shown in FIG. 1. The electrochromic device includes a substrate 102, a conductive layer (CL) 104, an electrochromic layer (EC) 106 (sometimes also referred to as a cathodically coloring layer or a cathodically tinting layer), an ion conducting layer (IC) 108, a counter electrode layer (CE) 110, and a conductive layer (CL) 114. The counter electrode layer 110 may be an anodically coloring/tinting layer and is sometimes referred to as an "ion storage" layer, because ions reside there when the electrochromic device is not tinted. Counter electrode layers are sometimes referred to herein as anodically coloring/tinting counter electrode layers, or even as an anodically coloring/tinting electrochromic layers. When counter electrode layer 110 is described as an "electrochromic" layer, it is understood that the counter electrode layer tints when driven by an anodic potential, as ions are driven out of this layer and alternatively, becomes clear and substantially transparent when driven by a cathodic potential as the ions are re-intercalated. Elements 104, 106, 108, 110, and 114 are collectively referred to as an electrochromic stack 120. A voltage source 116 operable to apply an electric potential across the electrochromic stack 120 effects the transition of the electrochromic device from, e.g., a clear state to a tinted state. In other embodiments, the order of layers is reversed with respect to the substrate. That is, the layers are in the following order: substrate, conductive layer, counter electrode layer, ion conducting layer, electrochromic material layer, conductive layer. The conductive layers are generally transparent conductive layers, though in reflective devices a conductive layer may be reflective, such as a metal layer.

It should be understood that the reference to a transition between a clear state and tinted state is non-limiting and suggests only one example, among many, of an electrochromic transition that may be implemented. Unless otherwise specified herein, whenever reference is made to a clear-tinted transition, the corresponding device or process encompasses other optical state transitions such as non-reflective-reflective, transparent-opaque, etc. Further the terms "clear" and "bleached" refer to an optically neutral state, e.g., untinted, transparent or translucent. Still further, unless specified otherwise herein, the "color" or "tint" of an electrochromic transition is not limited to any particular wavelength or range of wavelengths. As understood by those of skill in the art, the choice of appropriate electrochromic and counter electrode materials governs the relevant optical transition. In various embodiments herein, a counter electrode is deposited to include a heterogeneous composition and/or morphology. For instance, the counter electrode may include two or more sublayers in some cases, the sublayers having different compositions and/or morphologies. In these or other cases, the entire counter electrode or a sublayer of a counter electrode may include a gradient in composition. While FIG. 1 shows the counter electrode layer 110 as a simple layer, it should be understood that various embodiments herein utilize a counter electrode layer that is not homogeneous.

In certain embodiments, the electrochromic device reversibly cycles between a clear state and a tinted state. In the clear state, a potential is applied to the electrochromic stack 120 such that available ions in the stack that can cause the electrochromic material 106 to be in the tinted state reside primarily in the counter electrode 110. When the potential on the electrochromic stack is reversed, the ions are transported across the ion conducting layer 108 to the electrochromic material 106 and cause the material to enter the tinted state.

In certain embodiments, all of the materials making up electrochromic stack 120 are inorganic, solid (i.e., in the solid state), or both inorganic and solid. Because organic materials tend to degrade over time, inorganic materials offer the advantage of a reliable electrochromic stack that can function for extended periods of time. Materials in the solid state also offer the advantage of not having containment and leakage issues, as materials in the liquid state often do. Each of the layers in the electrochromic device is discussed in detail, below. It should be understood that any one or more of the layers in the stack may contain some amount of organic material, but in many implementations one or more of the layers contains little or no organic matter. The same can be said for liquids that may be present in one or more layers in small amounts. It should also be understood that solid state material may be deposited or otherwise formed by processes employing liquid components such as certain processes employing sol-gels or chemical vapor deposition.

Referring again to FIG. 1, voltage source 116 is typically a low voltage electrical source and may be configured to operate in conjunction with radiant and other environmental sensors. Voltage source 116 may also be configured to interface with an energy management system, such as a computer system that controls the electrochromic device according to factors such as the time of year, time of day, and measured environmental conditions. Such an energy management system, in conjunction with large area electrochromic devices (i.e., an electrochromic window), can dramatically lower the energy consumption of a building.

Any material having suitable optical, electrical, thermal, and mechanical properties may be used as substrate 102. Such substrates include, for example, glass, plastic, and mirror materials. Suitable plastic substrates include, for example acrylic, polystyrene, polycarbonate, allyl diglycol carbonate, SAN (styrene acrylonitrile copolymer), poly(4-methyl-1-pentene), polyester, polyamide, etc. If a plastic substrate is used, it may be barrier protected and abrasion protected using a hard coat of, for example, a diamond-like protection coating, a silica/silicone anti-abrasion coating, or the like, such as is well known in the plastic glazing art. Suitable glasses include either clear or tinted soda lime glass, including soda lime float glass. The glass may be tempered or untempered. In some embodiments of electrochromic device 100 with glass, e.g., soda lime glass, used as substrate 102, there is a sodium diffusion barrier layer (not shown) between substrate 102 and conductive layer 104 to prevent the diffusion of sodium ions from the glass into conductive layer 104. The substrate may also include alkali (e.g., sodium) free fusion glass, such as Gorilla Glass™, Willow Glass™ and similar commercially available products from Corning Incorporated of Corning, New York. If such alkali free substrates are used, then no diffusion barrier is necessary, though optical tuning layers may be used between the substrate and the electrochromic device, in order to optimize color and reflectance properties of e.g., the window.

In some embodiments, the optical transmittance (i.e., the ratio of transmitted radiation or spectrum to incident radiation or spectrum) of substrate 102 is about 40 to 95%, e.g., about 90-92%. The substrate may be of any thickness, as long as it has suitable mechanical properties to support the electrochromic stack 120. While the substrate 102 may be of any size, in some embodiments, it is about 0.01 mm to 10 mm thick, in some cases between about 3 mm to 9 mm thick.

In some embodiments, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least 20 inches by 20 inches, and can be much larger, e.g., as large as about 72 inches by 120 inches. Architectural glass is typically at least about 2 mm thick. Architectural glass that is less than about 3.2 mm thick cannot be tempered. In some embodiments with architectural glass as the substrate, the substrate may still be tempered even after the electrochromic stack has been fabricated on the substrate. In some embodiments with architectural glass as the substrate, the substrate is a soda lime glass from a tin float line.

On top of substrate 102 is conductive layer 104. In certain embodiments, one or both of the conductive layers 104 and 114 is inorganic and/or solid. Conductive layers 104 and 114 may be made from a number of different materials, including conductive oxides, thin metallic coatings, conductive metal nitrides, and composite conductors. Typically, conductive layers 104 and 114 are transparent at least in the range of wavelengths where electrochromism is exhibited by the electrochromic layer. Transparent conductive oxides include metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide and the like.

Since oxides are often used for these layers, they are sometimes referred to as "transparent conductive oxide" (TCO) layers. The function of the conductive layers is to spread an electric potential provided by voltage source 116 over surfaces of the electrochromic stack 120 to interior regions of the stack, with very little ohmic potential drop. Further details and examples related to TCO layers are provided in U.S. patent application Ser. No. 12/645,111, filed Dec. 22, 2009, and titled "FABRICATION OF LOW DEFECTIVITY ELECTROCHROMIC DEVICES," which is herein incorporated by reference in its entirety Overlaying conductive layer 104 is cathodically coloring layer 106 (also referred to as electrochromic layer 106). In certain embodiments, electrochromic layer 106 is inorganic and/or solid, in typical embodiments inorganic and solid. The electrochromic layer may contain any one or more of a number of different cathodically coloring electrochromic materials, including metal oxides. Such metal oxides include tungsten oxide ($WO_3$), molybdenum oxide ($MoO_3$), niobium oxide ($Nb_2O_5$), titanium oxide ($TiO_2$), vanadium oxide ($V_2O_5$), tantalum oxide ($Ta_2O_5$), and the like. In some embodiments, the metal oxide is doped with one or more dopants such as lithium, sodium, potassium, molybdenum, vanadium, titanium, and/or other suitable metals or compounds containing metals. Mixed oxides (e.g., W—Mo oxide, W—V oxide) are also used in certain embodiments. A cathodically coloring electrochromic layer 106 comprising a metal oxide is capable of receiving ions transferred from an anodically coloring counter electrode layer 110. Further details related to cathodically coloring electrochromic layers are provided in U.S. patent application Ser. No. 12/645,111, incorporated by reference above.

Generally, in cathodically coloring electrochromic materials, the colorization/tinting (or change in any optical property—e.g., absorbance, reflectance, and transmittance) of the electrochromic material is caused by reversible ion insertion into the material (e.g., intercalation) and a corresponding injection of a charge balancing electron. Typically some fraction of the ion responsible for the optical transition is irreversibly bound up in the electrochromic material. As explained below, some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}(0<y\leq\sim 0.3)$) causes the tungsten oxide to change from transparent (clear state) to blue (tinted state).

Referring again to FIG. 1, in electrochromic stack 120, ion conducting layer 108 overlays electrochromic layer 106. In certain embodiments, this ion conducting layer 108 is omitted during deposition of the layers in the stack, and the cathodically coloring electrochromic layer 106 is deposited in direct physical contact with the anodically coloring counter electrode layer 110. An interfacial region where the cathodically coloring electrochromic layer 106 meets the anodically coloring counter electrode layer 110 may form as a result of particular processing steps, thereby allowing the interfacial region to act as an ion conducting layer in a finished device.

Ion conducting layer 108 serves as a medium through which ions are transported (in the manner of an electrolyte) when the electrochromic device transforms between the clear state and the tinted state. In various cases, ion conducting layer 108 is highly conductive to the relevant ions for the electrochromic and the counter electrode layers, but has sufficiently low electron conductivity that negligible electron transfer takes place during normal operation. A thin ion conducting layer (also sometimes referred to as an ion conductor layer) with high ionic conductivity permits fast ion conduction and hence fast switching for high performance electrochromic devices. In certain embodiments, the ion conducting layer 108 is inorganic and/or solid. When fabricated from a material and in a manner that produces relatively few defects, the ion conductor layer can be made very thin to produce a high performance device. In various implementations, the ion conductor material has an ionic conductivity of between about $10^8$ Siemens/cm or $ohm^{-1}cm^{-1}$ and about $10^9$ Siemens/cm or $ohm^{-1}cm^{-1}$ and an electronic resistance of about $10^{11}$ ohms-cm.

In other embodiments, the ion conductor layer may be omitted. In such embodiments, no separate ion conductor material is deposited when forming an electrochromic stack for an electrochromic device. Instead, in these embodiments the cathodically coloring electrochromic material may be deposited in direct physical contact with the anodically coloring counter electrode material. One or both of the anodically coloring and cathodically coloring materials may be deposited to include a portion that is oxygen rich compared to the remaining portion of the material.

Typically, the oxygen rich portion is in contact with the other type of layer. For instance, an electrochromic stack may include an anodically coloring material in contact with a cathodically coloring material, where the cathodically coloring material includes an oxygen-rich portion in direct physical contact with the anodically coloring material. In another example, an electrochromic stack includes an anodically coloring material in contact with a cathodically coloring material, where the anodically coloring material includes an oxygen-rich portion in direct physical contact with the cathodically coloring material. In a further example, both the anodically coloring material and the cathodically coloring material include an oxygen-rich portion, where the oxygen-rich portion of the cathodically coloring material is in direct physical contact with the oxygen-rich portion of the anodically coloring material.

The oxygen-rich portions of these layers may be provided as distinct sublayers (e.g., a cathodically or anodically coloring material includes an oxygen-rich sublayer and a less-oxygen-rich sublayer). The oxygen-rich portion of the layers may also be provided in a graded layer (e.g., the cathodically or anodically coloring material may include a gradient in oxygen concentration, the gradient being in a direction normal to the surface of the layers). Embodiments where the ion conductor layer is omitted and the anodically coloring counter electrode material is in direct contact with the cathodically coloring electrochromic material are further discussed in the following U.S. patents, each of which is herein incorporated by reference in its entirety: U.S. Pat. Nos. 8,300,298, and 8,764,950.

On top of ion conducting layer 108 (when present) is anodically coloring layer 110 (also referred to as counter electrode layer 110). In various embodiments here, the counter electrode layer is deposited to include a heterogeneous structure. The structure may be heterogeneous with respect to composition and/or morphology. Further details of the disclosed counter electrode structures and compositions are provided below. In some embodiments, counter electrode layer 110 is inorganic and/or solid. The counter electrode layer may comprise one or more of a number of different materials that are capable of serving as reservoirs of ions when the electrochromic device is in the clear state. During an electrochromic transition initiated by, e.g., application of an appropriate electric potential, the anodically coloring counter electrode layer transfers some or all of the ions it holds to the cathodically coloring electrochromic layer, changing the electrochromic layer to the tinted state. Concurrently, the counter electrode layer tints with the loss of ions.

In various embodiments, one or more defect mitigating insulating layers (DMILs) may be provided. Such DMILs may be provided between the layers described in FIG. 1, or within such layers. In some particular embodiments a DMIL may be provided between sublayers of a counter electrode layer, though DMILs can also be provided at alternative or additional locations. DMILs can help minimize the risk of fabricating defective devices. In certain embodiments, the insulating layer has an electronic resistivity of between about 1 and $5\times10^{10}$ Ohm-cm. In certain embodiments, the insulating layer contains one or more of the following metal oxides: cerium oxide, titanium oxide, aluminum oxide, zinc oxide, tin oxide, silicon aluminum oxide, tungsten oxide, nickel tungsten oxide, tantalum oxide, and oxidized indium tin oxide. In certain embodiments, the insulating layer contains a nitride, carbide, oxynitride, or oxycarbide such as nitride, carbide, oxynitride, or oxycarbide analogs of the listed oxides. As an example, the insulating layer includes one or more of the following metal nitrides: titanium nitride, aluminum nitride, silicon nitride, and tungsten nitride. The insulating layer may also contain a mixture or other combination of oxide and nitride materials (e.g., a silicon oxynitride). DMILs are further described in U.S. Pat. No. 9,007,674, incorporated by reference above.

The electrochromic devices in embodiments herein are also scalable to substrates smaller or larger than architectural glass. An electrochromic stack can be deposited onto substrates that are a wide range of sizes, up to about 12 inches by 12 inches, or even 80 inches by 120 inches.

In some embodiments, electrochromic glass is integrated into an insulating glass unit (IGU). An insulating glass unit consists of multiple glass panes assembled into a unit, generally with the intention of maximizing the thermal insulating properties of a gas contained in the space formed by the unit while at the same time providing clear vision through the unit. Insulating glass units incorporating electrochromic glass would be similar to insulating glass units currently known in the art, except for electrical leads for connecting the electrochromic glass to voltage source. Due to the higher temperatures (due to absorption of radiant energy by an electrochromic glass) that electrochromic insulating glass units may experience, more robust sealants than those used in conventional insulating glass units may be necessary. For example, stainless steel spacer bars, high temperature polyisobutylene (PIB), new secondary sealants, foil coated PIB tape for spacer bar seams, and the like. In certain cases the electrochromic glass may be incorporated into a laminate; the laminate may be a stand-alone construct or incorporated into an IGU as one of the panes of the IGU.

Counter Electrode Layer

In a number of embodiments herein, the anodically coloring counter electrode layer is heterogeneous in composition or a physical feature such as morphology. Such heterogeneous counter electrode layers may exhibit improved color, switching behavior, lifetime, uniformity, process window, etc.

In certain embodiments, the counter electrode layer includes two or more sublayers, where the sublayers have different compositions and/or morphologies. One or more of such sublayers may also have a graded composition. The composition and/or morphology gradient may have any form of transition including a linear transition, a sigmoidal transition, a Gaussian transition, etc. A number of advantages can be realized by providing the counter electrode as two or more sublayers. For instance, the sublayers may be different materials that have complimentary properties. One material may promote better color quality while another material promotes high quality, long lifetime switching behavior. The combination of materials may promote a high degree of film quality and uniformity while at the same time achieving a high rate of deposition (and therefore throughput). Some of the approaches outlined herein may also promote better control of the lithium distribution throughout the electrochromic device, and in some cases may lead to improvements in morphology in the counter electrode (e.g., higher transmission) and the overall reduction of defects in the electrochromic device. Another benefit that may result from various embodiments herein is the availability of one or more intermediate states. Differences in electrical potentials between various sublayers may allow for lithium to reside in discrete locations (e.g., within particular sublayers to particular degrees), thereby enabling the electrochromic device to achieve intermediate tint states between e.g., a fully tinted device and a fully clear device. In some cases, intermediate states can be achieved by applying different voltages to the device. The inclusion of multiple sub-layers within the counter electrode layer may reduce or eliminate the need to apply different voltages to achieve different intermediate tint states. These and other benefits of the disclosed embodiments are further described below.

In some cases, a counter electrode includes a first sublayer of a first anodically coloring counter electrode material and one or more additional sublayers of a second anodically coloring counter electrode material. In various cases, the first sublayer of the CE layer may be situated closer to the cathodically coloring electrochromic material than the second (and optional additional) sublayer(s) of the CE layer. In some implementations, the first sublayer is a flash layer, which is generally characterized as a thin and often quickly deposited layer typically having a thickness of not greater than about 100 nm, in various cases not greater than about 80 nm. A flash layer may be between about 5 nm thick and about 100 nm thick, between about 10 nm thick and about 80 nm thick, or between about 10 nm thick and about 50 nm thick, or about 10 nm and about 30 nm thick. In some other cases, a separate flash layer (which may be an anodically coloring counter electrode material) may be provided between the electrochromic layer and the first sublayer of the counter electrode. In some embodiments, a flash layer may be provided between the second sublayer and the transparent conductor layer. A flash layer, if present, may or may not exhibit electrochromic properties. In certain embodiments, a flash layer is made of a counter electrode material that does not change color with remaining electrochromic/counter electrode layers (though this layer may have a composition that is very similar to other layers such as an anodically coloring layer). In some embodiments, the first sublayer, whether a flash layer or thicker than a flash layer, has a relatively high electronic resistivity, for example between about 1 and $5\times10^{10}$ Ohm-cm.

Generally speaking, the first and second anodically coloring counter electrode materials may each, independently, be any anodically coloring counter electrode material. The first and/or second counter electrode materials may be binary metal oxides (e.g., oxides that include two metals in addition to lithium or other transported ion, NiWO being one example), ternary metal oxides (e.g., oxides that include three metals, NiWTaO being one example), or even more complex materials. In many cases the materials also include lithium, which to a certain extent may be mobile within the device. Particular examples of anodically coloring counter electrode materials are provided below. As used herein, the term metal is intended to include metals and metalloids (e.g., B, Si, Ge, As, Sb, Te, and Po).

In some embodiments, the first anodically coloring material may include at least one transition metal selected from the group consisting of chromium (Cr), manganese (Mn), iron (Fe), cobalt (Co), nickel (Ni), rhodium (Rh), ruthenium (Ru), vanadium (V), and iridium (Ir). The first anodically coloring material may include at least one or more additional metals (in many cases at least one non-alkali metal) in addition to one or more of the transition metals just listed. The additional metal may in some embodiments be selected from the group consisting of silver (Ag), aluminum (Al), arsenic (As), gold (Ag), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), zirconium (Zr), and combinations thereof.

In these or other embodiments, the second anodically coloring material may be the first anodically coloring material doped or otherwise combined with one or more additional elements. The additional element(s) may include at least one a non-alkali metal in various cases. In some embodiments, the one or more additional element is selected from the group consisting of: silver (Ag), aluminum (Al), arsenic (As), gold (Ag), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), zirconium (Zr), and combinations thereof. In certain embodiments, the additional element(s) may include at least one element selected from the group consisting of tantalum, tin, niobium, zirconium, silicon, aluminum, and combinations thereof. While the additional element in the second anodically coloring material may be a dopant, this is not necessarily the case. In some compositions, the additional element forms a compound or salt with other elements of the material.

In a particular example, the first anodically coloring material is NiWO. In these or other examples, the second anodically coloring material may be NiWO that is doped with or otherwise includes an additional metal (e.g., a non-alkali metal, a transition metal, a post-transition metal, or a metalloid in certain cases), with the additional metal being selected from the list presented above, with one example material being NiWTaO. Other examples for the second anodically coloring material where the first anodically coloring material is NiWO include, but are not limited to, NiWSnO, NiWNbO, NiWZrO, NiWAlO, and NiWSiO. In some similar embodiments, the first anodically coloring material may be NiWO and the second anodically coloring material may be nickel oxide that is doped with or otherwise includes an additional metal (e.g., a non-alkali metal, a transition metal, a post-transition metal, or a metalloid in certain cases), with the additional metal being selected from the list presented above. Example materials for the second anodically coloring material include, but are not limited to, NiTaO, NiSnO, NiNbO, NiZrO, NiAlO, NiSiO, and combinations thereof. In one example, the second anodically coloring material may be selected from the group consisting of NiTaO, NiSnO, NiNbO, NiAlO, NiSiO, and combinations thereof. In another example, the second anodically coloring material may be selected from the group consisting of NiAlO and NiSiO.

In some embodiments, the first and second anodically coloring materials contain the same elements, but in different proportions. For example, both materials may contain Ni, W, and Ta, but two or three of the elements in present in different mass or atomic ratios. Examples below further illustrate this option.

In some other embodiments, the first and second sublayers may be more significantly different from one another compositionally. For instance, the first and second sublayers (and any additional sublayers) may each be any anodically coloring material, regardless of the composition of the other sublayers. As noted, additional examples of anodically coloring materials are provided below.

The two or more sublayers may have different physical properties. In various cases, a material used in one or more of the sublayers is a material that would not perform well (e.g., would exhibit poor color quality, poor lifetime performance, slow switching speed, slow deposition rate, etc.) as a counter electrode material if provided without the accompanying sublayer(s).

Figure 2:
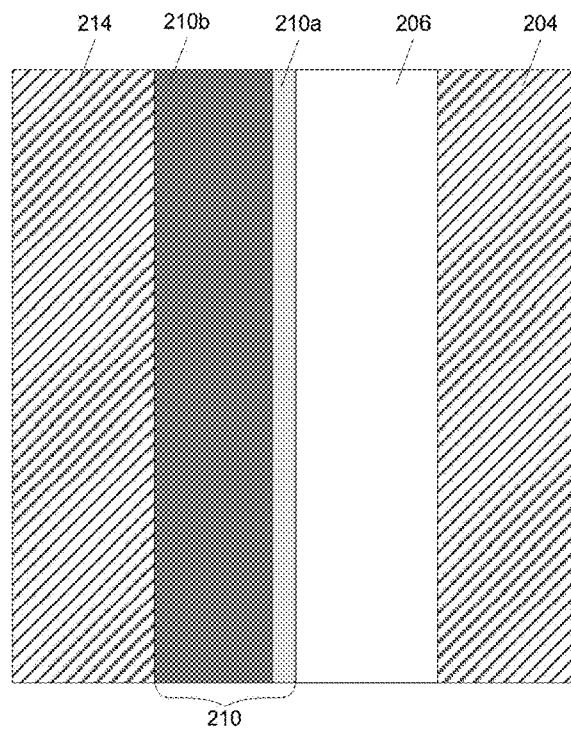
FIG. 2 is a schematic cross-section of an electrochromic device where the counter electrode layer includes two sublayers according to certain embodiments.

FIG. 2 provides a cross sectional view of an electrochromic stack, as deposited, according to one embodiment. The stack includes transparent conductive oxide layers 204 and 214. In contact with transparent conductive oxide layer 204 is a cathodically coloring electrochromic layer 206. In contact with transparent conductive oxide layer 214 is anodically coloring counter electrode layer 210, which includes two sublayers 210a and 210b. The first sublayer 210a of the counter electrode is in contact with the electrochromic layer 206, and the second sublayer 210b is in contact with the transparent conductive oxide layer 214. In this embodiment, no separate ion conductor layer is deposited (though an interfacial region serving as an ion conductor layer may be formed in situ from this construct as described in more detail herein).

The first and second sublayers 210a and 210b of the anodically coloring counter electrode layer 210 may have different compositions and/or morphologies. In various examples, the second sublayer 210b includes at least one metal and/or metal oxide that is not present in the first sublayer 210a. In a particular example, the first sublayer 210a is NiWO and the second sublayer 210b is NiWO doped or otherwise combined with another metal (e.g., NiWTaO, NiWSnO, NiWNbO, NiWZrO, NiWAlO, NiWSiO, etc.). In another example, the first sublayer 210a is NiWO and the second sublayer 210b is nickel oxide (NiO) doped or otherwise combined with another metal (e.g., NiTaO, NiSnO, NiNbO, NiZrO, NiAlO, NiSiO, etc.). In another embodiment, the first and second sublayers 210a and 210b include the same elements at different relative concentrations.

In some embodiments, the first sublayer 210a is a flash layer. Flash layers are typically thin layers (and as such they are typically, but not necessarily, deposited relatively quickly). In some embodiments, a first sublayer of an anodically coloring counter electrode is a flash layer that is between about 5 nm thick and about 100 nm thick, between about 10 nm thick and about 80 nm thick, between about 10 nm thick and about 50 nm thick, or about 10 nm and about 30 nm thick.

The thickness of the flash layer (or other counter electrode sublayer that is not deposited as a flash layer) may depend upon the materials chosen for the various sublayers. One consideration that may affect the maximum thickness of each sublayer is the color qualities of each sublayer in comparison to the color qualities of the remaining sublayers. In a number of cases, the remaining sublayers will have superior color performance (e.g., a less yellow clear state) compared to the first sublayer/flash layer. In a particular example, a NiWTaO sublayer has superior color performance compared to a NiWO sublayer (which may be deposited as a flash layer). As such, it is desirable for a NiWO sublayer to be relatively thin to achieve a desired overall color performance in the device, e.g., a thin flash layer of NiWO will have less yellow color than a thicker NiWO layer.

One competing concern related to the thickness of each sublayer is the relative deposition rates of the materials in the sublayers. In a number of embodiments, the first sublayer/flash layer may be a material that deposits at a higher deposition rate than the material of the remaining sublayers. Similarly, a first sublayer/flash layer may be deposited at a lower power than the remaining sublayers. These factors make it advantageous to use relatively thicker first sublayers, to thereby achieve a higher throughput and/or reduce the amount of power used. These concerns are balanced with those described above to select appropriate sublayer thicknesses.

The remaining sublayer(s) may be thicker than the first sublayer 210a in many embodiments. In certain embodiments where the counter electrode layer 210 includes two sublayers such as 210a and 210b, the second sublayer 210b may be between about 20 nm and about 300 nm thick, for example between about 150 nm and about 250 nm thick, or between about 125 nm and about 200 nm thick.

Figure 4A:
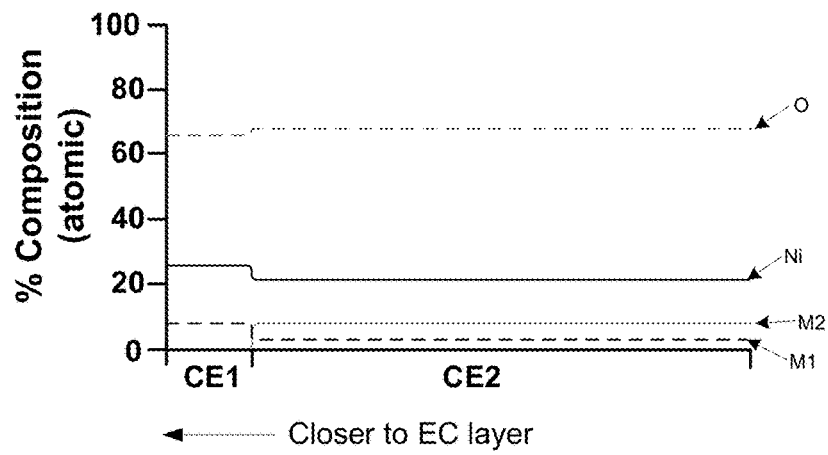
FIGS. 4A-4I show graphs illustrating the composition of one or more layers in an electrochromic device according to various embodiments.

In certain embodiments, the second sublayer 210b is homogeneous with respect to composition. FIG. 4A presents a graph showing the concentration of various elements present in the first and second sublayers 210a and 210b of FIG. 2 in a particular embodiment where the first sublayer is NiM1O and the second sublayer is compositionally homogeneous NiM1M2O. The first sublayer 210a is labeled CE1 and the second sublayer 210b is labeled CE2. In this example, the first sublayer has a composition that is about 25% nickel, about 8% M1, and about 66% oxygen, and the second sublayer has a composition that is about 21% nickel, about 3% M1, about 68% oxygen, and about 8% M2. M2 may be a metal in various embodiments.

In other embodiments, the second sublayer 210b may include a graded composition. The composition may be graded with respect to the relative concentration of a metal therein. For instance, in some cases the second sublayer 210b has a graded composition with respect to a metal that is not present in the first sublayer. In one particular example, the first sublayer is NiWO and the second sublayer is NiWTaO, where the concentration of tantalum is graded throughout the second sublayer. The relative concentrations of the remaining elements (excluding the tantalum) may be uniform throughout the second sublayer, or they may also change throughout this sublayer. In a particular example, the concentration of oxygen may also be graded within the second sublayer 210b (and/or within the first sublayer 210a).

Figure 4B:
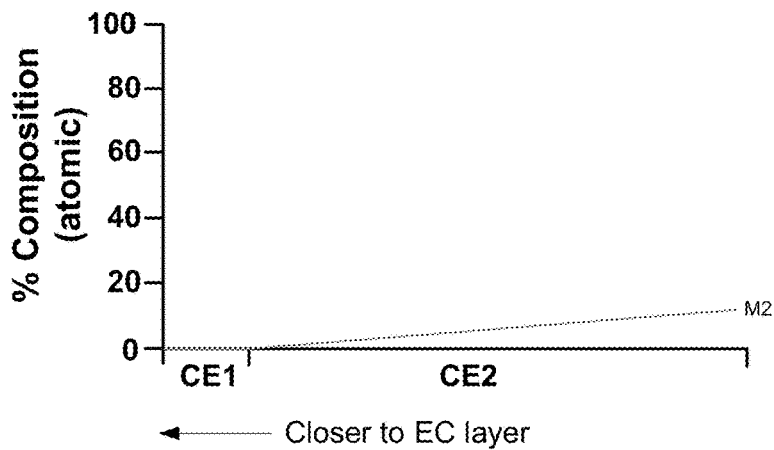

FIG. 4B presents a graph showing the concentration of M2 present in the first and second sublayers 210a and 210b of FIG. 2 in a particular embodiment where the first sublayer is NiM1O and the second sublayer is a graded layer of NiM1M2O. As with FIG. 4A, the first sublayer 210a is labeled CE1 and the second sublayer is labeled CE2. In this example, the concentration of M2 increases across the thickness of the second sublayer, to a value of about 15% (atomic) at the face of the second sublayer furthest away from the EC layer. The other elements are omitted from the figure; though in one embodiment, they reflect the compositions substantially as described in relation to FIG. 4A or 4D, adjusted as appropriate to accommodate the changing M2 concentration. In certain embodiments the concentration of M2 decreases across the thickness of the second sublayer, that is, the concentration of M2 is highest at the face of the second sublayer nearest the EC layer and decreases, reaching a minimum concentration at the face of the second sublayer furthest away from the EC layer. In yet another embodiment, the concentration of M2 is highest at an intermediate region across the thickness of the second sublayer, that is, the concentration of M2 is highest e.g., in the center of the second sublayer and decreases across the second sublayer toward both faces of the second sublayer. In this embodiment, the concentration of M2 at the faces of the second sublayer are not necessarily the same.

Figure 4C:
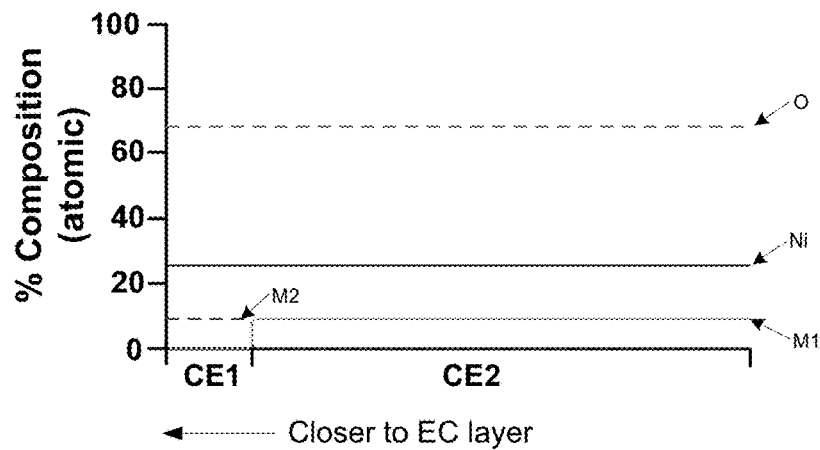

In certain embodiments, the first and second sublayers may have compositions that are more different from one another. FIG. 4C presents a graph showing the concentration of various elements present in the first and second sublayers 210a and 210b of FIG. 2 in an embodiment where the first sublayer is NiM1O and the second sublayer is NiM2O. In a particular case, M1 is tungsten and M2 is vanadium, though other metals and materials may also be used. While FIG. 4C shows the concentration of oxygen and nickel remaining constant throughout both sublayers of the counter electrode layer, this is not always the case. The particular compositions described with respect to FIGS. 4A-4C are merely provided as examples and are not intended to be limiting. Different materials and concentrations/compositions may also be used.

Figure 3:
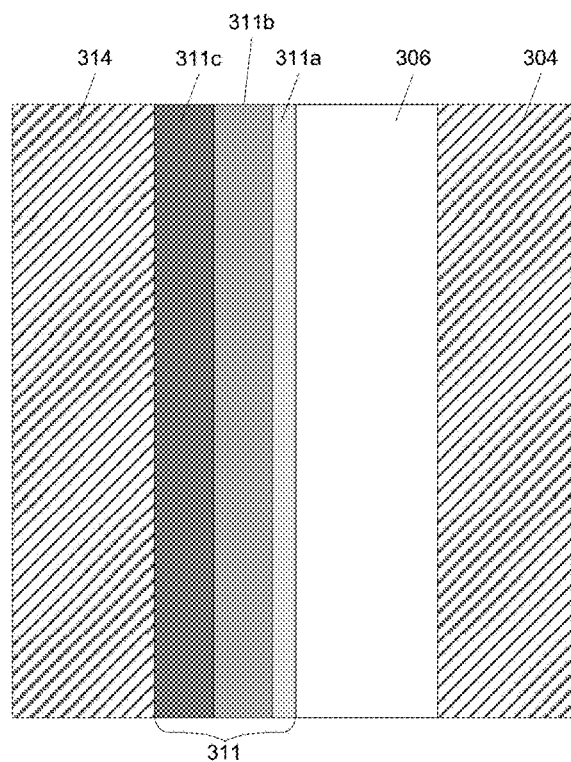
FIG. 3 is a schematic cross-section of an electrochromic device where the counter electrode layer includes three sublayers according to certain embodiments.

FIG. 3 shows an additional example of an electrochromic stack similar to that shown in FIG. 2. The stack in FIG. 3 includes transparent conductive oxide layers 304 and 314, cathodically coloring electrochromic layer 306, and anodically coloring counter electrode layer 311. Here, counter electrode layer 311 is made of three sublayers 311a-c. The first sublayer 311a may be a flash layer as described above with respect to the first sublayer 210a of FIG. 2. Each of the sublayers 311a-c may have a different composition. The second and third sublayers 311b and 311c may include the same elements at different relative concentrations in some embodiments. In another embodiment, all of the sublayers 311a-c include the same elements at different relative concentrations. There may be an IC layer (not shown in FIG. 3) between the electrochromic layer 306 and the counter electrode layers 311.

In one example, the first sublayer 311a is a first anodically coloring counter electrode material, and the second and third sublayers 311b and 311c are a second anodically coloring counter electrode material (each deposited at a different composition). The composition of the second and third sublayers 311b and 311c may be homogeneous within each sublayer.

Figure 4D:
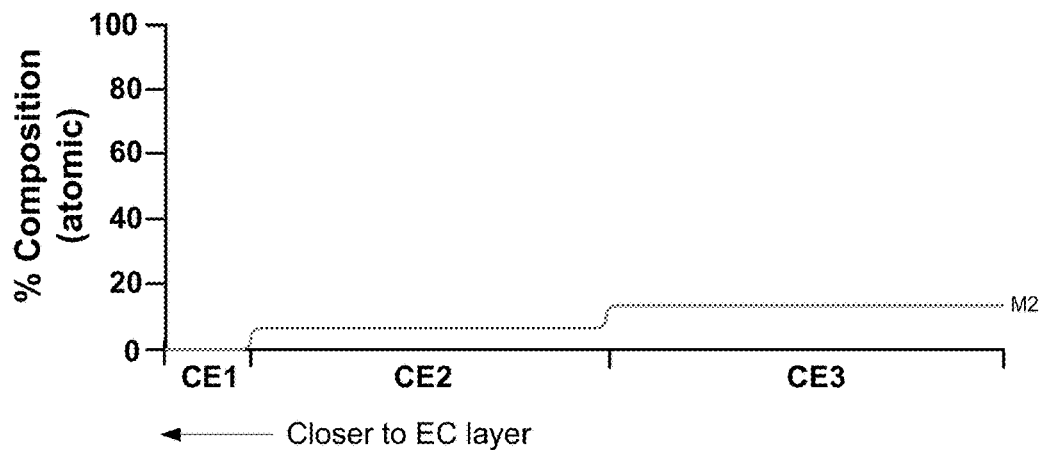

FIG. 4D presents a graph showing the concentration of M2 present in the first, second, and third sublayers 311a-c of FIG. 3 where the first sublayer is NiM1O and the second and third sublayers are different compositions of homogeneous NiM1M2O. The first sublayer is labeled CE1, the second sublayer is labeled CE2, and the third sublayer is labeled CE3. The other elements (M1, Ni, and O) are omitted from FIG. 4D. In one embodiment, these elements reflect the compositions substantially as described in relation to FIG. 4A or 4C, adjusted as appropriate for the changing concentration of M2. In a related embodiment, the concentration of M2 may be lower in the third sublayer than in the second sublayer.

Figure 4E:
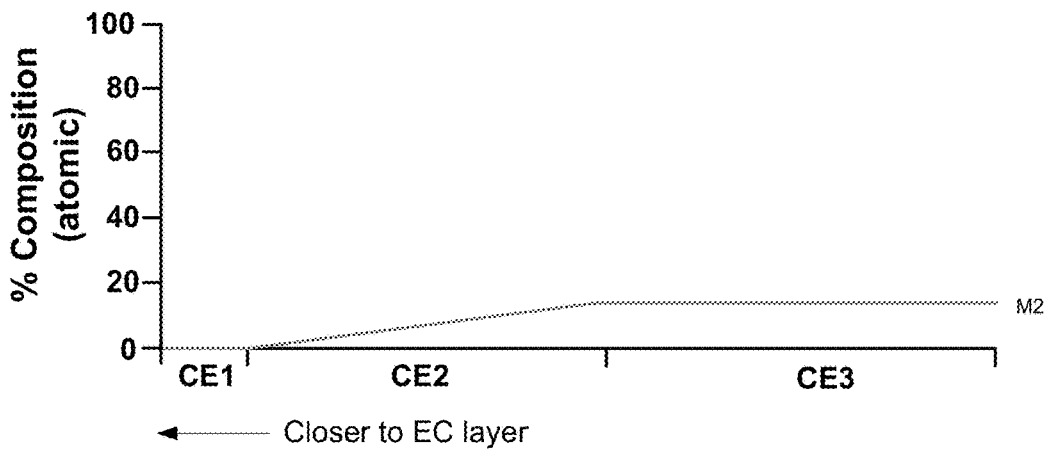

In other cases, the composition within one or more of the second and third sublayers 311b and 311c may be graded, for example with respect to the concentration of a metal (in some cases a metal that is not present in the first sublayer 311a). FIG. 4E presents a graph showing the concentration of M2 present in the first, second, and third sublayers 311a-c of FIG. 3 where the first sublayer (CE1) is NiM1O, the second sublayer (CE2) is NiM1M2O with a graded composition of M2, and the third sublayer (CE3) is compositionally homogeneous NiM1M2O. The other elements (M1, Ni, and O) are omitted from FIG. 4E. In one embodiment, these elements reflect the compositions substantially as described in relation to FIG. 4A or 4C, adjusted as appropriate to accommodate the changing concentration of M2. In a related embodiment, the composition may be graded in the opposite direction. For example, the concentration of M2 may decrease throughout the second sublayer instead of increasing (when moving from CE1 to CE3).

As noted, in some implementations the second anodically coloring counter electrode material may be the first counter electrode material with an additional metal. In a particular embodiment, the concentration of this additional metal is lower in the second sublayer 311b and higher in the third sublayer 311c. In a particular example, the first sublayer 311a is NiWO, the second sublayer 311b is NiWTaO, the third sublayer 311c is NiWTaO, and the concentration of tantalum is higher in the third sublayer 311c than in the second sublayer 311b. In a similar example, the first sublayer 311a is NiWO, the second and third sublayers 311b and 311c are NiWSnO, and the concentration of tin is higher in the third sublayer 311c than in the second sublayer 311b. Numerous anodically coloring materials and combinations of materials can be used. In a different embodiment, the concentration of the additional metal may be higher in the second sublayer than in the third sublayer. These trends (increasing or decreasing concentration of the additional metal) may continue for any number of sublayers.

With reference to FIG. 2, in another example, the first sublayer 210a is NiWO, and the second sublayer 210b is NiAlO or NiWAlO. In another example, the first sublayer 210a is NiWO, and the second sublayer 210b is NiSiO or NiWSiO. With reference to FIG. 3, in one example the first sublayer 311a is NiWO, the second sublayer 311b is NiAlO, the third sublayer 311c is NiAlO, and the concentration of aluminum is higher (or lower) in the third sublayer 311c than in the second sublayer 311b. In another example, the first sublayer 311a is NiWO, the second sublayer 311b is NiSiO, the third sublayer 311c is NiSiO, and the concentration of silicon is higher (or lower) in the third sublayer 311c than in the second sublayer 311b. As noted above, the trends in the concentration of the additional (or different) metal (e.g., aluminum or silicon in these examples) may continue for any number of sublayers.

In some cases, the concentration (atomic %) of the additional metal in the third sublayer 311c is at least 1.2× the concentration of the additional metal in the second sublayer 311b. For instance, the concentration of the additional metal in the third sublayer 311c may be at least about 1.5×, or at least about 2×, or at least about 2.5× the concentration of the additional metal in the second sublayer 311b. In some embodiments, more than one additional metal not present in the first sublayer 311a may be provided in the second and/or third sublayers 311b/311c. In some particular embodiments, the third sublayer 311c may include another additional material (e.g., a metal or another element) that is not present in either the first or second sublayers 311a and 311b.

Expanding on an example provided above, in one embodiment the first sublayer 311a may be NiWO (at any appropriate composition), the second sublayer 311b may be NiWTaO (having a composition that includes about 7% (atomic) tantalum and any appropriate relative composition of nickel, tungsten, and oxygen), and the third sublayer 311c may also be NiWTaO (having a composition that includes about 14% (atomic) tantalum and any appropriate relative composition of nickel, tungsten, and oxygen). This example is shown in FIG. 4D (where M1 is tungsten and M2 is tantalum). In a similar example, the tantalum and/or tungsten may be swapped for a different metal.

As mentioned, a number of different materials may be provided for the first sublayer. In various embodiments, the first sublayer is NiM1O. Where the first sublayer is NiM1O, it may be provided at any appropriate composition. In certain implementations, a NiM1O sublayer has a composition of $Ni_xM1_yO_z$, where $0.2<x<0.3$, $0.02<y<0.1$, and $0.5<z<0.75$. In a number of implementations, M1 is tungsten (W), though the embodiments are not so limited. Where M1 is tungsten and the first sublayer is NiWO, the NiWO may have a composition of $Ni_xW_yO_z$, where $0.2<x<0.3$, $0.05<y<0.1$, and $0.6<z<0.7$.

Likewise, a number of different materials may be provided for the second (and optional additional) sublayers. As noted, these sublayers will often include the material of the first sublayer with an additional metal (M2) and/or metal oxide. Where the first sublayer includes NiM1O and the second/additional sublayers include NiM1M2O, the second/additional sublayers may have a composition of $Ni_aM1_bM2_cO_d$, where $0.2<a<0.3$, $0.05<b<0.1$, $0.01<c<0.1$, and $0.5<d<0.75$. In a number of embodiments, the subscript c is lower in sublayers positioned closer to the electrochromic layer and higher in sublayers positioned farther from the electrochromic layer.

The thickness of the sublayers is generally determined by the overall desired thickness of the CE layer and the number of sublayers that are used. The desired thickness of the CE layer overall is determined at least in part by the desired charge capacity of the CE layer, and example thicknesses are provided below. Where the counter electrode layer is provided as three sublayers as shown in FIG. 3, the first sublayer 311a may be a relatively thin flash layer as described above. The second and third sublayers 311b and 311c may have any relative thickness. For instance, the second sublayer 311b may be thinner, thicker, or about equally as thick as the third sublayer 311c.

In some embodiments, additional sublayers may be provided. The additional sublayers may be homogeneous with respect to composition, or they may be graded as described above. The trends described with relation to the first, second, and third sublayers of FIGS. 2 and 3 may also hold true in throughout additional sublayers in various embodiments where such additional sublayers are provided. In one example, the counter electrode is deposited to include four sublayers, where the first sublayer (positioned closest to the electrochromic layer) includes a first material (e.g., NiM1O) and the second, third, and fourth sublayers include a second material (e.g., NiM1M2O) that includes an additional element (e.g., a metal) that is not present in the first sublayer.

The concentration of this additional element may be higher in sublayers that are farther away from the electrochromic layer and lower in sublayers that are closer to the electrochromic layer. As one particular example, the first sublayer (closest to the electrochromic layer) is NiWO, the second sublayer is NiWTaO with 3% (atomic) Ta, the third sublayer is NiWTaO with 7% (atomic) Ta, and the fourth sublayer (farthest from the electrochromic layer) is NiWTaO with 10% (atomic) Ta.

Figure 4F:
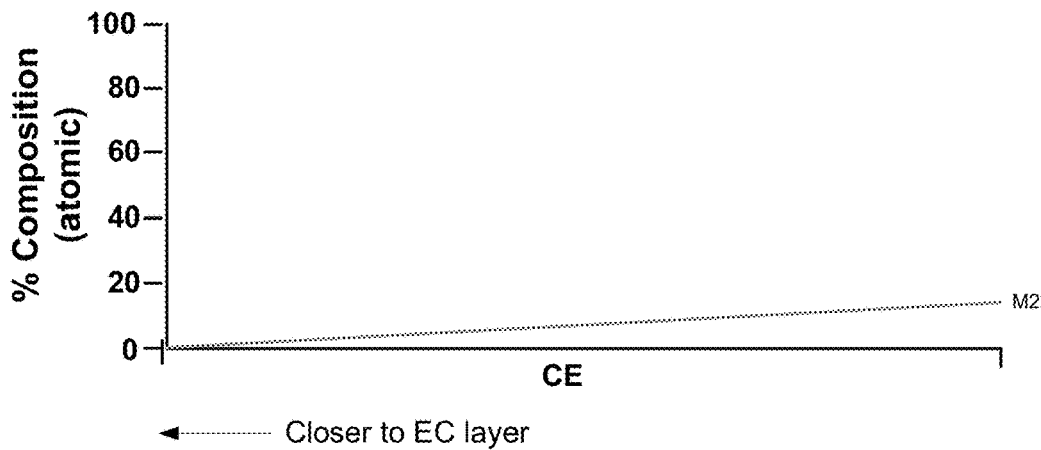

In still another embodiment, the counter electrode may be provided as a single layer, but the composition of the counter electrode layer may be graded. The composition may be graded with respect to one or more elements present in the material. In some embodiments, the counter electrode has a graded composition with respect to one or more metals in the material. In these or other embodiments, the counter electrode may have a graded composition with respect to one or more non-metals, for example oxygen. FIG. 4F presents a graph showing the concentration of M2 present in a counter electrode layer where the counter electrode is provided as a single layer with a graded composition. In this example, the composition is graded with respect to a metal therein (M2). The other elements (Ni, M1, O) are omitted from FIG. 4F. In one embodiment, these elements reflect the compositions substantially as described in relation to FIG. 4A or 4C, adjusted as appropriate to accommodate the changing M2 composition.

Without wishing to be bound by theory or mechanism of action, it is believed that the disclosed first sublayer may help protect the ion conducting layer and/or electrochromic layer from damage arising from excessive heating or other harsh condition during deposition of the counter electrode layer. The first sublayer may be deposited under conditions that are milder than those used to deposit the remaining sublayers. For instance, in some embodiments, the first sublayer may be deposited at a sputter power between about 5-20 kW/m$^2$, and the second sublayer may be deposited at a sputter power between about 20-45 kW/m$^2$. In one particular example where the first sublayer is NiWO and the second sublayer is NiWTaO, the NiWTaO may be deposited using higher sputtering power than the NiWO. This high power process, if performed to deposit directly on the ion conducting and/or electrochromic layer, might in some implementations degrade the ion conducting and/or electrochromic layer, for example due to excessive heating and premature crystallization of the relevant materials, and/or due to loss of oxygen in the ion conducting and/or electrochromic layer. However, where a thin flash layer of NiWO is provided as a first sublayer, this NiWO layer can be deposited under more gentle conditions. The NiWO sublayer may then protect the underlying ion conducting and/or electrochromic layer during deposition of subsequent NiWTaO sublayer(s). This protection may lead to a more reliable, better functioning electrochromic device.

In some embodiments, an electrochromic device includes a tungsten oxide based electrode layer that is cathodically coloring; and a nickel oxide based counter electrode layer that is anodically coloring; where the nickel oxide based counter electrode layer includes at least a first sublayer and a second sublayer, each of the first and second sublayers of the counter electrode layer having the formula Li$_a$NiW$_x$A$_y$O$_z$, where: a is 1 to 10; x is 0 to 1; y is 0 to 1; and z is at least 1; and wherein a, x, y, z, and A are selected independently for each of the first and second sublayers of the counter electrode layer.

In certain embodiments, y may be greater than 0 for at least one of the first and second sublayers of the counter electrode layer. In some examples, y may be zero in the first sublayer of the counter electrode layer and greater than zero in the second sublayer of the counter electrode layer. In these or other embodiments, x may be greater than 0 for at least one of the first and second sublayers of the counter electrode layer. For instance, x may be greater than zero in the first sublayer of the counter electrode layer and zero in the second sublayer of the counter electrode layer.

In various embodiments, the first and second sublayers have different compositions. For each of the first and second sublayers of the counter electrode layer, A may be independently selected from the group consisting of silver (Ag), aluminum (Al), arsenic (As), gold (Ag), boron (B), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), zirconium (Zr), and combinations thereof. In a number of embodiments, A may be a first metal in the first sublayer and a second metal in the second sublayer, the first metal being different from the second metal. In some implementations, y may be zero in the first sublayer such that the first sublayer is LiNiWO. In some embodiments, A in the first and/or second sublayer of the counter electrode layer may be selected from the group consisting of: Ta, Nb, Sn, Al, and Si. In these or other embodiments, A in each of the first and second sublayers of the counter electrode layer may be selected from the group consisting of: Ta, Nb, Sn, Al, and Si, where A in the first sublayer of the counter electrode layer is different from A in the second sublayer of the counter electrode layer. In some implementations, y may be between about 0.1-1 for at least one of the first and/or second sublayers of the counter electrode layer. In a particular embodiment, y may be between about 0.1-1 for each of the first and second sublayers of the counter electrode layer.

In some embodiments, the first sublayer of the counter electrode may be NiWO, and the second sublayer of the counter electrode may be a material selected from the group consisting of NiWTaO, NiWNbO, NiWSnO, NiWAlO, NiWSiO, NiTaO, NiNbO, NiSnO, NiAlO, NiSiO, and combinations thereof. In certain implementations, the second sublayer of the counter electrode may be a material selected from the group consisting of NiWTaO, NiWNbO, NiWSnO, NiWAlO, NiWSiO, and combinations thereof. The second sublayer of the counter electrode may be a material selected from the group consisting of NiTaO, NiNbO, NiSnO, NiAlO, NiSiO, and combinations thereof. In various implementations, the first and second sublayers of the counter electrode may each independently be selected from the group consisting of NiWO, NiWTaO, NiWNbO, NiWSnO, NiWAlO, NiWSiO, NiTaO, NiNbO, NiSnO, NiAlO, NiSiO, and combinations thereof, where the material of the first sublayer is different from the material of the second sublayer. In certain embodiments, the first and second sublayers of the counter electrode may each independently be selected from the group consisting of NiWO, NiWTaO, NiWNbO, NiWSnO, NiWAlO, NiWSiO, and combinations thereof, where the material of the first sublayer is different from the material of the second sublayer. In some cases, the first and second sublayers of the counter electrode may each independently be selected from the group consisting of NiWO, NiTaO, NiNbO, NiSnO, NiAlO, NiSiO, and combinations thereof, where the material of the first sublayer is different from the material of the second sublayer.

The disclosed embodiments may also exhibit improved performance arising from higher quality morphology and improved morphology control within the anodically coloring materials. As described herein, the counter electrode materials may be crystalline, nanocrystalline, amorphous, or some combination thereof. It is often desirable for the degree of crystallinity to be relatively low, and for any crystals present to be relatively small. By providing the counter electrode as two or more sublayers, one or more additional interfaces are introduced within the counter electrode (e.g., interfaces where the sublayers contact one another). These interfaces can disrupt the formation of crystals, for example due to renucleation and related grain growth effects. Such effects may act to prevent the crystals from growing larger and limit the size of any crystals that form. This effect on morphology may lead to fabrication of devices with fewer voids or other defects.

Similarly, where the counter electrode is deposited as one or more sublayers, the sublayers can act to smooth out bumps/valleys/striations in underlying layers. Where the counter electrode layer is deposited as a single homogeneous layer in a single step, bumps/valleys/striations present on underlying layers (which may originate from the substrate in some cases) are largely transferred to/through the counter electrode layer. By contrast, by depositing the counter electrode layer in several steps (e.g., using multiple sublayers), the sublayers can promote a smoother surface because the bumps/valleys/striations are less substantial with each additional layer that is deposited. By reducing the transfer of such surface non-uniformities through the layers of the device, several benefits may be realized. For instance, hermeticity may be improved, which results in improved moisture control. Relatedly, queue times during fabrication may be reduced, thereby improving throughput.

Without wishing to be bound by theory or mechanism of action, it is also believed that the disclosed methods may be used to achieve improved control over the distribution of lithium within an electrochromic device. Different counter electrode materials exhibit different affinities for lithium, and therefore the choice of counter electrode material(s) affects how the lithium ions are distributed in an electrochromic device. By selecting particular materials and combinations of materials, the distribution of lithium within the device can be controlled. The distribution of lithium within the device may be particularly important in devices that are fabricated without depositing a separate ion conducting layer. In such embodiments, the distribution of lithium throughout the device can affect whether or not an ion conducting/substantially electronically insulating region forms in the interfacial region between the electrochromic and counter electrode layers after the electrochromic stack is deposited and the stack is further processed. In certain embodiments, the sublayers of the counter electrode include materials having different affinities for lithium. For instance, the material of the first sublayer may have a higher or lower affinity for lithium compared to the material of the second (or additional) sublayer(s) of the counter electrode.

Relatedly, the disclosed methods may be used to achieve improved control over the total amount of lithium used to fabricate an electrochromic device. In various cases, lithium may be added during deposition of the counter electrode layer. In some embodiments, lithium may be added during deposition of one or more sublayers of the counter electrode. In these or other embodiments, lithium may be added between depositions of subsequent sublayers of the counter electrode. By controlling the distribution of lithium and the total amount of lithium within the electrochromic device, device uniformity and appearance may be improved.

Another benefit that may arise with the disclosed techniques is improved color and switching performance. As mentioned above, certain counter electrode materials exhibit better performance in terms of color (e.g., clearer clear states, more attractive tinted states, etc.), switching speed, lifetime, and other properties. However, certain materials that promote high quality results with respect to one property may have drawbacks with respect to other properties. For instance, a material that is desirable because it exhibits a very transparent and uncolored clear state may suffer problems related to slow switching speed and/or short lifetime. By combining this material with another counter electrode material (which may have its own problems such as a relatively more yellow clear state), it is possible in various implementations to achieve a counter electrode with improved properties. The drawbacks related to one counter electrode material may be mitigated by properties of another counter electrode material.

For example, in a particular embodiment the first sublayer/flash layer may be made of a material that has acceptable (but not exceptional) color quality in the clear state, and the second sublayer (and optional additional sublayers) may be made of a material that has superior color quality in the clear state (compared to the material of the flash layer). The color quality may be evaluated based on a* and/or b* values of the material, with higher quality color generally corresponding to a* and b* values near zero and lower quality color generally corresponding to a* and b* values further from zero. In various embodiments, a* and/or b* values for the first and second sublayers (in their clearest states) may vary by at least about 6, or at least about 3. In these or other cases, a* and/or b* values of the first and second sublayers (in their clearest states) may vary by about 10 or less.

In some cases the flash layer may be deposited at a relatively high rate using a low sputter power, and the second sublayer may be deposited at a relatively lower rate using a higher sputter power. The first sublayer may help to fabricate the devices more quickly while also protecting the ion conducting and/or electrochromic layer during formation of the counter electrode (e.g., by preventing the ion conducting and/or electrochromic layer from being exposed to high temperatures generated during the high sputter power deposition of the second sublayer), and the second sublayer may help provide high quality color performance to the device.

In some cases, the separation of the counter-electrode into multiple layers could lead to improved reliability or reduced defectivity through tuning of the film stress in the film. Film stress within the counter electrode layer can improve or degrade the adhesion of subsequent layers, which can impact the long-term reliability of the device as it experiences changes in voltage, temperature, humidity, ambient light, etc. Changes in film stress can impact the apparent defectivity of the device as well. Particles present on the substrate before or during device deposition can cause shorting between the electrode layers, which results in a local zone of decreased coloration. The appearance of these shorts can be decreased using a Defect-Mitigation Layer (DMIL), and some embodiments of the DMIL require the manipulation of stress within the counter-electrode to eject particles before the DMIL is applied. This is described in U.S. patent application Ser. No. 13/763,505, filed Feb. 8, 2013, and titled "DEFECT-MITIGATION LAYERS IN ELECTROCHROMIC DEVICES." A multi-layered counter electrode could incorporate a high stress initial layer, which may cause particles to deform or eject, and a low-stress final layer can fill in any open area created by the ejected particles.

In some embodiments, the anodically coloring counter electrode layer (or one or more sublayers therein) is a material that includes nickel, tungsten, tantalum, and oxygen. The materials may be provided together as NiWTaO, at any appropriate composition (or combination/arrangement of compositions throughout the counter electrode). Nickel tungsten tantalum oxygen based materials are especially beneficial as an anodically coloring material because they may be particularly clear or color neutral in the clear state. Many counter electrode materials are slightly tinted (colored) even in their clear states. For instance, NiWO generally has a slight yellow tint in the clear state. For aesthetic reasons, it is beneficial in various cases that both the cathodically coloring and anodically coloring materials in an electrochromic device are very clear (transparent) and colorless when the device is in the clear state.

Further, some counter electrode materials exhibit good color qualities (i.e., are very clear in their clear state), but are unsuitable for commercial use because the materials' ability to undergo rapid optical transitions fades over time. In other words, for these materials the duration of an optical transition increases with the age/use of the device. In this case, a newly fabricated window would exhibit higher switching speeds than an identical window that has been in use for e.g., six months. One example of an anodically coloring counter electrode material that shows good color quality but decreasing transition speed over time is nickel tantalum oxide (NiTaO). The inclusion of tungsten in such a material has been shown to significantly reduce the decrease in switching speed over time. As such, NiWTaO is a valuable candidate for one or more of the anodically coloring counter electrode material(s).

The NiWTaO may have various compositions when used as an anodically coloring material. In certain embodiments, particular balances may be made between the various components of the NiWTaO. For instance, an atomic ratio of Ni:(W+Ta) in the material may fall between about 1.5:1 and 3:1, for example between about 1.5:1 and 2.5:1, or between about 2:1 and 2.5:1. In a particular example the atomic ratio of Ni:(W+Ta) is between about 2:1 and 3:1. The atomic ratio of Ni:(W+Ta) relates to the ratio of (i) nickel atoms in the material to (ii) the sum of the number of tungsten and tantalum atoms in the material.

The NiWTaO material may also have a particular atomic ratio of W:Ta. In certain embodiments, the atomic ratio of W:Ta is between about 0.1:1 and 6:1, for example between about 0.2:1 and 5:1, or between about 1:1 and 3:1, or between about 1.5:1 and 2.5:1, or between about 1.5:1 and 2:1. In some cases the atomic ratio of W:Ta is between about 0.2:1 and 1:1, or between about 1:1 and 2:1, or between about 2:1 and 3:1, or between about 3:1 and 4:1, or between about 4:1 and 5:1. In some implementations, particular atomic ratios of Ni:(W+Ta) and W:Ta are used. All combinations of disclosed Ni:(W+Ta) compositions and disclosed W:Ta compositions are contemplated, though only certain combinations are explicitly listed herein. For instance, the atomic ratio of Ni:(W+Ta) may be between about 1.5:1 and 3:1, where the atomic ratio of W:Ta is between about 1.5:1 and 3:1. In another example, the atomic ratio of Ni:(W+Ta) may be between about 1.5:1 and 2.5:1, where the atomic ratio of W:Ta is between about 1.5:1 and 2.5:1. In a further example, the atomic ratio of Ni:(W+Ta) may be between about 2:1 and 2.5:1, where the atomic ratio of W:Ta is between about 1.5:1 and 2:1, or between about 0.2:1 and 1:1, or between about 1:1 and 2:1, or between about 4:1 and 5:1.

Other example materials for the counter electrode include, but are not limited to, nickel oxide, nickel tungsten oxide, nickel vanadium oxide, nickel chromium oxide, nickel aluminum oxide, nickel manganese oxide, nickel magnesium oxide, chromium oxide, iron oxide, cobalt oxide, rhodium oxide, iridium oxide, manganese oxide, Prussian blue. The materials (e.g., metal and oxygen) may be provided at different stoichiometric ratios as appropriate for a given application. In some other implementations, the counter electrode material may include cerium titanium oxide, cerium zirconium oxide, nickel oxide, nickel-tungsten oxide, vanadium oxide, and mixtures of oxides (e.g., a mixture of $Ni_2O_3$ and $WO_3$). Doped formulations of these oxides may also be used, with dopants including, e.g., tantalum and tungsten and the other elements listed above.

Because anodically coloring counter electrode layer contains the ions used to produce the electrochromic phenomenon in the cathodically coloring electrochromic material when the cathodically coloring electrochromic material is in the clear state, the anodically coloring counter electrode may have high transmittance and a neutral color when it holds significant quantities of these ions.

When charge is removed from an anodically coloring counter electrode (i.e., ions are transported from the counter electrode to the electrochromic layer), the counter electrode layer will turn from a (more or less) transparent state to a tinted state.

The morphology of the counter electrode layer or any one or more sublayers therein may be crystalline, amorphous, or some mixture thereof. Crystalline phases may be nanocrystalline. In some embodiments, the counter electrode material layer (or one or more sublayers therein) is amorphous or substantially amorphous. Various substantially amorphous counter electrodes have been found to perform better, under some conditions, in comparison to their crystalline counterparts. The amorphous state of one or more counter electrode oxide material(s) may be obtained through the use of certain processing conditions, described below. While not wishing to be bound to any theory or mechanism, it is believed that amorphous counter electrode materials such as nickel-tungsten oxide or nickel-tungsten-tantalum oxide are produced by relatively low energy atoms in the sputtering process. Low energy atoms are obtained, for example, in a sputtering process with lower target powers, higher chamber pressures (i.e., lower vacuum), and/or larger source to substrate distances. Amorphous films are also more likely to form where there is a relatively higher fraction/concentration of heavy atoms (e.g., W). Under the described process conditions films with better stability under UV/heat exposure are produced. Substantially amorphous materials may have some crystalline, typically but not necessarily nanocrystalline, material dispersed in the amorphous matrix. The grain size and amounts of such crystalline materials are described in more detail below.

In some embodiments, the morphology of the counter electrode or any sublayers therein may include microcrystalline, nanocrystalline and/or amorphous phases. For example, the counter electrode may be, e.g., a material with an amorphous matrix having nanocrystals distributed throughout. In certain embodiments, the nanocrystals constitute about 50% or less of the counter electrode material, about 40% or less of the counter electrode material, about 30% or less of the counter electrode material, about 20% or less of the counter electrode material or about 10% or less of the counter electrode material (by weight or by volume depending on the embodiment). In certain embodiments, the nanocrystals have a maximum diameter of less than about 50 nm, in some cases less than about 25 nm, less than about 10 nm, or less than about 5 nm. In some cases, the nanocrystals have a mean diameter of about 50 nm or less, or about 10 nm or less, or about 5 nm or less (e.g., about 1-10 nm).

In certain embodiments, it is desirable to have a nanocrystal size distribution where at least about 50% of the nanocrystals have a diameter within 1 standard deviation of the mean nanocrystal diameter, for example where at least about 75% of the nanocrystals have a diameter within 1 standard deviation of the mean nanocrystal diameter or where at least about 90% of the nanocrystals have a diameter within 1 standard deviation of the mean nanocrystal diameter.

It has been found that counter electrode materials that include an amorphous matrix tend to operate more efficiently compared to counter electrode materials that are relatively more crystalline. In certain embodiments, one material/additive may form a host matrix in which domains of the base anodically coloring material may be found. In various cases, the host matrix is substantially amorphous. In certain embodiments, the only crystalline structures in the counter electrode are formed from a base anodically coloring electrochromic material in, e.g., oxide form. One example of a base anodically coloring electrochromic material in oxide form is nickel tungsten oxide. Additives may contribute to forming an amorphous host matrix that is not substantially crystalline, but which incorporates domains (e.g., nanocrystals in some cases) of the base anodically coloring electrochromic material. One example additive is tantalum. In other embodiments, the additive and the anodically coloring base material together form a chemical compound with covalent and/or ionic bonding. The compound may be crystalline, amorphous, or a combination thereof. In other embodiments, the anodically coloring base material forms a host matrix in which domains of the additive exist as discrete phases or pockets. For example certain embodiments include a counter electrode having an amorphous matrix of a first material, with a second material, also amorphous, distributed throughout the first material in pockets, for example, pockets of the diameters described herein for crystalline materials distributed throughout an amorphous matrix.

In various embodiments, sublayers within a counter electrode layer may have different degrees of crystallinity. For instance, the first sublayer may be more crystalline, less crystalline, or about equally as crystalline as the second (or additional) sublayers of the counter electrode. For instance, the first sublayer may have larger, smaller, or about equal average crystal size as the second (or additional) sublayers. The first sublayer may also have a greater, lesser, or about equal proportion of material that is crystalline, compared to the second (or additional) sublayers.

In some embodiments, the thickness of the counter electrode is about 50 nm to about 650 nm. In some embodiments, the thickness of the counter electrode is about 100 nm to about 400 nm, sometimes in the range of about 150 nm to 300 nm, or between about 200 nm to 300 nm. The thickness of the counter electrode layer is also substantially uniform. In one embodiment, a substantially uniform counter electrode layer varies only about ±10% in each of the aforementioned thickness ranges. In another embodiment, a substantially uniform counter electrode layer varies only about ±5% in each of the aforementioned thickness ranges. In another embodiment, a substantially uniform counter electrode layer varies only about ±3% in each of the aforementioned thickness ranges.

The amount of ions held in the counter electrode layer during the clear state (and correspondingly in the electrochromic layer during the tinted state) and available to drive the electrochromic transition depends on the composition of the layers as well as the thickness of the layers and the fabrication method. Both the electrochromic layer and the counter electrode layer are capable of supporting available charge (in the form of lithium ions and electrons) in the neighborhood of several tens of millicoulombs per square centimeter of layer surface area. The charge capacity of an electrochromic film is the amount of charge that can be loaded and unloaded reversibly per unit area and unit thickness of the film by applying an external voltage or potential. In one embodiment, the $WO_3$ layer has a charge capacity of between about 30 and about 150 $mC/cm^2/$micron. In another embodiment, the $WO_3$ layer has a charge capacity of between about 50 and about 100 $mC/cm^2/$micron. In one embodiment, the counter electrode layer has a charge capacity of between about 75 and about 200 $mC/cm^2/$micron. In another embodiment, the counter electrode layer has a charge capacity of between about 100 and about 150 $mC/cm^2/$micron.

The counter electrode layer and/or the electrochromic device may have particular properties when considering all the layers/sublayers therein. For instance, in some embodiments a counter electrode will have a b* value that is between about 2-10, or between about 4-6, when the counter electrode is in its clearest state (when the counter electrode is held at its most cathodic potential and the ions fully reside in the counter electrode layer of the device). An electrochromic device fabricated according to the disclosed embodiment may have a b* value that is between about 6-14, or between about 9-12, when the device is in its clearest state. These values take into account color that may result from both the counter electrode layer as well as the electrochromic layer. An electrochromic window that is fabricated according to the disclosed techniques may have a b* value that is between about 6-14, or between about 9-12, when the electrochromic window is in its clearest state. Such a window's b* value may be less than 10. In various cases, an electrochromic device and/or electrochromic window according to the disclosed embodiments may have a transmitted b* value of about 14 or below, 12 or below, or 10 or below, when the device or window is in its clearest state. These values take into account color that may result from the counter electrode layer, the electrochromic layer, the substrates (e.g., glass, etc.), the conducting oxide layers, and any other layers present in the window.

Similarly, the counter electrode layer and/or the electrochromic device may have a particular transmissivity when in its clearest state. In some embodiments, a counter electrode layer will have a visible transmittance of at least about 65% when in its clearest state. An electrochromic device as disclosed herein may have a visible transmittance of at least about 55% when in its clearest state. An electrochromic window fabricated as disclosed herein may have a visible transmittance of at least about 50% when in its clearest state.

In certain embodiments, an electrochromic layer may be implemented as two or more sub-layers, as described in relation to the counter electrode layer. Details related to differences between the sub-layers, as well as details related to changes within a layer, may also apply to an electrochromic layer (instead of, or in addition to, a counter electrode layer).

Other Aspects Related to Varied Compositions Within EC Devices

Much of the discussion above has focused on embodiments that include a counter electrode layer that has a heterogeneous composition. Often, the composition of the counter electrode is heterogeneous with respect to a metal therein. Alternatively or in addition, the counter electrode (or another layer/region in the electrochromic device) may be fabricated to include a heterogeneous composition with respect to another element such as oxygen. In various embodiments, for instance, the electrochromic and/or counter electrode layers may be deposited to include an oxygen-rich portion. The oxygen-rich portion (in some cases this portion is provided as a distinct sublayer, while in other cases a distinct sublayer is not provided) may be in contact with the other electrode layer (e.g., an oxygen-rich portion of an electrochromic layer may be deposited in direct contact with the counter electrode layer, and/or an oxygen-rich portion of a counter electrode layer may be deposited in direct contact with the electrochromic layer). The heterogeneous structure of the electrochromic and/or counter electrode layer may promote formation of an interfacial region between these two layers, where (upon further processing) the interfacial region acts as a region that is ion conducting and substantially electronically insulating. The interfacial region itself may be heterogeneous with respect to composition and/or morphology.

Generally speaking, in certain embodiments the interfacial region may have a heterogeneous structure that includes at least two discrete components represented by different phases and/or compositions. Further, the interfacial region may include a gradient in these two or more discrete components such as an ion conducting material and an electrochromic material (for example, a mixture of lithium tungstate and tungsten oxide). The gradient may provide, for example, a variable composition, microstructure, resistivity, dopant concentration (for example, oxygen concentration), stoichiometry, density, and/or grain size regime. The gradient may have many different forms of transition including a linear transition, a sigmoidal transition, a Gaussian transition, etc.

Because the interfacial region may be formed from a portion of the electrochromic and/or counter electrode layers, these layers may also be deposited to include such heterogeneous structures.

In certain implementations, the electrochromic stack may be provided as a graded electrochromic element. An EC element has no abrupt transition between an EC layer and an IC layer or between an IC layer and a CE layer, but rather is a single layer graded composition having an EC region, which transitions to an IC region (the interfacial region), which transitions to a CE region. Since an EC element is a single layer of graded composition, EC elements can be described in a number of ways including those below. The following description is meant to illustrative of certain embodiments of EC elements.

Figure 4G:
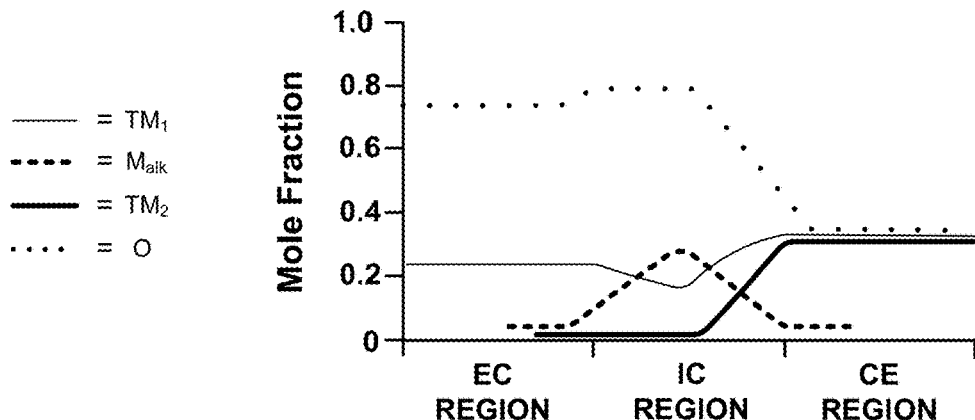
Figure 4H:
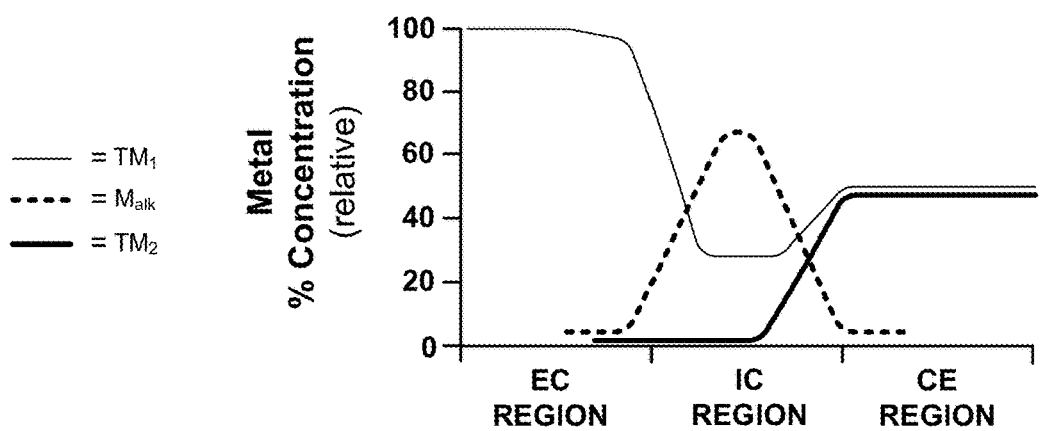
Figure 4I:
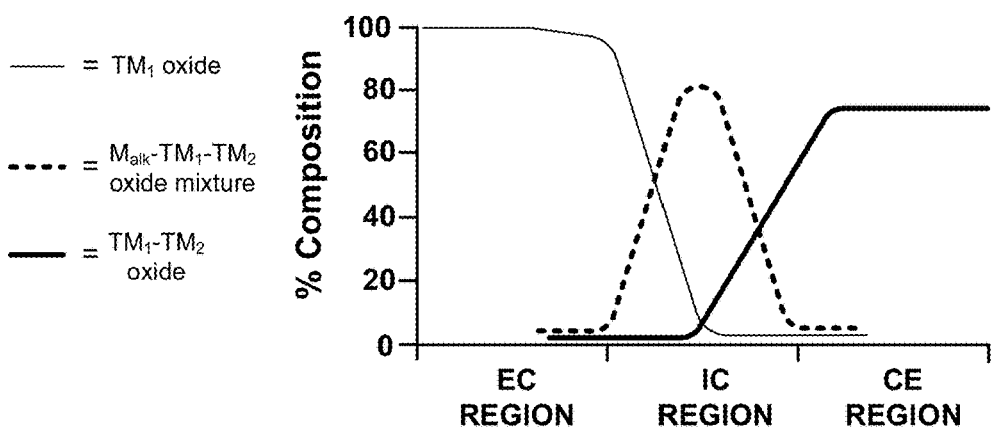

One embodiment is an EC element which is a single layer graded composition including an EC region, an IC region and a CE region, respectively. In one embodiment, the EC element is all solid-state and inorganic. A single EC element can be described in a number of ways in order to understand the graded composition of which it is comprised. In various embodiments, the single layer graded composition EC element has no abrupt boundaries between EC/IC or between IC/CE. Rather both of these interfaces are characterized by graded compositions as discussed herein. In some cases, the single layer graded composition EC element has a continuously variable composition across all regions of the element. In other cases, the element has at least one region, or at least two regions, of constant composition. FIGS. 4G-4I are examples of how one can metric the composition of one type of EC element. In these particular examples, the EC element's EC region includes a first transition metal; the IC region includes an alkali metal, and the CE region comprises a mixed transition metal oxide. The IC region may be formed after the EC and CE regions are deposited in contact with one another. In a particular example, the mixed transition metal oxide includes the first transition metal and an additional transition metal, although in other examples, the mixed transition metal oxide does not include the first transition metal. In some devices, FIGS. 4G-4I are describing the same EC element, but in different ways. Each of these ways exemplify how one might describe any number of EC elements in accord with embodiments described herein. In this example, some of the components depicted in the graphs are present throughout the graded composition, some are not. For example, one transition metal is continuously present in significant concentration across the entire device, from the EC region, through the CE region. The invention is not limited in this way. In some embodiments some or all the components are present at least in some de minimus amount (or even a significant amount) throughout the EC element. In certain examples within the realm of FIGS. 4G-4I, each component has at least some presence in each region of the EC element.

Referring to FIG. 4G, the EC element is described in terms of the mole fraction of elemental components from which it is composed as a function of the region, EC, IC or CE in which the components occur. Starting from the origin and moving from left to right across the graph, in the EC region, there is a higher mole fraction of oxygen (O) than the first transition metal ($TM_1$). For example, this could represent tungsten oxide in approximately a 3:1 ratio of oxygen to tungsten. Moving further to the right, the mole fraction of the first transition metal declines starting somewhere in the EC region. At some point in the CE region, the mole fraction of oxygen and the first transition metal level off. For example, this could represent nickel tungsten oxide of stable composition in the CE region. In this example, a second transition metal ($TM_2$) is present throughout the EC element, in this particular example having a higher mole fraction in the CE region than the other regions of the EC element. Also, an alkali metal ($M_{alk}$) is present in the EC element. For the purposes of this description, "alkali metal" is meant to encompass both neutral elemental alkali metal and cations thereof, e.g., bound in a material matrix or unbound and thus able to intercalate/transport during device operation. In this example the alkali metal has the highest mole fraction in the IC region. This might correspond to lithium of lithium tungstate existing in this region in one example. The oxygen concentration may also be highest in the IC region, as shown in FIG. 4G. This high oxygen concentration may be the result of depositing the materials in the IC region to be superstoichiometric with respect to oxygen. In certain embodiments, the material of the IC region may include a superstoichiometric (with respect to oxygen) form of the material in the EC region and/or CE region. It is important to note that the mole fraction of components depicted in FIG. 4G are those components fixed in the EC element, e.g., the alkali metal component does not include mobile lithium ions that might be used to drive the EC element to color or bleach (as such ions are mobile and their position in the EC element will change depending upon an applied charge, for example). This example is illustrative of how one might describe the composition of an EC element.

One embodiment is an EC element including: a) a first transition metal having a higher mole fraction of the composition in the EC region than a second transition metal, if present, in the EC region, b) an alkali metal having a maximum mole fraction of the composition in the IC region as compared to the EC region and the CE region; and c) the second transition metal having its maximum mole fraction, of the composition of any region of the EC element, in the CE region.

Referring to FIG. 4H, if one were to consider the composition of the same EC element as described in relation to FIG. 4G, but without considering oxygen content, that is another way to describe embodiments described herein. For example, in this graph the y-axis is not mole fraction, but rather metal concentration; that is, the concentration of each metal, $TM_1$, $M_{alk}$, and $TM_2$, in each region of the graded composition. In this example, each of the first transition metal and the alkali metal are described in terms of their concentration relative to the other two metals. The second transition metal is described in terms of its absolute concentration. Referring to FIG. 4H, in the EC region, the first transition metal has its maximum concentration, relative to the other metals. The alkali metal has its maximum concentration in the IC region, relative to the other metals. The second transition metal has its maximum (absolute) concentration in the CE region. In this example, $TM_1$ and $TM_2$ have substantially the same concentration in the CE region, e.g., this might represent NiWO.

One embodiment is an EC element including: a) a first transition metal having a maximum concentration, relative to other metals in the EC element, in the EC region, b) an alkali metal having a maximum concentration, relative to other metals in the EC element, in the IC region, and c) a second transition metal having its absolute maximum concentration in the CE region of the EC element.

FIG. 4I describes the composition of the same EC element as described in relation to FIGS. 4G and 4H, but looking at the actual composition, e.g., compounds, that make up each region. For example, in this graph the y-axis is % composition of each compound, oxide of the first transition metal ($TM_1$-oxide), an oxide mixture which includes the alkali metal, along with the first and second transition metals ($M_{alk}$-$TM_1$-$TM_2$ oxide mixture) and a mixed transition metal oxide ($TM_1$-$TM_2$ oxide), in each region of the graded composition. As mentioned the mixed transition metal oxide need not include the first transition metal (e.g., it can include a second and third transition metal), but it does in this example. In this example, the $TM_1$-oxide is most abundant in the EC region, and it is the primary constituent of the EC region. The $M_{alk}$-$TM_1$-$TM_2$ oxide mixture is the primary constituent of the IC region and the $TM_1$-$TM_2$ oxide is the primary constituent of the CE region. Note that the $M_{alk}$-$TM_1$-$TM_2$ oxide mixture may include more than one compound in a matrix of materials, e.g., this could represent a graded mixture of lithium tungstate, tungsten oxide and nickel tungsten oxide. The morphology of the EC element may vary across the layer, i.e. the graded region may have amorphous portions, crystalline portions and/or mixed amorphous crystalline portions in any one or more of the regions. In some embodiments, the CE region is substantially amorphous.

One embodiment is an EC element, including: a) a first transition metal oxide which is the primary constituent of the EC region, b) a mixed transition metal oxide which is the primary constituent of the CE region, and c) a mixture including the first transition metal and the mixed transition metal oxide, the mixture being the primary constituent of the IC region. One embodiment is an EC element, including: a) a first transition metal oxide which is the primary constituent of the EC region, b) a mixed transition metal oxide which is the primary constituent of the CE region, and c) a mixture including an alkali metal compound, the first transition metal and the mixed transition metal oxide, the mixture being the primary constituent of the IC region. In one embodiment, the mixed transition metal oxide includes the first transition metal and a second transition metal selected from the group consisting of nickel, tantalum, titanium, vanadium, chromium, cerium, cobalt, copper, iridium, iron, manganese, molybdenum, niobium, palladium, praseodymium, rhodium and ruthenium. In one embodiment, the mixed transition metal oxide does not include the first transition metal. In one embodiment, the alkali metal is lithium cation, either associated with a compound or associated with the material matrix as a transportable ion during operation of the EC element.

One embodiment is a method of fabricating an electrochromic device including: (a) forming either an electrochromic layer including an electrochromic material or a counter electrode layer including a counter electrode material; (b) forming an intermediate layer over the electrochromic layer or the counter electrode layer, where the intermediate layer includes an oxygen rich form of at least one of the electrochromic material, the counter electrode material and an additional material, where the additional material includes distinct electrochromic or counter electrode material, the intermediate layer not substantially electronically-insulating; (c) exposing the intermediate layer to lithium; and (d) heating the stack formed in order to convert at least part of the intermediate layer to a region, coextensive with the area of the intermediate layer, including an electronically-insulating ionically-conducting material and the material of the intermediate layer.

Because the intermediate layer may be formed from an oxygen rich form of the EC and/or CE material, the EC layer and/or CE layer can be understood to be formed to include a heterogeneous composition (e.g., including both the oxygen rich portion and the non-oxygen rich portion).

Method of Fabricating Electrochromic Windows

Deposition of the Electrochromic Stack

As mentioned above, one aspect of the embodiments is a method of fabricating an electrochromic window. In a broad sense, the method includes sequentially depositing on a substrate (i) a cathodically coloring electrochromic layer, (ii) an optional ion conducting layer, and (iii) an anodically coloring counter electrode layer to form a stack in which either (a) the ion conducting layer separates the cathodically coloring electrochromic layer and the anodically coloring counter electrode layer, or (b) the cathodically coloring electrochromic layer is in physical contact with the anodically coloring counter electrode layer. In various embodiments, the counter electrode layer is deposited to be heterogeneous with respect to composition and/or morphology. For instance, the counter electrode may be deposited to include sublayers in some cases. In some embodiments, the counter electrode layer is deposited to include a graded composition. The gradient may be in a direction perpendicular to the surface of the layer.

The sequential deposition may employ a single integrated deposition system having a controlled ambient environment in which the pressure, temperature, and/or gas composition are controlled independently of an external environment outside of the integrated deposition system, and the substrate may not leave the integrated deposition system at any time during the sequential deposition of the electrochromic layer, the optional ion conducting layer, and the counter electrode layer. (Examples of integrated deposition systems which maintain controlled ambient environments are described in more detail below in relation to FIGS. 9A-9E.) The gas composition may be characterized by the partial pressures of the various components in the controlled ambient environment. The controlled ambient environment also may be characterized in terms of the number of particles or particle densities. In certain embodiments, the controlled ambient environment contains fewer than 350 particles (of size 0.1 micrometers or larger) per $m^3$. In certain embodiments, the controlled ambient environment meets the requirements of a class 1000 clean room (US FED STD 209E), or a class 100 clean room (US FED STD 209E). In certain embodiments, the controlled ambient environment meets the requirements of a class 10 clean room (US FED STD 209E). The substrate may enter and/or leave the controlled ambient environment in a clean room meeting class 1000, class 100 or even class 10 requirements.

Typically, but not necessarily, this method of fabrication is integrated into a multistep process for making an electrochromic window using architectural glass as the substrate, but methods are not so limited. Electrochromic mirrors and other devices may be fabricated using some or all of the operations and approaches described herein. Further details related to processes for fabricating electrochromic windows are discussed in U.S. patent application Ser. No. 12/645,111, incorporated by reference above.

The method for depositing the electrochromic stack may include sequentially depositing on a substrate (i) a cathodically coloring EC layer, (ii) an optional IC layer, and (iii) an anodically coloring CE layer to form a stack in which either (a) the IC layer separates the EC layer and the CE layer, or (b) the EC layer and CE layer are in physical contact with one another. The method may be performed in a single integrated deposition system having a controlled ambient environment in which the pressure and/or gas composition are controlled independently of an external environment outside of the integrated deposition system, and the substrate in various cases may not leave the integrated deposition system at any time during the sequential deposition of the EC layer, the optional IC layer, and the CE layer. In one embodiment, each of the sequentially deposited layers is physical vapor deposited. In general the layers of the electrochromic device may be deposited by various techniques including physical vapor deposition, chemical vapor deposition, plasma enhanced chemical vapor deposition, and atomic layer deposition, to name a few. The term physical vapor deposition as used herein includes the full range of art understood PVD techniques including sputtering, evaporation, ablation, and the like.

Figure 5:
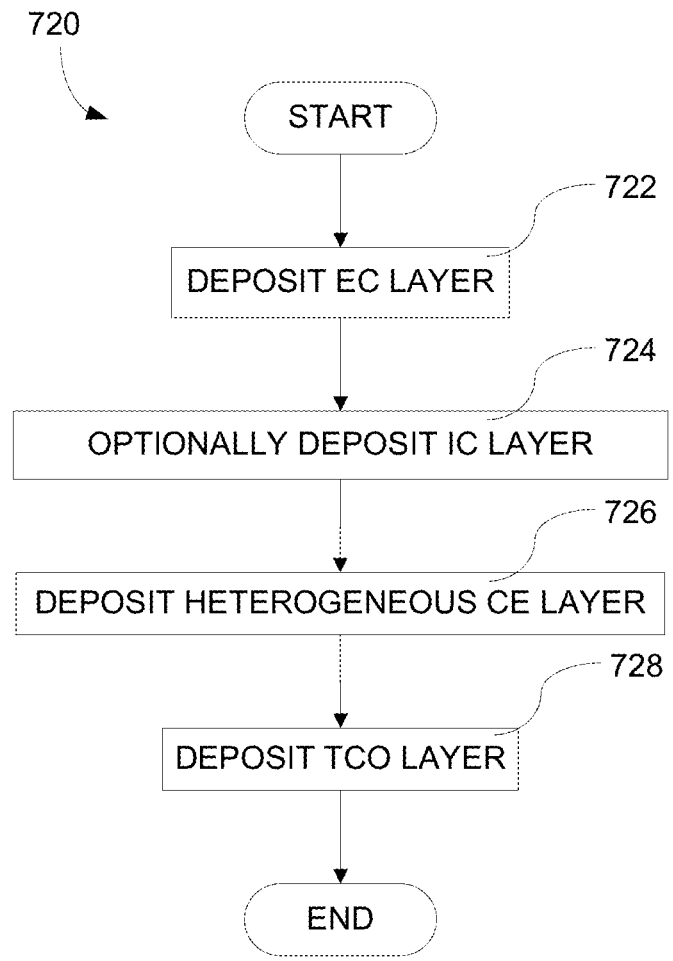
FIG. 5 depicts a method of fabricating an electrochromic stack which is part of an electrochromic device according to certain embodiments.

FIG. 5 depicts one embodiment of process 720 for forming an electrochromic stack. First the cathodically coloring EC layer is deposited on the substrate, process 722, then the optional IC layer may be deposited, process 724 (as noted above, in certain embodiments the IC layer, and therefore process 724, are omitted), then the heterogeneous anodically coloring CE layer may be deposited, process 726. The heterogeneous CE layer may be deposited in two or more steps in some cases. For instance, where the CE layer includes sublayers, each of the sublayers may be deposited in a distinct process/step. The reverse order of deposition is also an embodiment, that is, where the CE layer is deposited first, then the optional IC layer and then the EC layer. In one embodiment, each of the electrochromic layer, the optional ion conducting layer, and the counter electrode layer is a solid phase layer. In these or other embodiments, each of the electrochromic layer, the optional ion conducting layer, and the counter electrode layer may include only inorganic material.

It should be understood that while certain embodiments are described in terms of a counter electrode layer, an ion conductor layer, and an electrochromic layer, any one or more of these layers may be composed of one or more sublayers, which may have distinct compositions, sizes, morphologies, charge densities, optical properties, etc. Further any one or more of the device layers may have a graded composition or a graded morphology in which the composition or morphology, respectively, changes over at least a portion of the thickness of the layer.

Many of the embodiments herein are presented in the context of a counter electrode layer that includes a heterogeneous composition and/or morphology. The described heterogeneous counter electrode layer may be used in conjunction with other layers or regions (e.g., electrochromic layers, interfacial regions where an EC layer contacts a CE layer, etc.) that include gradations and/or sublayers with differing compositions and/or morphologies.

In one example, the concentration of oxygen, a dopant, or charge carrier varies within a given layer, at least as the layer is fabricated. In another example, the morphology of a layer varies from crystalline to amorphous. Such graded composition or morphology may be chosen to impact the functional properties of the device. In some cases, additional layers may be added to the stack. In one example a heat spreader layer is interposed between one or both TCO layers and the EC stack. A heat spreader layer is made of material(s) that have high thermal conductivity and thus can spread heat efficiently across the stack.

Also, as described above, the electrochromic devices of certain embodiments utilize ion movement between the electrochromic layer and the counter electrode layer via an ion conducting layer. In some embodiments these ions (or neutral precursors thereof) are introduced to the stack as one or more layers that eventually intercalate into the stack. Such layers may be deposited before, during, and/or after deposition of the other layers (e.g., EC layer, IC layer, CE layer) in the stack. Alternatively (or in addition), one or more lithiation steps may be performed as an intermediate step occurring between steps performed to deposit an electrode. For example, a counter electrode layer may be deposited by depositing a first sublayer, followed by depositing lithium thereon, and then concluded by depositing one or more additional sublayers. In one embodiment, a first sublayer, optionally a flash layer, is deposited, followed by a second sublayer, followed by lithiation, then a third sublayer deposited on the second sublayer. In another embodiment, a first sublayer, optionally a flash layer, is deposited, followed by a second sublayer, then a third sublayer deposited on the second sublayer, lithium is then deposited on the third sublayer. In some embodiments, a DMIL or capping layer is deposited on the third sublayer.

The sublayers deposited before vs. after lithiation may have the same or different compositions and/or morphologies. Lithiation may also be performed during deposition of a single sublayer, e.g., the material of the sublayer includes excess lithium such that deposition of that sublayer provides, e.g., sufficient lithium for the remainder of the electrochromic device stack. This result may be achieved, e.g., by co-sputtering lithium with the sublayer material or where the sublayer material already includes lithium. Such approaches may have certain advantages such as better separating the lithium from the indium tin oxide (ITO) or other material of a conductive layer, which improves adhesion and prevents undesirable side reactions.

In some embodiments the ions are introduced into the stack concurrently with one or more of the electrochromic layer, the ion conducting layer, and the counter electrode layer. In one embodiment, where lithium ions are used, lithium is, e.g., sputtered along with the material used to make the one or more of the stack layers or sputtered as part of a material that includes lithium (e.g., by a method employing lithium nickel tungsten tantalum oxide or another lithium containing material). In one embodiment, the IC layer is deposited via sputtering a lithium silicon aluminum oxide target. In another embodiment, the Li is co-sputtered along with silicon aluminum in order to achieve the desired film.

Referring again to process 722 in FIG. 5, in one embodiment, depositing the electrochromic layer comprises depositing $WO_x$, e.g., where x is less than 3.0 and at least about 2.7. In this embodiment, the $WO_x$ has a substantially nanocrystalline morphology. In some embodiments, the electrochromic layer is deposited to a thickness of between about 200 nm and 700 nm. In one embodiment, depositing the electrochromic layer includes sputtering tungsten from a tungsten containing target. Particular deposition conditions for forming a $WO_x$ electrochromic layer are further discussed in U.S. patent application Ser. No. 12/645,111, which is incorporated by reference above.

It should be understood that while deposition of the EC layer is described in terms of sputtering from a target, other deposition techniques are employed in some embodiments. For example, chemical vapor deposition, atomic layer deposition, and the like may be employed. Each of these techniques, along with PVD, has its own form of material source as is known to those of skill in the art.

Referring again to FIG. 5, operation 724, once the EC layer is deposited, the optional IC layer may be deposited. Electrochromic devices that operate by lithium ion intercalation are well suited for the demanding conditions of architectural windows. Suitable lithium ion conductor layer materials include lithium silicate, lithium aluminum silicate, lithium oxide, lithium tungstate, lithium aluminum borate, lithium borate, lithium zirconium silicate, lithium niobate, lithium borosilicate, lithium phosphosilicate, lithium nitride, lithium oxynitride, lithium aluminum fluoride, lithium phosphorus oxynitride (LiPON), lithium lanthanum titanate (LLT), lithium tantalum oxide, lithium zirconium oxide, lithium silicon carbon oxynitride (LiSiCON), lithium titanium phosphate, lithium germanium vanadium oxide, lithium zinc germanium oxide, and other ceramic materials that allow lithium ions to pass through them while having a high electrical resistance (blocking electron movement therethrough). Particular deposition conditions for forming an IC layer in situ are further discussed in U.S. patent application Ser. No. 12/645,111, and in U.S. Pat. No. 9,261,751, each of which is incorporated by reference above. In certain embodiments, depositing the ion conducting layer includes depositing the ion conducting layer to a thickness of between about 10 and 100 nm.

Referring again to FIG. 5, operation 726, after the optional IC layer is deposited, the anodically coloring CE layer is deposited. In some embodiments where the IC layer is omitted, operation 726 may follow operation 722. The anodically coloring CE layer may be deposited to include a heterogeneous composition and/or morphology as described above. In various cases, operation 726 involves depositing two or more sublayers of anodically coloring counter electrode material. One of these sublayers may be a flash layer as described above. In these or other cases, the counter electrode may be deposited to include a graded composition.

In one embodiment, depositing the counter electrode layer includes depositing a layer or sublayer(s) of nickel-tungsten-tantalum-oxide (NiWTaO). In a specific embodiment, depositing the counter electrode layer includes sputtering a target including about 30% (by weight) to about 70% of tungsten in nickel and/or tantalum in an oxygen containing environment to produce a layer of nickel tungsten tantalum oxide (the tantalum being provided by a tungsten/nickel/tantalum target at an appropriate composition, or by another target, or through another source such as an evaporated tantalum source). In another embodiment the target is between about 40% and about 60% tungsten in nickel (and/or tantalum), in another embodiment between about 45% and about 55% tungsten in nickel (and/or tantalum), and in yet another embodiment about 51% tungsten in nickel (and/or tantalum).

In certain embodiments where the anodically coloring counter electrode layer includes a layer or sublayer(s) of NiWTaO, many deposition targets or combinations of targets may be used to deposit the NiWTaO materials. For instance, individual metal targets of nickel, tungsten, and tantalum can be used. In other cases at least one of the targets includes an alloy. For instance, an alloy target of nickel-tungsten can be used together with a metal tantalum target. In another case, an alloy target of nickel-tantalum can be used together with a metal tungsten target. In a further case, an alloy of tungsten-tantalum can be used together with a metal nickel target. In yet a further case, an alloy target containing a nickel-tungsten-tantalum material may be used. Moreover, any of the listed targets can be provided as an oxide. Oftentimes, sputtering occurs in the presence of oxygen, and such oxygen is incorporated into the material. Sputter targets containing oxygen may be used alternatively or in addition to an oxygen-containing sputtering atmosphere.

The sputtering target(s) for forming the anodically coloring counter electrode material may have compositions that permit the counter electrode layer or sublayers to be formed at any of the compositions described herein. Further, the sputtering target(s) for forming the anodically coloring counter electrode material may be positioned in a way that permits the material to be formed as desired, for example to form heterogeneous counter electrode layers (e.g., having heterogeneous compositions, heterogeneous morphologies, sublayers, graded compositions, etc.) as described herein. In one example where a single sputter target is used to form a NiWTaO material, the sputter target may have a composition that matches the composition of any of the NiWTaO materials disclosed herein. In other examples a combination of sputter targets are used, and the composition of the combined targets allows for deposition at any of the NiWTaO compositions (or other counter electrode materials) disclosed herein.

In one embodiment, the gas composition used when forming the CE (or a sublayer therein) contains between about 30% and about 100% oxygen, in another embodiment between about 75% and about 100% oxygen, in yet another embodiment between about 95% and about 100% oxygen, in another embodiment about 100% oxygen. In one embodiment, the power density used to sputter a CE target is between about 2 Watts/cm$^2$ and about 50 Watts/cm$^2$ (determined based on the power applied divided by the surface area of the target); in another embodiment between about 5 Watts/cm$^2$ and about 20 Watts/cm$^2$; and in yet another embodiment between about 8 Watts/cm$^2$ and about 10 Watts/cm$^2$, in another embodiment about 8 Watts/cm$^2$. In some embodiments, the power delivered to effect sputtering is provided via direct current (DC). In other embodiments, pulsed DC/AC reactive sputtering is used. In one embodiment, where pulsed DC/AC reactive sputtering is used, the frequency is between about 20 kHz and about 400 kHz, in another embodiment between about 20 kHz and about 50 kHz, in yet another embodiment between about 40 kHz and about 50 kHz, in another embodiment about 40 kHz.

The pressure in the deposition station or chamber, in one embodiment, is between about 1 and about 50 mTorr, in another embodiment between about 20 and about 40 mTorr, in another embodiment between about 25 and about 35 mTorr, in another embodiment about 30 mTorr. In some cases, a nickel tungsten oxide NiWO ceramic target is sputtered with, e.g., argon and oxygen. In one embodiment, the NiWO is between about 15% (atomic) Ni and about 60% Ni; between about 10% W and about 40% W; and between about 30% O and about 75% O In another embodiment, the NiWO is between about 30% (atomic) Ni and about 45% Ni; between about 10% W and about 25% W; and between about 35% O and about 50% O. In one embodiment, the NiWO is about 42% (atomic) Ni, about 14% W, and about 44% O. In another embodiment, depositing the counter electrode layer includes depositing the counter electrode layer to a thickness of between about 150 and 350 nm; in yet another embodiment between about 200 and about 250 nm thick. The above conditions may be used in any combination with one another to effect deposition of a heterogeneous counter electrode layer.

The sputtering process for forming each portion of the CE layer may utilize one or more sputter targets. Different sputter targets may be used to form a variety of CE materials. Generally, the sputter targets for forming the CE layer include the elements that are to be present in the deposited CE layer (with oxygen optionally being provided in the target(s) themselves and/or by a sputter gas). In some cases, the elements of the CE layer are all provided together in a single target. In other cases, all the elements of the CE layer except oxygen are provided together in a single target. In other cases, different sputter targets may include different materials, and the targets can be used together to form a desired CE material. Much of the discussion herein regarding sputter targets is in the context of forming a NiWTaO material. However, the teachings herein are applicable to forming any of the disclosed materials, so long as the targets provided include the appropriate elements at an appropriate composition.

In one example where one sputter target is used to form a layer of NiWTaO, the target may include nickel, tungsten, and tantalum. In some cases the sputter target also includes oxygen. In some cases, multiple targets may be provided, with the composition of the targets being the same or different from one another. In one example in the context of forming a NiWTaO layer, at least one of the nickel, tungsten, and tantalum materials may be provided in a separate target. Similarly, where one sputter target is used to form a layer of NiWO, the target may include nickel and tungsten, optionally with oxygen. The nickel and tungsten can also be provided in separate targets. Other CE materials may similarly be deposited using one or more targets that may have the same or differing compositions compared to one another.

The sputter target may include a grid or other overlapping shape where different portions of the grid include the different relevant materials (e.g., in the context of forming a NiWTaO layer or sublayer, certain portions of the grid may include elemental nickel, elemental tungsten, elemental tantalum, a nickel-tungsten alloy, a nickel-tantalum alloy, and/or a tungsten-tantalum alloy). In some cases, a sputter target may be an alloy of the relevant materials (e.g., in the context of forming a NiWTaO layer or sublayer, two or more of nickel, tungsten, and tantalum may be provided as an alloy). Where two or more sputter targets are used, each sputter target may include at least one of the relevant materials (e.g., in the context of forming a NiWTaO layer or sublayer, at least one elemental and/or alloy form of nickel, tungsten, and/or tantalum, any of which can be provided in oxide form, may be present in each target). The sputter targets may overlap in some cases. The sputter targets may also rotate in some embodiments. As noted, the counter electrode layer is typically an oxide material. Oxygen may be provided as a part of the sputter target and/or sputter gas. In certain cases, the sputter targets are substantially pure metals, and sputtering is done in the presence of oxygen to form the oxide.

In one embodiment, in order to normalize the rate of deposition of the CE layer, multiple targets are used so as to obviate the need for inappropriately high power (or other inappropriate adjustment to desired process conditions) to increase deposition rate. In one embodiment, the distance between the CE target (cathode or source) to the substrate surface is between about 35 mm and about 150 mm; in another embodiment between about 45 mm and about 130 mm; and in another embodiment between about 70 mm and about 100 mm.

Figure 6A:
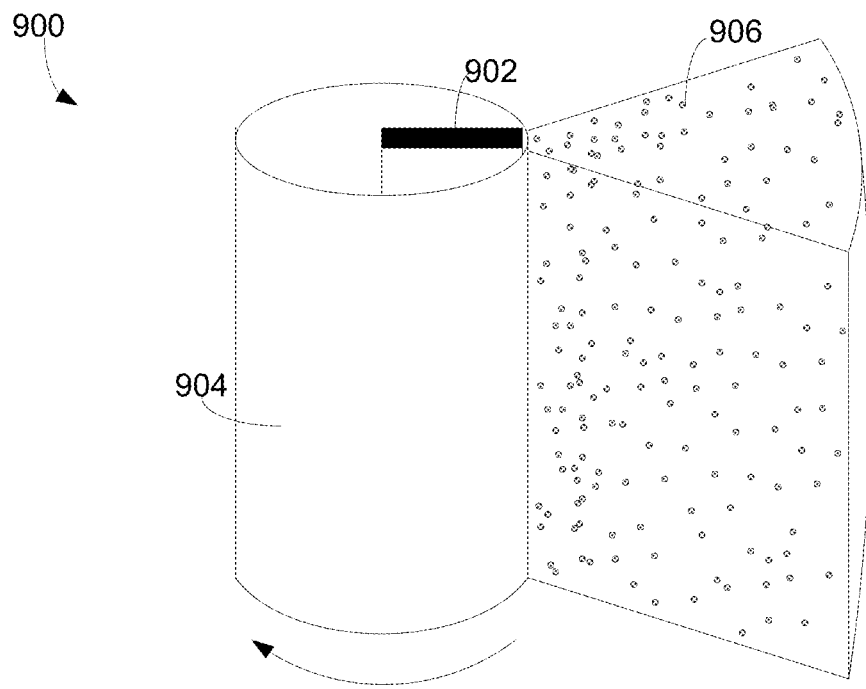
FIG. 6A illustrates a rotating sputter target according to certain embodiments.

As noted, one or more rotating targets may be used in some cases. In various cases, a rotating target may include an interior magnet. FIG. 6A presents a view of a rotating target 900. Inside the rotating target 900 is a magnet 902, which (when the target is supplied with appropriate power) causes material to sputter off of the target surface 904 in a sputter cone 906 (sputter cones are also sometimes referred to as sputter plasmas). The magnet 902 may extend along the length of the sputter target 900. In various embodiments, the magnet 902 may be oriented to extend radially outward such that the resulting sputter cone 906 emanates from the sputter target 900 in a direction normal to the target's surface 904 (the direction being measured along a central axis of the sputter cone 906, which typically corresponds to the average direction of the sputter cone 906). The sputter cone 906 may be v-shaped when viewed from above, and may extend along the height of the target 900 (or the height of the magnet 902 if not the same as the height of the target 900). The magnet 902 inside the rotating target 900 may be fixed (i.e., though the surface 904 of the target 900 rotates, the magnet 902 within the target 900 does not rotate) such that the sputter cone 906 is also fixed. The small circles/dots depicted in the sputter cone 906 represent sputtered material that emanates from the sputter target 900. Rotating targets may be combined with other rotating targets and/or planar targets as desired.

Figure 6B:
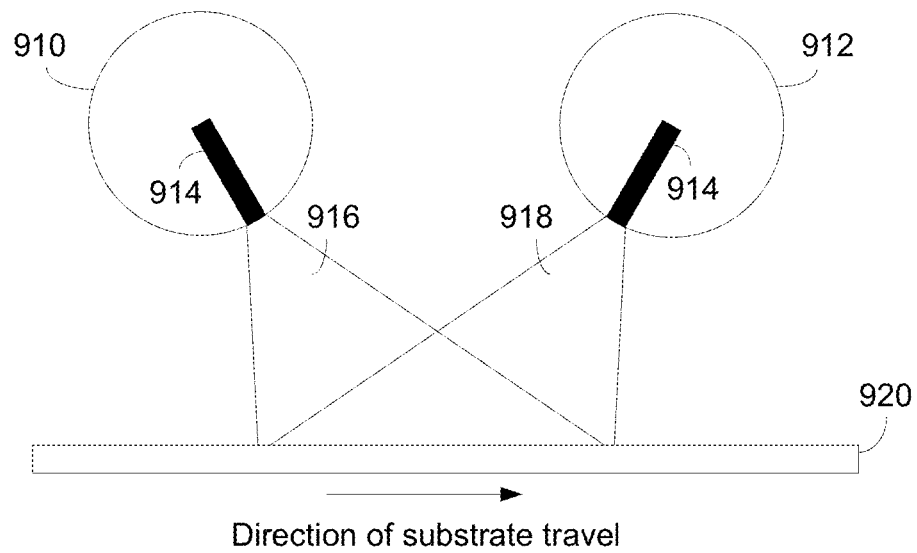
FIG. 6B shows a top-down view of two rotating sputter targets depositing material on a substrate according to certain embodiments.

In one example, two rotating targets are used to deposit a NiWTaO anodically coloring CE layer (or a sublayer within the anodically coloring CE layer): a first target including nickel and tungsten, and a second target including tantalum (either or both optionally in oxide form). FIG. 6B presents a top down view of a deposition system for depositing an anodically coloring layer or sublayer in this manner. The nickel tungsten target 910 and the tantalum target 912 each include an interior magnet 914. The magnets 914 are angled toward one another such that the sputter cones 916 and 918 from the nickel tungsten target 910 and tantalum target 912, respectively, overlap. FIG. 6B also shows a substrate 920 passing in front of the targets 910 and 912. As shown, the sputter cones 916 and 918 closely overlap where they impact the substrate 920. In some embodiments, the sputter cones from various sputter targets may closely overlap with one another (e.g., the non-overlapping area over which only a single sputter cone reaches when depositing on a substrate is less than about 10%, for example less than about 5% of the total area over which either sputter cone reaches). In other embodiments, the sputter cones may diverge from one another to a greater degree such that either or both of the sputter cones has a non-overlapping area that is at least about 10%, for example at least about 20%, or at least about 30%, or at least about 50%, of the total area over which either sputter cone reaches.

In a similar embodiment to the one shown in FIG. 6B, also presented in the context of forming a NiWTaO CE layer (or sublayer), one sputter target is tungsten and the other is an alloy of nickel and tantalum (either or both targets optionally being in oxide form). Similarly, one sputter target may be nickel and the other may be an alloy of tungsten and tantalum (either or both target optionally being in oxide form). In a related embodiment, three sputter targets are used: a tantalum target, a nickel target, and a tungsten target (any of which can optionally be in oxide form). The sputter cones from each of the three targets may overlap by angling the magnets as appropriate. Also, shielding, gratings and/or other additional plasma shaping elements may be used to aid in creating the appropriate plasma mixture to form the NiWTaO. Similarly, in the context of other anodically coloring counter electrode materials, any combination of targets including elemental metals, alloys, and/or oxides can be used, assuming that the targets include the materials (other than oxygen) to be incorporated into the relevant layer or sublayer being formed.

Various sputter target designs, orientations, and implementations are further discussed in U.S. Pat. No. 9,261,751, which is incorporated by reference above.

The density and orientation/shape of material that sputters off of a sputter target depends on various factors including, for example, the magnetic field shape and strength, pressure, and power density used to generate the sputter plasma. The distance between adjacent targets, as well as the distance between each target and substrate, can also affect how the sputter plasmas will mix and how the resulting material is deposited on the substrate.

In certain embodiments, two different types of sputter targets are provided to deposit a single layer or sublayer in an electrochromic stack: (a) primary sputter targets, which sputter material onto a substrate, and (b) secondary sputter targets, which sputter material onto the primary sputter targets. The primary and secondary sputter targets may include any combination of metal, metal alloys, and metal oxides that achieve a desired composition in a deposited layer. In one particular example in the context of a NiWTaO counter electrode material, a primary sputter target includes an alloy of nickel and tungsten, and a secondary sputter target includes tantalum. In another example a primary sputter target includes tantalum and a secondary sputter target includes an alloy of nickel and tungsten. These sputter targets may be used together to deposit an anodically coloring layer (or sublayer) of NiWTaO. Other combinations of alloys (e.g., nickel-tantalum, tungsten-tantalum, and alloys of other metals) and metals (e.g., nickel, tungsten, and other metals) can also be used as appropriate to form NiWTaO or other desired materials. Any sputter target may be provided as an oxide.

Figure 7A:
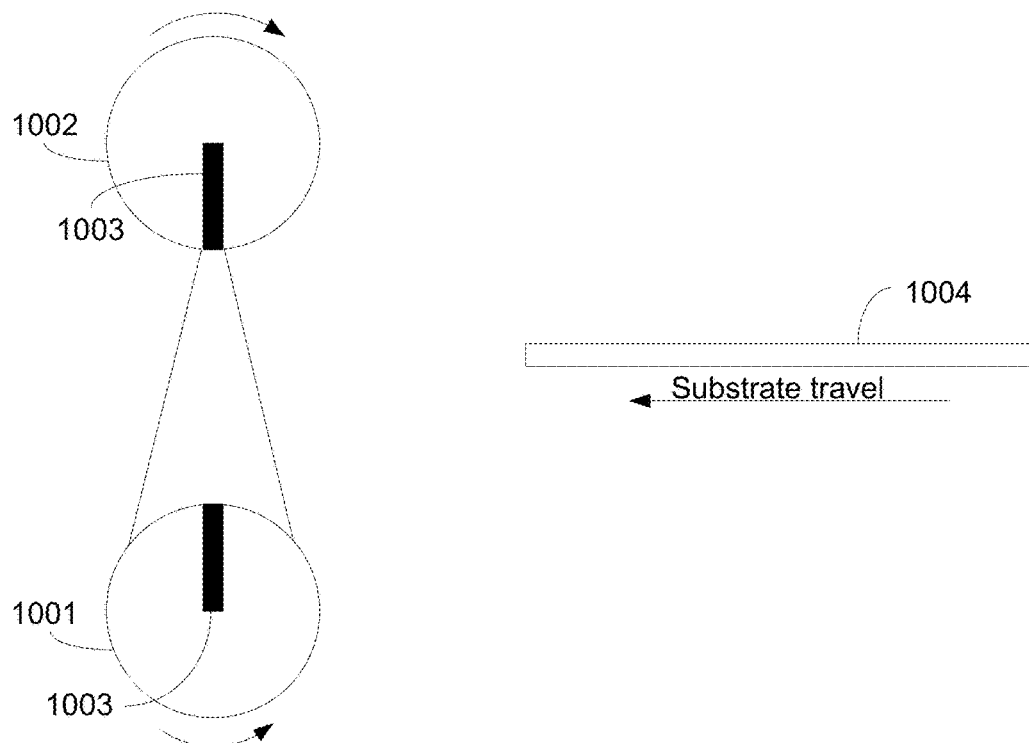
FIGS. 7A-7C relate to embodiments where a secondary sputter target is used to deposit material onto a primary sputter target, which then deposits on a substrate according to certain embodiments.
Figure 7B:
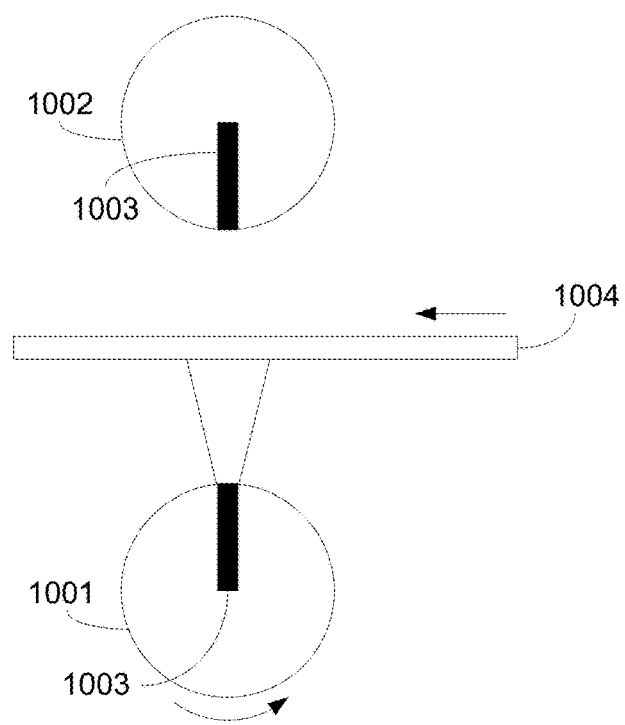

A number of different setups are possible when using both primary and secondary sputter targets. FIGS. 7A and 7B present top-down views of one embodiment of a deposition station for depositing a multi-component anodically coloring counter electrode material. Though presented in the specific context of depositing a counter electrode material, the sputter target configurations discussed herein may be used to deposit any material in the electrochromic stack, provided that the targets are of appropriate compositions to deposit the desired material in the stack. A primary sputter target 1001 and a secondary sputter target 1002 are provided, each with an internal magnet 1003. Each sputter target in this example is a rotating sputter target, though planar or other shaped targets may be used as well. The targets may rotate in the same direction or in opposite directions. The secondary sputter target 1002 sputters material onto the primary sputter target 1001 when no substrate 1004 is present between the two targets, as shown in FIG. 7A. This deposits material from the secondary sputter target 1002 onto the primary sputter target 1001. Then, as the substrate 1004 moves into position between the two targets, sputtering from the secondary sputter target 1002 ceases and sputtering from the primary sputter target 1001 onto the substrate 1004 begins, as shown in FIG. 7B.

When material is sputtered off of the primary sputter target 1001 and deposited onto the substrate 1004, the deposited material includes material that originated from both the primary and secondary sputter targets 1001 and 1002, respectively. In effect, this method involves in-situ formation of an intermixed sputter target surface on the primary sputter target 1001. One advantage of this method is that a fresh coating of material from the secondary sputter target 1002 is periodically deposited on the surface of the primary sputter target 1001. The intermixed materials are then delivered together to the substrate 1004. In a particular example in the context of forming a NiWTaO counter electrode material, each of the primary and secondary sputter targets may include any combination of tantalum, tungsten, nickel, and/or alloys thereof, optionally in oxide form.

Figure 7C:
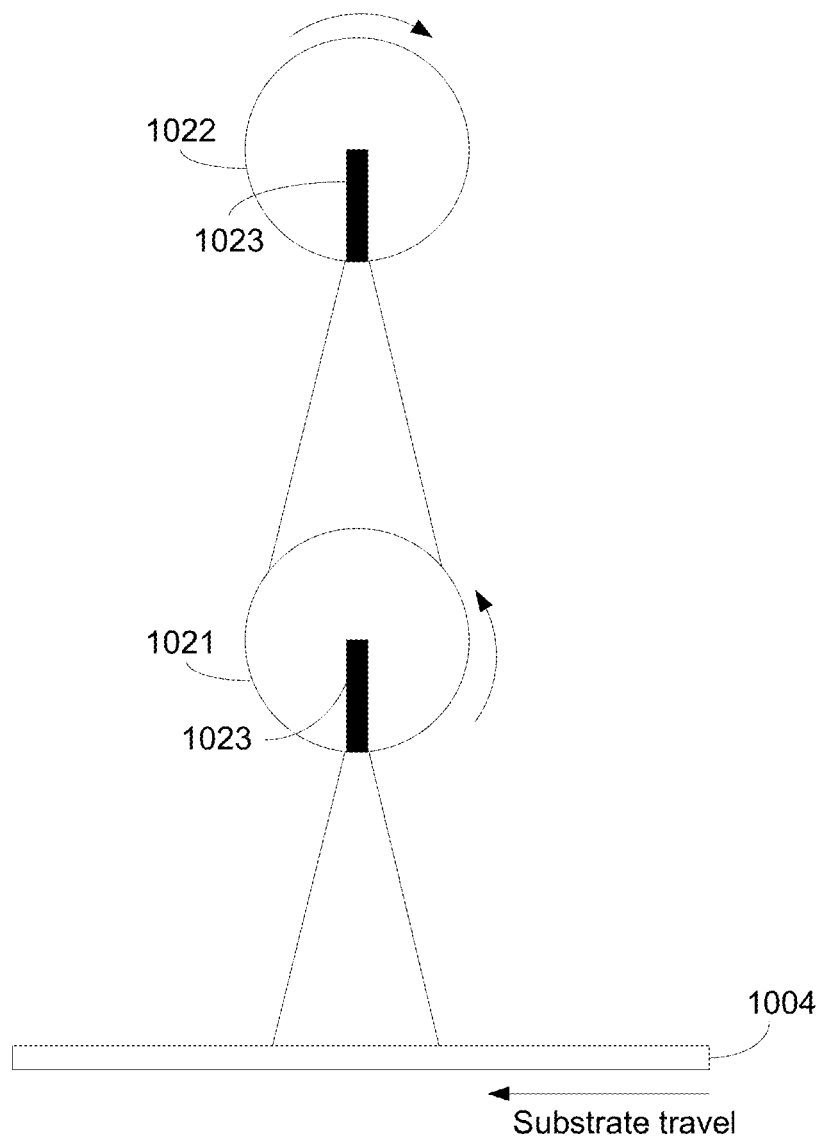

In a related embodiment shown in FIG. 7C, a secondary sputter target 1022 is positioned behind a primary sputter target 1021, and a substrate 1024 passes in front of the primary sputter target 1021 such that it does not block the line of sight between the two targets 1021 and 1022. Each of the sputter targets may include a magnet 1023. In this embodiment, there is no need to periodically stop sputtering from the secondary sputter target 1021 onto the primary sputter target 1022. Instead, such sputtering can occur continuously. Where the primary sputter target 1021 is located in between the substrate 1024 and the secondary sputter target 1022 (e.g., there is no line of sight between the secondary sputter target 1022 and the substrate 1024), the primary sputter target 1021 should rotate such that material that is deposited onto the primary sputter target 1021 can be sputtered onto the substrate 1024. There is more flexibility in the design of the secondary sputter target 1022. In a related embodiment, the secondary sputter target may be a planar or other non-rotating target. Where two rotating targets are used, the targets may rotate in the same direction or in opposite directions.

In similar embodiments, the secondary sputter target (e.g., the secondary target in FIGS. 7A-7C) may be replaced with another secondary material source. The secondary material source may provide material to the primary sputter target through means other than sputtering. In one example, the secondary material source provides evaporated material to the primary sputter target. The evaporated material may be any component of a layer being deposited. In various examples the evaporated material is an elemental metal or metal oxide. Particular examples of evaporated material include tantalum, tungsten, and nickel, which may be used to form a NiWTaO anodically coloring counter electrode material. In one embodiment, elemental tantalum is evaporated onto a primary sputter target including a mixture and/or alloy of nickel and tungsten. Other materials may also be provided in this manner to form layers or sublayers of other compositions. Where a secondary material source provides evaporated material, the secondary material source may be provided at any location relative to the primary sputter target and substrate. In some embodiments the secondary material source is provided such that it is behind and deposits primarily on the primary sputter target, much like the setup shown in FIG. 7C.

Where both a primary and a secondary sputter target are used, the secondary sputter target may be operated at a potential that is cathodic compared to the potential of the primary sputter target (which is already cathodic). Alternatively, the targets may be operated independently. Still further, regardless of relative target potentials, neutral species ejected from the secondary target will deposit on the primary target. Neutral atoms will be part of the flux, and they will deposit on a cathodic primary target regardless of relative potentials.

Figure 8:
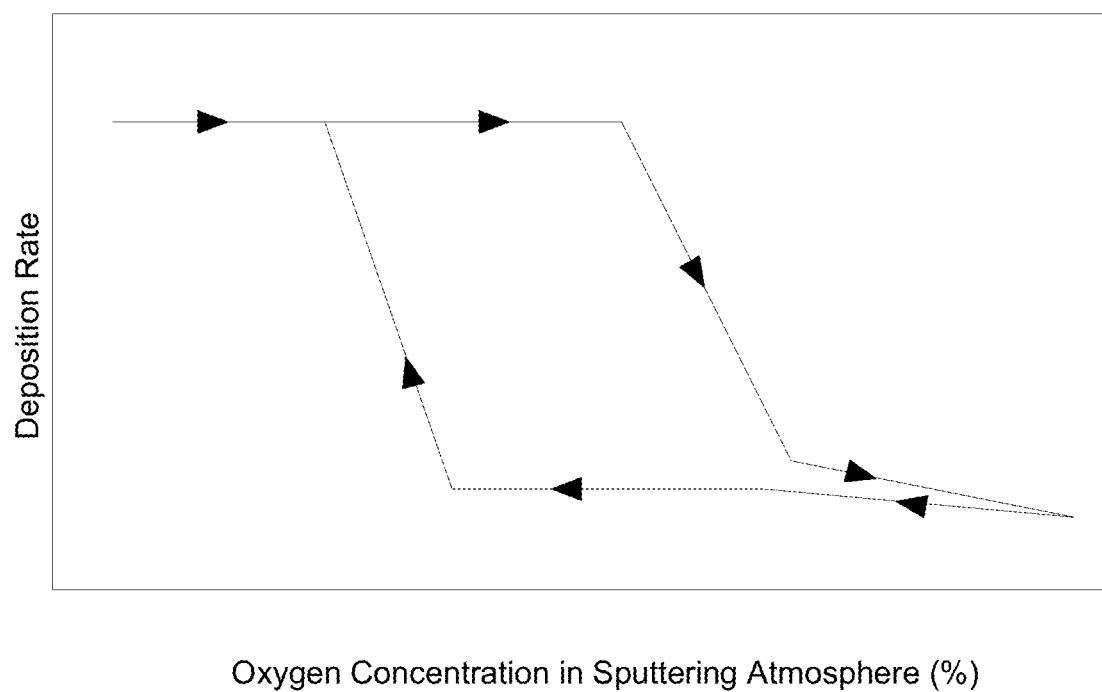
FIG. 8 illustrates a hysteresis curve for depositing various optically switchable materials.

In various embodiments, reactive sputtering may be used to deposit one or more materials in the electrochromic stack. FIG. 8 is a diagram showing the sputtering deposition rate from a sputter target as a function of oxygen concentration at a fixed power. As shown in FIG. 8, there is a strong hysteresis effect related to the oxygen concentration profile the target has been exposed to/operated under. For instance, when starting from a low oxygen concentration and increasing to a higher oxygen concentration, the deposition rate stays fairly high until the oxygen concentration reaches a point at which the sputter target forms an oxide that cannot be removed from the target sufficiently quickly. At this point the deposition rate drops down, and the sputter target essentially forms a metal oxide target. The deposition rate for an oxide target is generally much lower than the deposition rate for a metal target, all other conditions being equal. The relatively high deposition rate region in FIG. 8 corresponds to a metal deposition regime, while the relatively low deposition rate region corresponds to a metal oxide deposition regime. When the target is initially exposed to/operated under a high oxygen concentration then exposed to/operated under a relatively lower concentration, the deposition rate stays fairly low until the oxygen concentration reaches a point at which the deposition rate jumps up to a higher level. As shown in FIG. 8, the oxygen concentration at which these changes take place is different depending on whether the oxygen concentration is increasing or decreasing. The exact oxygen concentrations at which the regime changes occur can be controlled by changing the target power density and magnetic strength of the internal magnet 1003. For example, if one target is sputtering a substantially higher flux of metal atoms from the surface (due to higher power and/or magnetic strength), that target would likely stay in the metal deposition regime, compared to a target which is sputtering a very low flux of metal atoms. Such hysteresis effects can be used to advantage in a deposition process.

In certain embodiments where two or more sputter targets are used to deposit a material in the electrochromic stack, one target may be operated in the metal deposition regime and another target may be operated in the metal oxide deposition regime. By controlling the target power density, magnetic strength of the internal magnet 1003, and the atmosphere to which each target is exposed/operated under over time, it is possible to operate at both of these regimes simultaneously. In one example, a first nickel tungsten target is exposed to a relatively low concentration of oxygen and then brought to a mid-level concentration of oxygen such that it operates in the metal deposition regime. A second tantalum target is exposed to a relatively high concentration of oxygen and then brought to a mid-level concentration of oxygen such that it operates in the metal oxide deposition regime. The two targets can then be brought together, still exposed to the mid-level oxygen concentration, where they are used to deposit material onto a substrate under both regimes (the first target continuing to operate under the metal deposition regime and the second target continuing to operate under the metal oxide deposition regime).

The different atmosphere exposures for each target may not be needed in many cases. Other factors besides different historical oxygen exposure can result in the targets operating under the different deposition regimes. For instance, the targets may have different hysteresis curves due to the different material in the targets. As such, the targets may be able to operate under different regimes even if they are historically exposed to and operated under the same atmospheric oxygen conditions. Further, the amount of power applied to each target can significantly affect the deposition regime experienced by each target. In one example, therefore, one target is operated under a metal deposition regime and another target is operated under a metal oxide deposition regime due to the different powers applied to each target. This approach may be easier because it does not require separating the targets from one another such that they can be exposed to different oxygen concentrations. One advantage to operating the targets at different points in the hysteresis curves is that the composition of a deposited material can be closely controlled.

It should be understood that while the order of deposition operations is depicted in FIG. 5 to be first EC layer, second IC layer, and finally CE layer, the order can be reversed in various embodiments. In other words, when as described herein "sequential" deposition of the stack layers is recited, it is intended to cover the following "reverse" sequence, first CE layer, second IC layer, and third EC layer, as well the "forward" sequence described above. Both the forward and reverse sequences can function as reliable high-quality electrochromic devices. Further, it should be understood that conditions recited for depositing the various EC, IC, and CE materials recited here, are not limited to depositing such materials. Other materials may, in some cases, be deposited under the same or similar conditions. Moreover, the IC layer may be omitted in certain cases. Further, non-sputtering deposition conditions may be employed in some embodiments to create the same or similar deposited materials as those described herein.

Since the amount of charge each of the EC and the CE layers can safely hold varies, depending on the material used, the relative thickness of each of the layers may be controlled to match capacity as appropriate. In one embodiment, the electrochromic layer includes tungsten oxide and the counter electrode includes nickel tungsten tantalum oxide (provided in a counter electrode layer or sublayer), and the ratio of thicknesses of the electrochromic layer to the counter electrode layer is between about 1.7:1 and 2.3:1, or between about 1.9:1 and 2.1:1 (with about 2:1 being a specific example).

As mentioned, the EC stack is fabricated in an integrated deposition system where the substrate does not leave the integrated deposition system at any time during fabrication of the stack. In one embodiment, the second TCO layer is also formed using the integrated deposition system where the substrate does not leave the integrated deposition system during deposition of the EC stack and the TCO layer. In one embodiment, all of the layers are deposited in the integrated deposition system where the substrate does not leave the integrated deposition system during deposition; that is, in one embodiment the substrate is a glass sheet and a stack including the EC layer, the optional IC layer and the CE layer, sandwiched between a first and a second TCO layer, is fabricated on the glass where the glass does not leave the integrated deposition system during deposition. In another implementation of this embodiment, the substrate is glass with a diffusion barrier deposited prior to entry in the integrated deposition system. In another implementation the substrate is glass and the diffusion barrier, a stack including the EC layer, the optional IC layer and the CE layer, sandwiched between a first and a second TCO layer, are all deposited on the glass where the glass does not leave the integrated deposition system during deposition.

As mentioned above, lithium may be provided with the EC, CE and/or IC layers as they are formed on the substrate. This may involve, for example, co-sputtering of lithium together with the other materials of a given layer (e.g., tungsten and oxygen, in some cases with additional or different elements as appropriate). In certain embodiments the lithium is delivered via a separate process and allowed to diffuse or otherwise incorporate into the EC, CE and/or IC layers. In some embodiments, only a single layer in the electrochromic stack is lithiated. For example, only the anodically coloring CE layer (or a sublayer therein) is lithiated in some examples. In other cases, only the cathodically coloring EC layer is lithiated. In still other cases, only the IC layer is lithiated. In other embodiments, two or more of the EC, IC, and CE layers (including sublayers) are lithiated. Particular conditions for lithiation are further discussed in U.S. patent application Ser. No. 12/645,111, which is incorporated by reference above.

In some embodiments, the electrochromic stack includes a counter electrode layer or sublayer in direct physical contact with an electrochromic layer, without an ion conducting layer in between. In some such cases, the electrochromic and/or counter electrode layer may include an oxygen-rich portion (e.g., an oxygen rich sublayer or an oxygen rich portion of a graded layer in various cases) in contact with the other of these layers. The oxygen-rich portion may include the electrochromic material or counter electrode material, with a higher concentration of oxygen than in the remaining portion of the electrochromic layer and/or counter electrode layer. Electrochromic devices fabricated according to such a design are further discussed and described in U.S. Pat. No. 8,300,298, filed Apr. 30, 2010, which is incorporated by reference above.

In one aspect of the disclosed embodiments, a method of fabricating an electrochromic device is provided, the method including: depositing an electrochromic layer comprising a cathodically coloring electrochromic material; and depositing a counter electrode layer by: depositing a first anodically tinting sublayer comprising $Ni_aW_bA_cO_d$, where a, b, and d are greater than zero, depositing a second anodically tinting sublayer comprising $Ni_eW_fB_gO_h$, where e, f, and h are greater than zero, where at least one of c and g are greater than zero, and where each of A and B, when present, is independently selected from the group consisting of: silver (Ag), aluminum (Al), arsenic (As), gold (Ag), boron (B), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), and zirconium (Zr), and lithiating one or more anodically tinting sublayers of the counter electrode layer, where the first anodically tinting sublayer is positioned between the electrochromic layer and the second anodically tinting sublayer, and where the first and second anodically tinting sublayers have different compositions. The electrochromic device may be fabricated to include any of the materials/combinations of materials/structures described herein.

As mentioned above, in certain embodiments, fabrication of the electrochromic stack occurs in an integrated deposition system. Such an integrated system may allow for deposition of the various layers in the stack without breaking vacuum. In other cases, one or more layers in the stack may be deposited by a process that requires removal from a protected vacuum environment. For example, in some cases one or more layers (e.g., a cathodically coloring EC layer) is deposited on a substrate under vacuum using physical vapor deposition, then the substrate is removed from vacuum and an ion conductor layer is deposited using a sol-gel (or other non-vacuum) process, and then the substrate is returned to a vacuum environment for deposition of the anodically coloring counter electrode layer. Sol-gel processes involve producing solid materials from small molecules. Monomers are converted into a colloidal solution that acts as the precursor for an integrated network of discrete particles or network polymers. Examples of ion conductor materials that may be deposited include, for example, silicate-based structures, lithium silicate, lithium aluminum silicate, lithium aluminum borate, lithium borate, lithium zirconium silicate, lithium niobate, lithium borosilicate, lithium phosphosilicate, lithium nitride, lithium aluminum fluoride, and other such lithium-based ceramic materials, silicas, or silicon oxides, silicon dioxide, and tantalum oxide.

Multistep Thermochemical Conditioning

Once the stack is deposited, the device may be subjected to a multistep thermo-chemical conditioning (MTC) process. This conditioning process may promote formation of an ion conducting region within the device in embodiments where the device is deposited without a separate ion conducting layer, as such. MTC processes are further described in U.S. patent application Ser. No. 12/645,111, incorporated by reference above.

In certain embodiments, a different process flow may be used to fabricate an electrochromic device. Alternative process flows are further discussed in U.S. patent application Ser. No. 14/362,863, filed Jun. 4, 2014, and titled "THIN-FILM DEVICES AND FABRICATION," which is herein incorporated by reference in its entirety.

Integrated Deposition System

As explained above, an integrated deposition system may be employed to fabricate electrochromic devices on, for example, architectural glass. As described above, the electrochromic devices are used to make IGUs which in turn are used to make electrochromic windows. The term "integrated deposition system" means an apparatus for fabricating electrochromic devices on optically transparent and translucent substrates. The apparatus has multiple stations, each devoted to a particular unit operation such as depositing a particular component (or portion of a component) of an electrochromic device, as well as cleaning, etching, and temperature control of such device or portion thereof. The multiple stations are fully integrated such that a substrate on which an electrochromic device is being fabricated can pass from one station to the next without being exposed to an external environment. Integrated deposition systems operate with a controlled ambient environment inside the system where the process stations are located. A fully integrated system allows for better control of interfacial quality between the layers deposited. Interfacial quality refers to, among other factors, the quality of the adhesion between layers and the lack of contaminants in the interfacial region. The term "controlled ambient environment" means a sealed environment separate from an external environment such as an open atmospheric environment or a clean room. In a controlled ambient environment at least one of pressure and gas composition is controlled independently of the conditions in the external environment. Generally, though not necessarily, a controlled ambient environment has a pressure below atmospheric pressure; e.g., at least a partial vacuum. The conditions in a controlled ambient environment may remain constant during a processing operation or may vary over time. For example, a layer of an electrochromic device may be deposited under vacuum in a controlled ambient environment and at the conclusion of the deposition operation, the environment may be backfilled with purge or reagent gas and the pressure increased to, e.g., atmospheric pressure for processing at another station, and then a vacuum reestablished for the next operation and so forth.

In one embodiment, the system includes a plurality of deposition stations aligned in series and interconnected and operable to pass a substrate from one station to the next without exposing the substrate to an external environment. The plurality of deposition stations comprise (i) a first deposition station containing one or more targets for depositing a cathodically coloring electrochromic layer; (ii) a second (optional) deposition station containing one or more targets for depositing an ion conducting layer; and (iii) a third deposition station containing one or more targets for depositing a counter electrode layer. The second deposition station may be omitted in certain cases. For instance, the apparatus may not include any target for depositing a separate ion conductor layer.

Further, any of the layers of the stack may be deposited in two or more stations. For example, where a counter electrode is deposited to include two or more sublayers, each of the sublayers may be deposited in a different station. Alternatively or in addition, two or more sublayers within a layer may be deposited within the same station, in some cases using different targets in the same station. In one example, the counter electrode is deposited in a single station and includes sublayers of varying composition (e.g., a NiWO sublayer and one or more NiWTaO sublayers, though other combinations of materials may also be used). Targets of different compositions may be provided at different portions of the station to deposit the sublayers as desired. In another example, the counter electrode may be deposited in two stations, a first station that deposits a first sublayer (e.g., a thin flash layer) of a first counter electrode material (e.g., NiWO, or another anodically coloring counter electrode material) and a second station that deposits one or more additional sublayers of a second (or additional) counter electrode material(s) (e.g., one or more sublayers of NiWTaO or another anodically coloring counter electrode material). In another embodiment, a dedicated station is provided to deposit each layer or sublayer having a distinct composition. For instance, a first station may be provided to deposit a first sublayer having a first composition (e.g., NiWO), a second station may be provided to deposit a second sublayer having a second composition (e.g., NiWTaO including about 7% tantalum), and a third station may be provided to deposit a third sublayer having a third composition (e.g., NiWTaO including about 14% tantalum).

The system also includes a controller containing program instructions for passing the substrate through the plurality of stations in a manner that sequentially deposits on the substrate (i) an electrochromic layer, (ii) an (optional) ion conducting layer, and (iii) a counter electrode layer (as described herein) to form a stack. In one embodiment, the plurality of deposition stations are operable to pass a substrate from one station to the next without breaking vacuum. In another embodiment, the plurality of deposition stations are configured to deposit the electrochromic layer, the optional ion conducting layer, and the counter electrode layer on an architectural glass substrate. In another embodiment, the integrated deposition system includes a substrate holder and transport mechanism operable to hold the architectural glass substrate in a vertical orientation while in the plurality of deposition stations. In yet another embodiment, the integrated deposition system includes one or more load locks for passing the substrate between an external environment and the integrated deposition system. In another embodiment, the plurality of deposition stations include at least two stations for depositing a layer selected from the group consisting of the cathodically coloring electrochromic layer, the ion conducting layer, and the anodically coloring counter electrode layer.

In some embodiments, the integrated deposition system includes one or more lithium deposition stations, each including a lithium containing target. In one embodiment, the integrated deposition system contains two or more lithium deposition stations. In one embodiment, the integrated deposition system has one or more isolation valves for isolating individual process stations from each other during operation. In one embodiment, the one or more lithium deposition stations have isolation valves. In this document, the term "isolation valves" means devices to isolate depositions or other processes being carried out one station from processes at other stations in the integrated deposition system. In one example, isolation valves are physical (solid) isolation valves within the integrated deposition system that engage while the lithium is deposited. Actual physical solid valves may engage to totally or partially isolate (or shield) the lithium deposition from other processes or stations in the integrated deposition system. In another embodiment, the isolation valves may be gas knifes or shields, e.g., a partial pressure of argon or other inert gas is passed over areas between the lithium deposition station and other stations to block ion flow to the other stations. In another example, isolation valves may be an evacuated regions between the lithium deposition station and other process stations, so that lithium ions or ions from other stations entering the evacuated region are removed to, e.g., a waste stream rather than contaminating adjoining processes. This is achieved, e.g., via a flow dynamic in the controlled ambient environment via differential pressures in a lithiation station of the integrated deposition system such that the lithium deposition is sufficiently isolated from other processes in the integrated deposition system. Again, isolation valves are not limited to lithium deposition stations.

Figure 9A:
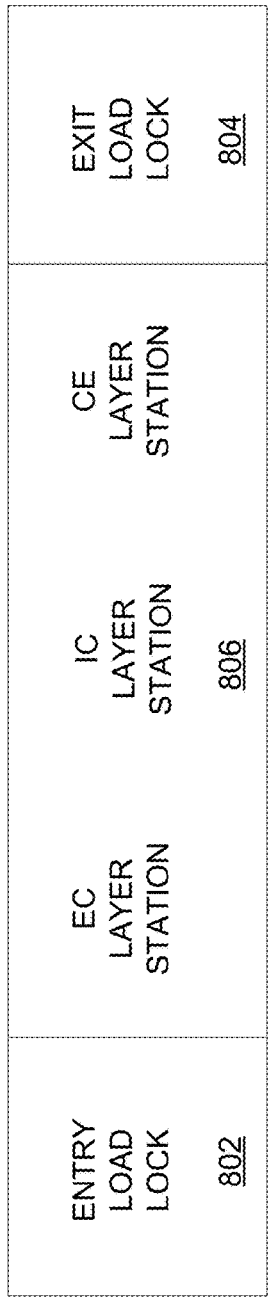

FIG. 9A, depicts in schematic fashion an integrated deposition system 800 in accordance with certain embodiments. In this example, system 800 includes an entry load lock, 802, for introducing the substrate to the system, and an exit load lock, 804, for removal of the substrate from the system. The load locks allow substrates to be introduced and removed from the system without disturbing the controlled ambient environment of the system. Integrated deposition system 800 has a module, 806, with a plurality of deposition stations; an EC layer deposition station, an IC layer deposition station and a CE layer deposition station. In the broadest sense, integrated deposition systems need not have load locks, e.g., module 806 could alone serve as the integrated deposition system. For example, the substrate may be loaded into module 806, the controlled ambient environment established and then the substrate processed through various stations within the system. Individual stations within an integrated deposition systems can contain heaters, coolers, various sputter targets and means to move them, RF and/or DC power sources and power delivery mechanisms, etching tools e.g., plasma etch, gas sources, vacuum sources, glow discharge sources, process parameter monitors and sensors, robotics, power supplies, and the like.

Figure 9B:
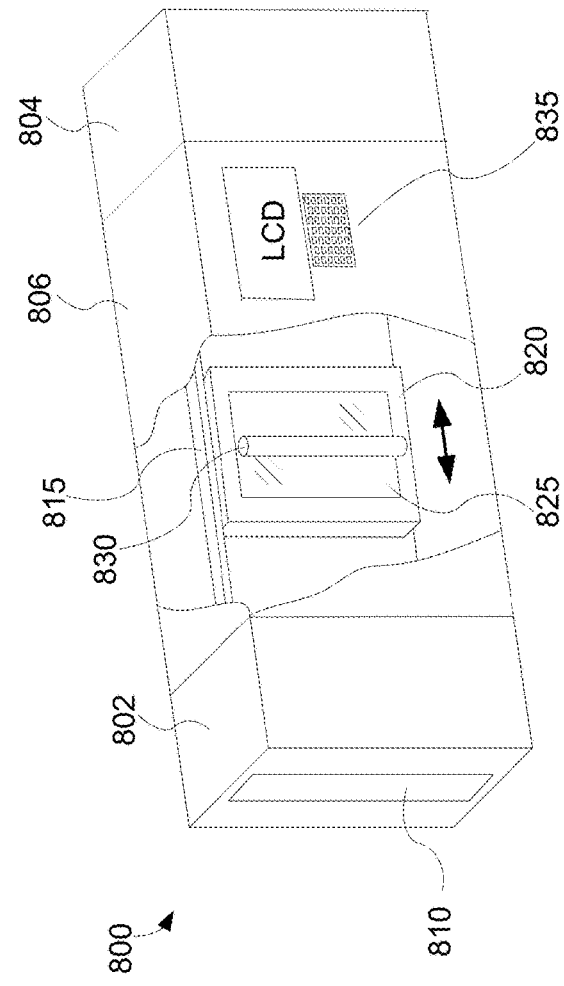

FIG. 9B depicts a segment (or simplified version) of integrated deposition system 800 in a perspective view and with more detail including a cutaway view of the interior. In this example, system 800 is modular, where entry load lock 802 and exit load lock 804 are connected to deposition module 806. There is an entry port, 810, for loading, for example, architectural glass substrate 825 (load lock 804 has a corresponding exit port). Substrate 825 is supported by a pallet, 820, which travels along a track, 815. In this example, pallet 820 is supported by track 815 via hanging but pallet 820 could also be supported atop a track located near the bottom of apparatus 800 or a track, e.g., mid-way between top and bottom of apparatus 800. Pallet 820 can translate (as indicated by the double headed arrow) forward and/or backward through system 800. For example during lithium deposition, the substrate may be moved forward and backward in front of a lithium target, 830, making multiple passes in order to achieve a desired lithiation. Pallet 820 and substrate 825 are in a substantially vertical orientation. A substantially vertical orientation is not limiting, but it may help to prevent defects because particulate matter that may be generated, e.g., from agglomeration of atoms from sputtering, will tend to succumb to gravity and therefore not deposit on substrate 825. Also, because architectural glass substrates tend to be large, a vertical orientation of the substrate as it traverses the stations of the integrated deposition system enables coating of thinner glass substrates since there are less concerns over sag that occurs with thicker hot glass.

Target 830, in this case a cylindrical target, is oriented substantially parallel to and in front of the substrate surface where deposition is to take place (for convenience, other sputter means are not depicted here). Substrate 825 can translate past target 830 during deposition and/or target 830 can move in front of substrate 825. The movement path of target 830 is not limited to translation along the path of substrate 825. Target 830 may rotate along an axis through its length, translate along the path of the substrate (forward and/or backward), translate along a path perpendicular to the path of the substrate, move in a circular path in a plane parallel to substrate 825, etc. Target 830 need not be cylindrical, it can be planar or any shape necessary for deposition of the desired layer with the desired properties. Also, there may be more than one target in each deposition station and/or targets may move from station to station depending on the desired process.

Integrated deposition system 800 also has various vacuum pumps, gas inlets, pressure sensors and the like that establish and maintain a controlled ambient environment within the system. These components are not shown, but rather would be appreciated by one of ordinary skill in the art. System 800 is controlled, e.g., via a computer system or other controller, represented in FIG. 9B by an LCD and keyboard, 835. One of ordinary skill in the art would appreciate that embodiments herein may employ various processes involving data stored in or transferred through one or more computer systems. Embodiments also relate to the apparatus, such computers and microcontrollers, for performing these operations. These apparatus and processes may be employed to deposit electrochromic materials of methods herein and apparatus designed to implement them. The control apparatus may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform and/or control the required method and processes.

As mentioned, the various stations of an integrated deposition system may be modular, but once connected, form a continuous system where a controlled ambient environment is established and maintained in order to process substrates at the various stations within the system. FIG. 9C depicts integrated deposition system 800a, which is like system 800, but in this example each of the stations is modular, specifically, an EC layer station 806a, an optional IC layer station 806b and a CE layer station 806c. In a similar embodiment, the IC layer station 806b is omitted. Modular form is not necessary, but it is convenient, because depending on the need, an integrated deposition system can be assembled according to custom needs and emerging process advancements. For example, lithium deposition stations (not shown) can be inserted at relevant locations to provide lithium as desired for the various layers and sublayers.

FIG. 9D shows an embodiment of an integrated deposition system 800d. In this embodiment, the integrated deposition system 800d includes an entry load lock 802, two stations 850 and 851 for depositing sublayers of cathodically coloring electrochromic material, two stations 852 and 853 for depositing sublayers of anodically coloring counter electrode material, and an exit load lock 804. The first sublayer of cathodically coloring electrochromic material is deposited in station 850. The second sublayer of cathodically coloring electrochromic material is deposited in station 851, and may be an oxygen-rich form of the electrochromic material deposited in station 850 in certain cases. In this embodiment, there is no separate station for depositing an ion conductor layer. After the second sublayer of electrochromic material is deposited, a first sublayer of anodically coloring counter electrode material may be deposited in station 852. The first sublayer may be a flash layer, for example of NiWO or another anodically coloring material as described herein. Next, a second sublayer of anodically coloring counter electrode material may be deposited in station 853. This layer may have any composition as described herein, and in one embodiment is NiWTaO. In various cases the second CE layer station 853 (or any other station configured to deposit a CE material) is configured to deposit a sublayer having a graded composition.

FIG. 9E shows an additional embodiment of an integrated deposition system 800e. This embodiment is similar to that shown in FIG. 9D, and for the sake of brevity only the differences will be described. In the deposition system of FIG. 9E, a lithiation station 854 is included after the second counter electrode station 853. In similar embodiments, additional lithiation stations may be provided. Further, the lithiation stations may be positioned between various pairs of stations shown in FIG. 9E, e.g., between stations 850 and 851, between stations 851 and 852, between stations 852 and 853, between stations 853, and/or between stations 855 and 856.

Further, a capping layer station 855 is included after the lithiation station 854. The capping layer station 855 may be used to deposit a capping layer. A capping layer is defined as a layer added to the electrochromic device between the EC or CE layers and the TCO. In some embodiments, the capping layer is an anodically coloring material. For example, in some cases the capping layer includes the same elements as an anodically coloring material in one or more of the sublayers of the counter electrode layer (e.g., the capping layer may include the same elements that are present in the first sublayer, the second sublayer, etc.). In one example the capping layer is made of NiWO, where the composition of NiWO in the capping layer may be the same or different from the composition of NiWO used elsewhere in the device, for example in a first sublayer of a counter electrode layer. In another example, the capping layer may be made of NiWTaO, NiWSnO, NiWNbO, or another anodically coloring counter electrode material, where the composition of the capping layer may be the same or different from the composition of this material used in other portions of the device, for example in a second sublayer of a counter electrode layer. Although the capping layer may be made of an anodically coloring material, in various embodiments this capping layer does not exhibit electrochromic behavior in a finished device. In certain embodiments, the capping layer may have an electronic resistivity of between about 1 and $5 \times 10^{10}$ Ohm-cm. The integrated deposition system 800e also includes a station 856 for depositing a layer of transparent conductive oxide (TCO). In some embodiments this layer may be indium-tin oxide (ITO).

Integrated depositions systems such as the ones shown in FIGS. 9A-9E may also have a TCO layer station, (not shown in 9A-9D) for depositing the TCO layer on the EC stack. Depending on the process demands, additional stations can be added to the integrated deposition system, e.g., stations for heating/annealing processes, cleaning processes, laser scribes, rotation processes, capping layers, defect mitigating insulating layers (DMILs), MTC, etc.

Although the foregoing embodiments have been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. An electrochromic device comprising:
    a substrate;
    an electrochromic layer disposed on or over the substrate, said electrochromic layer comprising a cathodically tinting electrochromic material; and
    an anodically tinting counter electrode layer also disposed on or over the substrate, said counter electrode layer comprising (a) a first sublayer comprising a first nickel tungsten oxide composition, and (b) a second sublayer comprising a second nickel tungsten oxide composition, wherein the first and second nickel tungsten oxide compositions have different relative amounts of nickel and/or tungsten, and wherein the first sublayer is disposed between the electrochromic layer and the second sublayer.

2. The electrochromic device of claim 1, wherein the second nickel tungsten oxide composition further comprises tantalum, niobium, tin, or a combination thereof.

3. The electrochromic device of claim 2, wherein the second nickel tungsten oxide composition comprises tantalum.

4. The electrochromic device of claim 2, wherein the second nickel tungsten oxide composition comprises niobium.

5. The electrochromic device of claim 2, wherein the second nickel tungsten oxide composition comprises tin.

6. The electrochromic device of claim 3, wherein the first nickel tungsten oxide composition further comprises tantalum, and wherein the second nickel tungsten oxide composition comprises a greater concentration of tantalum than does the first nickel tungsten oxide composition.

7. The electrochromic device of claim 4, wherein the first nickel tungsten oxide composition further comprises niobium, and wherein the second nickel tungsten oxide composition comprises a greater concentration of niobium than does the first nickel tungsten oxide composition.

8. The electrochromic device of claim 5, wherein the first nickel tungsten oxide composition further comprises tin, and wherein the second nickel tungsten oxide composition comprises a greater concentration of tin than does the first nickel tungsten oxide composition.

9. The electrochromic device of claim 2, wherein the counter electrode layer further comprises a third sublayer comprising a third nickel tungsten oxide composition wherein the first, second, and third nickel tungsten oxide compositions have different relative amounts of nickel and/or tungsten, and wherein the second sublayer is disposed between the first sublayer and the third sublayer.

10. The electrochromic device of claim 9, wherein the third nickel tungsten oxide composition further comprises tantalum, niobium, tin, or a combination thereof.

11. The electrochromic device of claim 10, wherein the third nickel tungsten oxide composition comprises tantalum.

12. The electrochromic device of claim 10, wherein the third nickel tungsten oxide composition comprises niobium.

13. The electrochromic device of claim 10, wherein the third nickel tungsten oxide composition comprises tin.

14. The electrochromic device of claim 11, wherein the second and third nickel tungsten oxide compositions each comprise tantalum, and wherein the third nickel tungsten oxide composition comprises a greater concentration of tantalum than does the second nickel tungsten oxide composition.

15. The electrochromic device of claim 12, wherein the second and third nickel tungsten oxide compositions each comprise niobium, and wherein the third nickel tungsten oxide composition comprises a greater concentration of niobium than does the second nickel tungsten oxide composition.

16. The electrochromic device of claim 13, wherein the second and third nickel tungsten oxide compositions each comprise tin, and wherein the third nickel tungsten oxide composition comprises a greater concentration of tin than does the second nickel tungsten oxide composition.

17. The electrochromic device of claim 1, wherein the counter electrode layer further comprises a third sublayer comprising a third nickel tungsten oxide composition, wherein the second nickel tungsten oxide composition further comprises metal M1, wherein the third nickel tungsten oxide composition further comprises metal M2, and wherein metals M1 and M2 are different from one another.

18. The electrochromic device of claim 17, wherein the second nickel tungsten oxide composition is substantially free of metal M2, and wherein the third nickel tungsten oxide composition is substantially free of metal M1.

19. The electrochromic device of claim 1, wherein the first sublayer of the counter electrode layer is a flash layer having a thickness of between about 10 nm and about 80 nm.

20. The electrochromic device of claim 19, wherein the thickness of the flash layer is between about 10 nm and about 50 nm.

21. The electrochromic device of claim 20, wherein the thickness of the flash layer is between about 10 nm and about 30 nm.

22. The electrochromic device of claim 19, wherein the first sublayer has an electronic resistivity between about 1 and $5 \times 10^{10}$ Ohm-cm.

23. The electrochromic device of claim 1, wherein the first sublayer comprises an electronic resistivity between about 1 and $5 \times 10^{10}$ Ohm-cm.

24. The electrochromic device of claim 1, wherein each of the first and second sublayers of the counter electrode layer has a thickness between about 20 nm and about 200 nm.

25. The electrochromic device of claim 24, wherein the thickness of the first sublayer differs from the thickness of the second sublayer by between about 50 nm and about 200 nm.

26. The electrochromic device of claim 14, wherein the second nickel tungsten oxide composition comprises between about 2-10% atomic tantalum, and wherein the third nickel tungsten oxide composition comprises between about 5-20% atomic tantalum.

27. The electrochromic device of claim 26, wherein the first sublayer substantially consists of nickel tungsten oxide, the second sublayer substantially consists of nickel tungsten tantalum oxide that is between about 2-10% atomic tantalum, and the third sublayer substantially consists of nickel tungsten tantalum oxide that is between about 5-20% atomic tantalum.

28. The electrochromic device of claim 27, wherein the nickel tungsten tantalum oxide in the second sublayer is about 4% atomic tantalum, and the nickel tungsten tantalum oxide in the third sublayer is about 8% atomic tantalum.

29. The electrochromic device of claim 15, wherein the second nickel tungsten oxide composition comprises between about 2-10% atomic niobium, and wherein the third nickel tungsten oxide composition comprises between about 5-20% atomic niobium.

30. The electrochromic device of claim 29, wherein the first sublayer substantially consists of nickel tungsten oxide, the second sublayer substantially consists of nickel tungsten niobium oxide that is between about 2-10% atomic niobium, and the third sublayer substantially consists of nickel tungsten niobium oxide that is between about 5-20% atomic niobium.

31. The electrochromic device of claim 30, wherein the nickel tungsten niobium oxide in the second sublayer is about 4% atomic niobium, and the nickel tungsten niobium oxide in the third sublayer is about 8% atomic niobium.

32. The electrochromic device of claim 16, wherein the second nickel tungsten oxide composition comprises between about 2-10% atomic tin, and wherein the third nickel tungsten oxide composition comprises between about 5-20% atomic tin.

33. The electrochromic device of claim 32, wherein the first sublayer substantially consists of nickel tungsten oxide, the second sublayer substantially consists of nickel tungsten tin oxide that is between about 2-10% atomic tin, and the third sublayer substantially consists of nickel tungsten tin oxide that is between about 5-20% atomic tin.

34. The electrochromic device of claim 33, wherein the nickel tungsten tin oxide in the second sublayer is about 4% atomic tin, and the nickel tungsten tin oxide in the third sublayer is about 8% atomic tin.

35. The electrochromic device of claim 1, wherein the second nickel tungsten oxide composition further comprises a metal that is not present in the first nickel tungsten oxide composition.

36. The electrochromic device of claim 1, wherein at least one of the first and second sublayers of the counter electrode layer comprises a graded composition.

37. The electrochromic device of claim 1, wherein the first and second sublayers of the counter electrode layer each have a morphology that is a mixture of amorphous and nanocrystalline phases with nanocrystallites having a diameter of less than about 50 nm.

* * * * *